US012074151B2

United States Patent
Xu et al.

(10) Patent No.: US 12,074,151 B2
(45) Date of Patent: Aug. 27, 2024

(54) SYSTEMS AND METHODS FOR MULTI-COLOR LED PIXEL UNIT WITH VERTICAL LIGHT EMISSION

(71) Applicant: Jade Bird Display (Shanghai) Limited, Shanghai (CN)

(72) Inventors: Qunchao Xu, Shanghai (CN); Huiwen Xu, Shanghai (CN); Qiming Li, Albuquerque, NM (US)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 477 days.

(21) Appl. No.: 17/338,551

(22) Filed: Jun. 3, 2021

(65) Prior Publication Data

US 2021/0384181 A1 Dec. 9, 2021

Related U.S. Application Data

(60) Provisional application No. 63/034,391, filed on Jun. 3, 2020.

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/32* (2013.01); *H01L 24/33* (2013.01); *H01L 33/44* (2013.01);
(Continued)

(58) Field of Classification Search
CPC .................. H01L 33/62; H01L 33/382; H01L 2224/32145; H01L 2224/04026;
(Continued)

(56) References Cited

U.S. PATENT DOCUMENTS

| 6,122,109 A | 9/2000 | Peake et al. |
| 6,699,729 B1 | 3/2004 | Yamamoto |

(Continued)

FOREIGN PATENT DOCUMENTS

| CN | 102255017 A | 11/2011 |
| CN | 104838508 A | 8/2015 |

(Continued)

OTHER PUBLICATIONS

Office Action issued Jun. 14, 2023 for counterpart European Patent Application No. 20825423.5.

(Continued)

*Primary Examiner* — Antonio B Crite
(74) *Attorney, Agent, or Firm* — MORGAN, LEWIS & BOCKIUS LLP

(57) ABSTRACT

A micro multi-color LED device includes two or more LED structures for emitting a range of colors. The two or more LED structures are vertically stacked to combine light from the two more LED structures. Light from the micro multi-color LED device is emitted substantially vertically upward through each of the LED structures. In some embodiments, each LED structure is connected to a pixel driver and/or a common electrode. The LED structures are bonded together through bonding layers. In some embodiments, planarization layers enclose each of the LED structures or the micro multi-color LED device. In some embodiments, one or more of reflective layers, refractive layers, micro-lenses, spacers, and reflective cup structures are implemented in the device to improve the LED emission efficiency. A display panel comprising an array of the micro tri-color LED devices has a high resolution and a high illumination brightness.

20 Claims, 23 Drawing Sheets

(51) Int. Cl.
  *H01L 33/44* (2010.01)
  *H01L 33/54* (2010.01)
  *H01L 33/60* (2010.01)
  *H01L 33/62* (2010.01)

(52) U.S. Cl.
  CPC .............. *H01L 33/54* (2013.01); *H01L 33/60* (2013.01); *H01L 33/62* (2013.01); *H01L 24/29* (2013.01); *H01L 2224/29109* (2013.01); *H01L 2224/29111* (2013.01); *H01L 2224/29144* (2013.01); *H01L 2224/29147* (2013.01); *H01L 2224/29166* (2013.01); *H01L 2224/29186* (2013.01); *H01L 2224/2919* (2013.01); *H01L 2224/29582* (2013.01); *H01L 2224/29669* (2013.01); *H01L 2224/29671* (2013.01); *H01L 2224/32145* (2013.01); *H01L 2224/33181* (2013.01); *H01L 2224/33505* (2013.01)

(58) Field of Classification Search
  CPC ... H01L 25/0756; H01L 25/167; H01L 27/15; H01L 27/156
  See application file for complete search history.

(56) References Cited

U.S. PATENT DOCUMENTS

| | | | |
|---|---|---|---|
| 9,799,810 | B1 | 10/2017 | Ye et al. |
| 10,043,784 | B2 | 8/2018 | Sakariya et al. |
| 10,325,894 | B1 | 6/2019 | Pan |
| 11,037,914 | B2 | 6/2021 | Kim |
| 11,502,143 | B2 | 11/2022 | Fan et al. |
| 2005/0022697 | A1 | 2/2005 | Benrashid et al. |
| 2005/0224822 | A1 | 10/2005 | Liu |
| 2006/0001973 | A1 | 1/2006 | Peterson et al. |
| 2006/0073623 | A1 | 4/2006 | Conley, Jr. et al. |
| 2006/0197102 | A1 | 9/2006 | Ogihara et al. |
| 2007/0170444 | A1 | 7/2007 | Cao |
| 2008/0083830 | A1 | 4/2008 | Tokunaga et al. |
| 2008/0194054 | A1 | 8/2008 | Lin et al. |
| 2009/0020924 | A1 | 1/2009 | Lin |
| 2009/0146237 | A1 | 6/2009 | Yun |
| 2010/0008088 | A1 | 1/2010 | Koizumi et al. |
| 2010/0084665 | A1 | 4/2010 | Daniels et al. |
| 2010/0149450 | A1 | 6/2010 | Okumura |
| 2010/0213485 | A1 | 8/2010 | McKenzie et al. |
| 2011/0284887 | A1 | 11/2011 | Wu et al. |
| 2011/0297914 | A1 | 12/2011 | Zheng et al. |
| 2013/0026529 | A1 | 1/2013 | Tsang |
| 2013/0194669 | A1 | 8/2013 | De Waele et al. |
| 2013/0250567 | A1 | 9/2013 | Edmond et al. |
| 2014/0159064 | A1 | 6/2014 | Sakariya et al. |
| 2014/0191246 | A1 | 7/2014 | Draw |
| 2014/0339495 | A1 | 11/2014 | Bibl et al. |
| 2015/0115293 | A1 | 4/2015 | Wu et al. |
| 2015/0207038 | A1 | 7/2015 | Hwang et al. |
| 2015/0333221 | A1 | 11/2015 | Bibl et al. |
| 2016/0097883 | A1 | 4/2016 | Wakabayash |
| 2016/0133762 | A1 | 5/2016 | Blasco Claret et al. |
| 2017/0062770 | A1 | 3/2017 | Jang et al. |
| 2017/0069611 | A1 | 3/2017 | Zhang et al. |
| 2017/0133357 | A1 | 5/2017 | Kuo et al. |
| 2017/0155094 | A1 | 6/2017 | Joung et al. |
| 2017/0162553 | A1 | 6/2017 | Bibl et al. |
| 2017/0162746 | A1 | 6/2017 | Cha et al. |
| 2017/0179097 | A1 | 6/2017 | Zhang et al. |
| 2017/0256748 | A1 | 9/2017 | Koike et al. |
| 2017/0338275 | A1 | 11/2017 | Banna et al. |
| 2017/0358562 | A1 | 12/2017 | Banna et al. |
| 2018/0090058 | A1 | 3/2018 | Chen et al. |
| 2018/0132330 | A1 | 5/2018 | Chong et al. |
| 2018/0166429 | A1 | 6/2018 | Chong et al. |
| 2019/0019918 | A1 | 1/2019 | Vaufrey |
| 2019/0066571 | A1 | 2/2019 | Goward |
| 2019/0074417 | A1 | 3/2019 | Andrews et al. |
| 2019/0165038 | A1 | 5/2019 | Chae et al. |
| 2019/0165207 | A1 | 5/2019 | Kim et al. |
| 2019/0189596 | A1 | 6/2019 | Chae et al. |
| 2019/0198709 | A1 | 6/2019 | Wildeson et al. |
| 2019/0206927 | A1 | 7/2019 | Lee et al. |
| 2019/0259643 | A1 | 8/2019 | Saketi et al. |
| 2019/0267436 | A1 | 8/2019 | Zhang et al. |
| 2020/0075803 | A1 | 3/2020 | Danesh et al. |
| 2020/0303607 | A1 | 9/2020 | Jang et al. |
| 2021/0091257 | A1 | 3/2021 | Hwang et al. |
| 2021/0125972 | A1 | 4/2021 | Jang et al. |
| 2021/0217739 | A1 | 7/2021 | Lee et al. |
| 2021/0242380 | A1 | 8/2021 | Kim et al. |
| 2021/0313499 | A1* | 10/2021 | Gasse ............... H01L 27/14634 |
| 2021/0351171 | A1 | 11/2021 | Yoo et al. |
| 2023/0207538 | A1* | 6/2023 | Jang .................... H01L 23/3171 257/98 |

FOREIGN PATENT DOCUMENTS

| | | |
|---|---|---|
| CN | 10539996 A | 2/2016 |
| CN | 106816505 A | 6/2017 |
| CN | 110462833 A | 11/2019 |
| CN | 110709995 A | 1/2020 |
| CN | 111213248 A | 5/2020 |
| CN | 109256455 B | 6/2020 |
| JP | 3-200151 A | 9/1991 |
| JP | 6-13655 3 A | 1/1994 |
| JP | H-06-013655 A | 1/1994 |
| JP | 2005159773 A | 6/2005 |
| JP | 2008-060344 A | 3/2008 |
| JP | 2012-533904 A | 12/2012 |
| JP | 2016-503958 A | 2/2016 |
| KR | 10-2017-0027267 A | 3/2017 |
| TW | 202006695 A | 2/2020 |
| WO | 2017/037529 A1 | 3/2017 |
| WO | 2018/089189 A1 | 5/2018 |
| WO | 2018/162076 A1 | 9/2018 |
| WO | 2018/175338 A1 | 9/2018 |
| WO | 2019/103566 A1 | 5/2019 |
| WO | 2019149555 A1 | 8/2019 |

OTHER PUBLICATIONS

Office Action issued Sep. 6, 2023 for counterpart European Patent Application No. 20827064.5.
Office Action issued Oct. 4, 2023 for counterpart European Patent Application No. 20873250.3.
892 Form issued Jun. 7, 2023 for counterpart U.S. Appl. No. 17/038,503.
892 Form issued Jul. 28, 2023 for counterpart U.S. Appl. No. 17/338,560.
Huamao, et al., "GaN-based high-voltage light-emitting diodes with backside reflector", 2014, Journal of Semiconductors, vol. 35, 6 pages total.
Office Action (JPOA1) dated Jan. 31, 2024, issued in corresponding Japanese Patent Application No. 2021-573780.
Office Action (JPOA2) dated Feb. 5, 2024, issued in corresponding Japanese Patent Application No. 2021-573782.
Office Action issued in Chinese Patent Application No. 202180040262.9 dated Apr. 17, 2024.
Office Action issued in Taiwanese Patent Application No. 109146097 dated Apr. 30, 2024.
Office Action (JPOA) dated May 23, 2024, issued in corresponding Japanese Patent Application No. 2021-573782.

* cited by examiner

SYSTEMS AND METHODS FOR MULTI-COLOR LED PIXEL UNIT WITH VERTICAL LIGHT EMISSION

RELATED APPLICATION

This application claims priority to U.S. Provisional Patent Application No. 63/034,391, filed Jun. 3, 2020, entitled "SYSTEMS AND METHODS FOR MULTI-COLOR LED PIXEL UNIT WITH VERTICAL LIGHT EMISSION," which is hereby incorporated by reference.

TECHNICAL FIELD

The present disclosure relates generally to light-emitting diode (LED) display devices, and more particularly, to systems and fabricating methods for LED semiconductor devices that emit different colors with high brightness and micro-meter scale pixel size.

BACKGROUND

With the development of Mini LED and Micro LED technology in recent years, consumer devices and applications such as augmented reality (AR), Virtual Reality (VR), projection, heads-up display (HUD), mobile device displays, wearable device displays, and automotive displays, require LED panels with improved resolution and brightness. For example, an AR display integrated within a goggle and positioned close to a wearer's eyes can have a dimension of a fingernail while still demanding an HD definition (1280× 720 pixels) or higher. Many electronic devices require certain pixel size, distance between adjacent pixels, brightness, and viewing angle for the LED panels. Often, when trying to achieve the maximum resolution and brightness on a small display, it is challenging to maintain both the resolution and brightness requirements. In contrast, in some cases, pixel size and brightness are difficult to balance at the same time as they can have an approximately opposite relationship. For example, getting a high brightness for each pixel could result in a low resolution. Alternatively, obtaining a high resolution could bring the brightness down.

Generally, at least red, green and blue colors are superimposed to reproduce a broad array of colors. In some instances, to include at least red, green and blue colors within a pixel area, separate monochromatic LEDs are fabricated at different non-overlapping zones within the pixel area. The existing technology faces challenges to improve the effective illumination area within each pixel when the distance between the adjacent LEDs is determined. On the other hand, when a single LED illumination area is determined, further improving the overall resolution of the LED panel can be a difficult task because LEDs with different colors have to occupy their designated zones within the single pixel.

Active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LED) have demonstrated superior light efficiency, which makes active matrix LED displays more desirable for battery operated electronics. Arrays of driver circuitry and lighting-emitting diodes (LEDs) are used to control millions of pixels, rendering images on the display. Both single-color display panels and full-color display panels can be manufactured according to a variety of fabrication methods.

However, the integration of thousands or even millions of micro LEDs with pixel driver circuit array is quite challenging. Various fabrication methods have been proposed. In one approach, control circuitry is fabricated on one substrate and LEDs are fabricated on a separate substrate. The LEDs are transferred to an intermediate substrate and the original substrate is removed. Then the LEDs on the intermediate substrate are picked and placed one or a few at a time onto the substrate with the control circuitry. However, this fabrication process is inefficient, costly and not reliable. In addition, there are no existing manufacturing tools for mass transferring micro LEDs. Therefore new tools must be developed.

In another approach, the entire LED array with its original substrate is aligned and bonded to the control circuitry using metal bonding. The substrate on which the LEDs are fabricated remains in the final product, which may cause light cross-talk. Additionally, the thermal mismatch between the two different substrates generates stress at the bonding interface, which can cause reliability issues. Furthermore, multi-color display panels typically require more LEDs and different color LEDs grown on different substrate materials, compared with single-color display panels, thus making the traditional manufacturing process even more complicated and inefficient.

Display technologies are becoming increasingly popular in today's commercial electronic devices. These display panels are widely used in stationary large screens such as liquid crystal display televisions (LCD TVs) and organic light emitting diode televisions (OLED TVs) as well as portable electronic devices such as laptop personal computers, smartphones, tablets and wearable electronic devices. Much of development for the stationary large screens is directed to achieve a high viewing angle in order to accommodate and enable multiple audiences to see the screen from various angles. For example, various liquid crystal materials such as super twisted nematic (STN) and film compensated super twisted nematic (FSTN) have been developed to achieve a large viewing angle of each and every pixel light source in a display panel.

However, most of the portable electronic devices are designed mainly for single users, and screen orientation of these portable devices should be adjusted to be the best viewing angle for the corresponding users instead of a large viewing angle to accommodate multiple audiences. For example, a suitable viewing angle for a user may be perpendicular to the screen surface. In this case, compared with stationary large screens, light emitted at a large viewing angle is mostly wasted. Additionally, large viewing angles raise privacy concerns for portable electronic devices used in public areas.

In addition, in a conventional projection system based on a passive imager device, such as liquid crystal display (LCD), digital mirror devices (DMD), and liquid crystal on silicon (LCOS), the passive imager device itself does not emit light. Specifically, the conventional projection system projects images by optically modulating collimated light emitted from a light source, i.e., by either transmitting, e.g., by an LCD panel, or reflecting, e.g., by a DMD panel, part of the light at the pixel level. However, the part of the light that is not transmitted or reflected is lost, which reduces the efficiency of the projection system. Furthermore, to provide the collimated light, complex illumination optics are used to collect divergent light emitted from the light source. The illumination optics not only cause the system to be bulky but also introduce additional optical loss into the system, which further impacts the performance of the system. In a conventional projection system, typically less than 10% of the illumination light generated by the light source is used to form the projection image.

Light-emitting diodes (LEDs) made of semiconductor materials can be used in mono-color or full-color displays. Current displays that employ LEDs, the LEDs are usually used as the light source to provide the light to be optically modulated by, e.g., the LCD or the DMD panel. That is, the light emitted by the LEDs does not form images by itself. LED displays using LED panels including a plurality of LED dies as the imager devices have also been studied. In such an LED display, the LED panel is a self-emissive imager device, where each pixel can include one LED die (mono-color display) or a plurality of LED dies each of which represents one of primary colors (full-color display).

However, the light emitted by the LED dies is generated from spontaneous emission and is thus not directional, resulting in a large divergence angle. The large divergence angle can cause various problems in a micro-LED display. On one hand, due to the large divergence angle, only a small portion of the light emitted by the micro-LEDs can be utilized. This may significantly reduce the efficiency and brightness of a micro-LED display system. On the other hand, due to the large divergence angle, the light emitted by one micro-LED pixel may illuminate its adjacent pixels, resulting in light crosstalk between pixels, loss of sharpness, and loss of contrast. Conventional solutions reducing the large divergence angle may not effectively handle the light emitted from the micro-LED as a whole, and may utilize only the central portion of the light emitted from the micro-LED, leaving the rest of the light emitted at more oblique angles to be unutilized.

As such, it would be desirable to provide an LED structure for display panels that addresses the above-mentioned drawbacks, amongst others.

SUMMARY

There is a need for improved multi-color LED designs that improve upon, and help to address the shortcomings of conventional display systems, such as those described above. In particular, there is a need for an LED device structure that can improve the brightness and resolution at the same time while efficiently maintaining low power consumption. And there is also a need for display panels with reduced viewing angle for better protection for user's privacy, or/and reduced light waste for reduced power consumption and reduced light interference between pixels with better images.

The multi-color LED device described herein integrates at least three micro-LED structures vertically stacked by placing them at different layers of the device structure and utilizing separate electrodes for receiving control currents. By placing at least three LED structures aligned along one axis as disclosed herein, the system effectively enhances the light illumination efficiency within a single pixel area, and at the same time, improves the resolution of the LED panel.

Pitch refers to the distance between the centers of adjacent pixels on a display panel. In some embodiments, the pitch can vary from about 40 microns, to about 20 microns, to about 10 microns, and/or preferably to about 5 microns or below. Many efforts have been made to reduce the pitch. A single pixel area is fixed when the pitch specification is determined.

The multi-color coaxial LED system described herein makes it possible to emit light with a combination of different colors from a single pixel area without using extra area to accommodate LED structures with different colors. Therefore, the footprint of a single pixel is significantly reduced and the resolution of the micro-LED panel can be improved. While the concentration of the different-colored light from one micro-LED device boundary greatly enhances the brightness within a single pixel area.

Compared to conventional fabrication processes for micro-LED display chips, which rely on inefficient pick and place processes or unreliable multiple substrates approaches, the multi-color micro-LED fabrication processes disclosed herein effectively increases the efficiency and reliability of the micro-LED device fabrication. For example, the LED structures can be directly bonded on the substrate with the pixel drivers without introducing an intermediate substrate, which can simplify the fabrication steps and thus enhance the reliability and performance of the LED chip. In addition, no substrate for the micro-LED structures remain in the final multi-color device so that cross-talk and mismatch can be reduced. In addition, planarization is applied to either one of the LED structures within the multi-color micro-LED or applied to the whole multi-color micro-LED, thus allowing direct bonding or formation of different LED structures and/or other layers together with less destruction to the existing structures within the planarized layers.

The multi-color micro-LED devices described herein can include vertical light emission, e.g., light from each of the stacked LED structures is emitted substantially vertically relative to the surface of a substrate, horizontal light emission, e.g., light from each of the stacked LED structures is emitted horizontally or near horizontally relative to the surface of a substrate then reflected substantially vertically by some reflective structures, or any combination thereof. Since vertically emitted light needs to pass through all the different layers within the multi-color micro-LED device, various layers of improving light transmission and light reflection are implemented. Compared with the vertical light emission, light emitted horizontally from each of the stacked LED structures does not need to pass through all the layers above a particular structure.

Various embodiments include a display panel with integrated micro-lens array. The display panel typically includes an array of pixel light sources (e.g., LEDs, OLEDs) electrically coupled to corresponding pixel driver circuits (e.g., FETs). The array of micro-lenses is aligned to the pixel light sources and positioned to reduce the divergence of light produced by the pixel light sources. The display panel may also include an integrated optical spacer to maintain the positioning between the micro-lenses and pixel driver circuits.

The micro-lens array reduces the divergence angle of light produced by the pixel light sources and the useable viewing angle of the display panel. This, in turn, reduces power waste, increases brightness and/or better protects user privacy in public areas.

A display panel with integrated micro-lens array can be fabricated using a variety of manufacturing methods, resulting in a variety of device designs. In one aspect, the micro-lens array is fabricated directly as mesas or protrusions of the substrate with the pixel light sources. In some aspects, self-assembly, high temperature reflow, grayscale mask photolithography, molding/imprinting/stamping, and dry etching pattern transfer are techniques that can be used to fabricate micro-lens arrays.

Other aspects include components, devices, systems, improvements, methods and processes including manufacturing methods, applications, and other technologies related to any of the above.

Some exemplary embodiments include a reflective cup disposed on the semiconductor substrate and surrounding the light emitting region, e.g. a region where the light from the multi-color micro-LED device is emitted. The reflective cup can reduce the divergence of the light emitted from the light emitting region, and suppress the light crosstalk between adjacent pixel units. For example, the reflective cup can utilize the light at oblique angles, which is more efficient in collecting and converging this light for high-brightness and power-efficient display than conventional solutions. In addition, the reflective cup can block the light emitting from micro-LEDs in adjacent pixel units, which can effectively suppress the inter-pixel light crosstalk and enhance color contrast and sharpness. Exemplary embodiments of the present disclosures can improve projection brightness and contrast, and therefore reduce power consumption in projection applications. Exemplary embodiments of the present disclosures can also improve the light-emission directionality of the display, and therefore provide user with better image quality and protect user's privacy in direct-view applications. Exemplary embodiments of the present disclosure can provide multiple advantages. One advantage is that exemplary embodiments of the present disclosure can suppress inter-pixel light crosstalk and enhance brightness. Exemplary embodiments of the present disclosure can suppress the inter-pixel light crosstalk at a smaller pitch while enhancing brightness within a single pixel in a power-efficient manner.

In some exemplary embodiments, the single pixel multi-color LED device may include one or more top electrodes integrated with the reflective cup. The top electrodes may electrically connect with the top electrode layer. The top electrode integration with the reflective cup may make the single pixel multi-color LED device structure more compact and simplify the fabrication process. With the adoption of the top electrodes, the reflective cup can perform as a common P- or N-electrode of the single pixel multi-color LED device, and thus may offer a compact structure of the single pixel multi-color LED device.

In some exemplary embodiments, the micro-LED-pixel unit may include a micro-lens, in addition to the reflective cup. The micro-lens may be aligned to the light emitting region and positioned to reduce the divergence of the light emitting from the light source and decrease usable viewing angle from the single pixel multi-color LED device. For example, the micro-lens may be co-axially aligned to the light emitting region, and be positioned on the light emitting region as well as top of the reflective cup. Part of the light emitted from the light emitting region can directly arrive at and pass through the micro-lens; and the other part of the light emitted from the light emitting center can arrive at and be reflected by the reflective cup and then arrive at and pass through the micro-lens. Therefore, the divergence can be reduced and the useable viewing angle can be decreased to the extent that displays and panels using the single pixel multi-color LED devices may be seen by one user perpendicular to surfaces of the displays and panels. This, in turn, can reduce power waste and increase brightness and/or better protects user privacy in public areas. In another example, the micro-lens may be co-axially aligned to the light emitting region, positioned on the light emitting and surrounded by the reflective cup. Part of the light emitted from the light emitting region can directly arrive at and pass through the micro-lens; another part of the light emitted from the light emitting center can arrive at and be reflected by the reflective cup and then arrive at and pass through the micro-lens; and the rest of the light emitted from the light emitting center can arrive at and be reflected by the reflective cup without passing through the micro-lens. Therefore, the divergence can be reduced and the useable viewing angle can be decreased to the extent that displays and panels using the single pixel multi-color LED devices may be seen by several users. This can also reduce power waste, increase brightness and/properly protect user privacy in public areas.

In some exemplary embodiments, the single pixel multi-color LED device may further include a spacer. The spacer may be an optically transparent layer formed to provide a proper spacing between the micro-lens and the light emitting region. For example, the spacer may be disposed between the micro-lens and the top of the reflective cup, when the micro-lens is disposed above the reflective cup. Thus, the light emitted from the light emitting region can pass through the spacer and then pass through the micro-lens. The spacer may also fill up the area surrounded by the reflective cup to increase the refractive index of the medium surrounding the light emitting region. Therefore, the spacer can change the optical path of the light emitted from the light emitting region. With the adoption of the micro-lens, the light extraction efficiency of the single pixel multi-color LED device can be increased to further enhance the brightness of, e.g., the micro-LED display panel.

In some exemplary embodiments, the single pixel multi-color LED device may include a stair-shaped reflective cup. The stair-shaped reflective cup may include a cavity surrounding the light emitting region. The cavity may be formed by a plurality of inclined surfaces surrounding the light emitting region. Sub-cavities may be formed by the plurality of inclined surfaces and may have different dimensions in the horizontal direction. The stair-shaped reflective cup may be disposed on the semiconductor substrate. The stair-shaped reflective cup can reduce the divergence of the light emitted from the light emitting region, and suppress the light crosstalk between adjacent pixel units. For example, the stair-shaped reflective cup can utilize the light at oblique angles by reflecting them in different reflection directions. In addition, the stair-shaped reflective cup can block the light emitting from micro-LEDs in adjacent pixel units, which can effectively suppress the inter-pixel light crosstalk and enhance color contrast and sharpness. Exemplary embodiments of the present disclosures can improve projection brightness and contrast, and therefore reduce power consumption in projection applications. Exemplary embodiments of the present disclosures can also improve the light-emission directionality of the display, and therefore provide user with better image quality and protect user's privacy in direct-view applications.

The multi-color micro-LED devices described herein can improve brightness and resolution at the same time and are suitable for modern display panels, especially for high definition AR devices and virtual reality (VR) glasses.

Some exemplary embodiments provide a multi-color micro light-emitting diode (LED) pixel unit for a display panel that includes: a first color LED structure, formed on an IC substrate, wherein the first color LED structure includes a first light emitting layer, and a first reflective structure is formed on a bottom of the first light emitting layer; a first dielectric bonding layer having a flat top surface, covering the first color LED structure; a second color LED structure, formed on the flat top surface of the first dielectric bonding layer, wherein the second color LED structure includes a second light emitting layer, and a second reflective structure is formed on a bottom of the second light emitting layer; a second dielectric bonding layer having a flat top surface, covering the second color LED structure; a top electrode layer, covering the micro-LED pixel unit and electrically contacting with the first color LED structure and the second color LED structure; and, the IC substrate electrically connected with the first color LED structure and the second LED structure.

Some exemplary embodiments provide a micro-LED pixel unit, that includes: a first color LED structure, formed on an IC substrate, wherein the first color LED structure includes a first light emitting layer, and a first reflective structure is formed on the bottom of the first light emitting layer; a first dielectric bonding layer having a flat top surface, covering the first color LED structure; a second color LED structure, formed on the flat top surface of the first dielectric bonding layer, wherein the second color LED structure includes a second light emitting layer, and a second reflective structure is formed on a bottom of the second light emitting layer; a second dielectric bonding layer having a flat top surface, covering the second color LED structure; a third color LED structure, formed on the flat top surface of the second dielectric bonding layer, wherein the third color LED structure includes a third light emitting layer and, a third reflective structure is formed on the bottom of the third light emitting layer; a third dielectric bonding layer having a flat top surface, covering the third color LED structure; a top electrode layer, covering the micro-LED pixel unit and electrically contacting with the first color LED structure, the second color LED structure and the third color LED structure; and, the IC substrate electrically connected with the first color LED structure, the second LED structure and the third LED structure.

In some exemplary embodiments or any combination of preceding exemplary embodiments of the micro-LED pixel unit, the first dielectric bonding layer is transparent and the second dielectric bonding layer is transparent.

In some exemplary embodiments or any combination of preceding exemplary embodiments of the micro-LED pixel unit, the first reflective structure includes at least one first high reflectivity layer, the second reflective structure includes at least one second high reflectivity layer, and the third reflective structure includes at least one third high reflectivity layer; and, the reflectivity of the first high reflectivity layer, the second high reflectivity layer or the third high reflectivity layer is above 60%.

In some exemplary embodiments or any combination of preceding exemplary embodiments of the micro-LED pixel unit, the material of the first high reflectivity layer, the second high reflectivity layer or the third high reflectivity layer is metal selected from one or more of Rh, Al, Ag, and Au.

In some exemplary embodiments or any combination of preceding exemplary embodiments of the micro-LED pixel unit, the first reflective structure includes at least two first high reflectivity layers which have different refractive indices; the second reflective structure includes at two second high reflectivity layers which have different refractive indices; and, the third reflective structure includes at two third high reflectivity layers which have different refractive indices.

In some exemplary embodiments or any combination of preceding exemplary embodiments of the micro-LED pixel unit the first reflective structure further includes a first transparent layer on the first high reflectivity layer; the second reflective structure further includes a second transparent layer on the second high reflectivity layer; and, the third reflective structure further includes a second transparent layer on the third high reflectivity layer.

In some exemplary embodiments or any combination of preceding exemplary embodiments of the micro-LED pixel unit, the first transparent layer is selected from one or more of ITO and $SiO_2$; the second transparent layer is selected from one or more of ITO and $SiO_2$; and, the third transparent layer is selected from one or more of ITO and $SiO_2$.

In some exemplary embodiments or any combination of preceding exemplary embodiments of the micro-LED pixel unit, the first color LED structure further includes a first bottom electrode conductive contact layer, the second color LED structure further includes a second bottom electrode conductive contact layer, and the third color LED structure further includes a third bottom electrode conductive contact layer; the first bottom electrode conductive contact layer is electrically connected with the IC substrate by a first contact via at a bottom of the first bottom electrode conductive contact layer; the second bottom electrode conductive contact layer is electrically connected with the IC substrate by a second contact via through the first dielectric bonding layer; and, the third bottom electrode conductive contact layer is electrically connected with the IC substrate by a third contact via through the second dielectric layer and the first dielectric bonding layer.

In some exemplary embodiments or any combination of preceding exemplary embodiments of the micro-LED pixel unit, the first bottom electrode conductive contact layer is transparent, the second bottom electrode conductive contact layer is transparent and the third bottom electrode conductive contact layer is transparent.

In some exemplary embodiments or any combination of preceding exemplary embodiments of the micro-LED pixel unit, a first extended portion is extended from one side of the first light emitting layer; a second extended portion is extended from one side of the second light emitting layer; a third extended portion is extended from one side of the second light emitting layer; and, a top contact via connects the first extended portion, the second extended portion and the third extended portion to the top electrode layer through the second dielectric bonding layer and the third dielectric bonding layer.

Some exemplary embodiments provide a micro-LED pixel unit, that at least includes: a semiconductor substrate; a light emitting region, formed on the semiconductor substrate; and, a reflective optical isolation structure, formed around the light emitting region, wherein the top of the reflective optical isolation structure is higher than the top of the light emitting region.

In some exemplary embodiments or any combination of preceding exemplary embodiments of the micro-LED pixel unit, a micro-lens is above the top of the light emitting region.

In some exemplary embodiments or any combination of preceding exemplary embodiments of the micro-LED pixel unit, the top of the reflective optical isolation structure is higher than that of the micro-lens.

In some exemplary embodiments or any combination of preceding exemplary embodiments of the micro-LED pixel unit, the reflective optical isolation structure has a top opening, the lateral area of the micro-lens is less than that of the top opening.

In some exemplary embodiments or any combination of preceding exemplary embodiments of the micro-LED pixel unit, the lateral dimension of the micro-lens is larger than an active emitting area of the first color LED structure; the lateral dimension of the micro-lens is larger than an active emitting area of the second color LED structure; and, the lateral dimension of the micro-lens is larger than an active emitting area of the third color LED structure.

In some exemplary embodiments or any combination of preceding exemplary embodiments of the micro-LED pixel unit, lateral dimensions of the first color LED structure, the second color LED structure and the third color LED structure are the same.

In some exemplary embodiments or any combination of preceding exemplary embodiments of the micro-LED pixel unit, the first LED structure, the second LED structure and the third LED structure have a same center axis.

In some exemplary embodiments or any combination of preceding exemplary embodiments of the micro-LED pixel unit, the first dielectric bonding layer is transparent, the second dielectric bonding layer is transparent, and the third dielectric bonding layer is transparent.

In some exemplary embodiments or any combination of preceding exemplary embodiments of the micro-LED pixel unit, a thickness of the first reflective structure is 5 nm to 10 nm; a thickness of the second reflective structure is 5 nm to 10 nm; a thickness of the third reflective structure is 5 nm to 10 nm; a thickness of the first LED structure is not more than 300 nm; a thickness of the second LED structure is not more than 300 nm; and, a thickness of the third LED structure is not more than 300 nm.

Some exemplary embodiments provide a multi-color micro-LED pixel unit for a display panel that includes: a first LED structure that emits a first color, formed on an IC substrate; a first transparent dielectric bonding layer having a first flat top surface, covering the first LED structure; a second LED structure that emits a second color, formed on the first flat top surface of the first transparent dielectric bonding layer; a second transparent dielectric bonding layer having a second flat top surface, covering the second LED structure; and a top electrode layer, covering the multi-color micro-LED pixel unit and electrically contacting with the first LED structure and the second LED structure; wherein the IC substrate is electrically connected with the first LED structure and the second LED structure.

Some exemplary embodiments provide a micro-LED pixel unit, that includes: a first color LED structure, formed on an IC substrate; a first transparent dielectric bonding layer having a flat top surface, covering the first color LED structure; a second color LED structure, formed on the flat top surface of the first transparent dielectric bonding layer; a second transparent dielectric bonding layer having a flat top surface, covering the second color LED structure; a third color LED structure, formed on the flat top surface of the second transparent dielectric bonding layer; a third dielectric bonding layer having a flat top surface, covering the third color LED structure; a top electrode layer, covering the micro-LED pixel unit and electrically contacting with the first color LED structure, the second color LED structure and the third color LED structure; and the IC substrate electrically connected with the first color LED structure, the second LED structure and the third LED structure.

In some exemplary embodiments or any combination of preceding exemplary embodiments of the micro-LED pixel unit, a first reflective structure is formed at the bottom of the first color LED structure; a second reflective structure is formed at the bottom of the second color LED structure; and, a third reflective structure is formed at the bottom of the third color LED structure.

Some exemplary embodiments provide a micro-LED pixel unit, that includes: an IC substrate; a light emitting region, formed on the IC substrate, including at least one kind of LED structure and at least a dielectric bonding layer, wherein each of the dielectric bonding layer have a flat top surface covering a surface of every LED structure; a top electrode layer, covering the micro-LED pixel unit and electrically contacting with the every color LED structure, wherein the IC substrate is electrically connected with every color LED structure; and, a stair-shaped reflective cup structure having a cavity, surrounding the light emitting region.

Some exemplary embodiments provide a micro-LED pixel unit, that includes: a semiconductor substrate; a light emitting region, formed on the semiconductor substrate; a reflective optical isolation structure, formed around the light emitting region; and, a refractive structure, formed between the reflective optical isolation structure and the light emitting region.

Some exemplary embodiments provide a micro-LED pixel unit, that includes: a semiconductor substrate; a light emitting region, formed on the semiconductor substrate, including at least one kind of LED structure and at least a transparent dielectric bonding layer, wherein each of the transparent dielectric bonding layer having a flat top surface covering a surface of every LED structure; a top electrode layer, covering the micro-LED pixel unit and electrically contacting with every color LED structure, wherein the IC substrate is electrically connected with every color LED structure; a stair-shaped reflective cup structure, formed around the light emitting region; and, a refractive structure, formed between the stair-shaped reflective cup structure and the light emitting region.

In some exemplary embodiments or any combination of preceding exemplary embodiments of the micro-LED pixel unit, the reflective cup structure has a top opening, the lateral area of the micro-lens is less than that of the top opening.

Some exemplary embodiments provide a micro-LED pixel unit that includes: a semiconductor substrate; a light emitting region, formed on the semiconductor substrate; a floating reflective optical isolation structure, surrounding the light emitting region, wherein the floating reflective optical isolation structure is positioned at a distance above the semiconductor substrate.

Some exemplary embodiments provide a micro-LED pixel unit, that includes: a semiconductor substrate; a light emitting region, formed on the semiconductor substrate; a reflective optical isolation structure, surrounding the light emitting region; a top electrode layer, covering the light emitting region and electrically connecting the reflective optical isolation structure, wherein the top electrode layer electrically contacts the reflective optical isolation structure.

In some exemplary embodiments or any combination of preceding exemplary embodiments of the micro-LED pixel unit, an edge of the top electrode layer touches the reflective optical isolation structure.

In some exemplary embodiments or any combination of preceding exemplary embodiments of the micro-LED pixel unit, the light emitting region includes: at least one kind of LED structure and at least a dielectric bonding layer; a top electrode layer, covering the micro-LED pixel unit and electrically contacting with every color LED structure, wherein the semiconductor substrate is electrically connected with every color LED structure.

In some exemplary embodiments or any combination of preceding exemplary embodiments of the micro-LED pixel unit, the reflective optical isolation structure is a floating reflective structure.

In some exemplary embodiments or any combination of preceding exemplary embodiments of the micro-LED pixel unit, the reflective optical isolation structure is a stair-shaped reflective cup structure.

Some exemplary embodiments provide a micro-LED pixel unit, that at least includes: a semiconductor substrate; a light emitting region, formed on the semiconductor substrate; a floating reflective optical isolation structure, surrounding the light emitting region, wherein the floating reflective optical isolation structure is positioned at a distance above the semiconductor substrate; and a top electrode layer, formed on top of the light emitting region, wherein the top electrode layer contacts with the floating reflective optical isolation structure.

In some exemplary embodiments or any combination of preceding exemplary embodiments of the micro-LED pixel unit, the light emitting region includes at least one kind of LED structure and a bonding layer at the bottom of each LED structure.

In some exemplary embodiments or any combination of preceding exemplary embodiments of the micro-LED pixel unit, the first color LED structure further includes a first bottom electrode conductive contact layer, the second color LED structure further includes a second bottom electrode conductive contact layer; the first bottom electrode conductive contact layer is electrically connected with the IC substrate by a first contact via at the bottom of the first bottom electrode conductive contact layer; the second bottom electrode conductive contact layer is electrically connected with the IC substrate by a second contact via through the first dielectric bonding layer.

Some exemplary embodiments provide a micro-LED pixel unit, that includes: a semiconductor substrate; a light emitting region, formed on the semiconductor substrate; a top electrode layer, covering the light emitting region and electrically contacting with the light emitting region; a reflective cup structure, formed around the light emitting region, wherein the top electrode layer is electrically connected with the reflective cup structure; the semiconductor substrate is electrically connected with the reflective cup structure; and, a refractive structure, formed between the reflective cup structure and the light emitting region.

Some exemplary embodiments provide a micro-LED pixel unit that includes: a semiconductor substrate; a light emitting region, formed on the semiconductor substrate, including at least one kind of LED structure and a bonding layer at a bottom of every LED structure, wherein each LED structure includes a light emitting layer and a bottom reflective structure at a bottom of the light emitting layer; a top electrode layer, covering the micro-LED pixel unit and electrically contacting with every color LED structure, wherein the semiconductor substrate is electrically connected with every color LED structure; a reflective cup structure, formed around the light emitting region; and, a refractive structure, formed between the reflective cup structure and the light emitting region.

Some exemplary embodiments provide a micro-LED pixel unit that includes: a semiconductor substrate; a light emitting region, formed on the semiconductor substrate, including at least one kind of LED structure and a bonding layer at the bottom of every LED structure, wherein the LED structure includes a light emitting layer and a reflective structure at the bottom of the light emitting layer; a top electrode layer, covering the LED structure pixel unit and electrically contacting with every color LED structure, wherein the semiconductor substrate is electrically connected with every color LED structure; and, a stair-like reflective cup structure, surrounding the light emitting region, wherein the top of the stair-like reflective cup structure is higher than the top of the light emitting region.

Some exemplary embodiments provide a micro-LED pixel unit that includes: a semiconductor substrate; a light emitting region, formed on the semiconductor substrate, including at least one kind of LED structure and a bonding layer at a bottom of every LED structure, wherein the LED structure includes a light emitting layer and a reflective structure at a bottom of the light emitting layer; a top electrode layer, covering the micro-LED pixel unit and electrically contacting with every color LED structure, wherein the semiconductor substrate is electrically connected with every color LED structure; and, a floating reflective cup structure, surrounding the light emitting region, wherein the floating reflective cup structure is positioned a distance from the semiconductor substrate.

In some exemplary embodiments or any combination of preceding exemplary embodiments of the micro-LED pixel unit, the bottom of the floating reflective cup structure is higher than the top surface of the semiconductor substrate.

In some exemplary embodiments or any combination of preceding exemplary embodiments of the micro-LED pixel unit, the floating reflective cup structure is a stair-shaped reflective cup structure.

In some exemplary embodiments or any combination of preceding exemplary embodiments of the micro-LED pixel unit, the first LED structure is embedded within a first planarized transparent dielectric layer.

In some exemplary embodiments or any combination of preceding exemplary embodiments of the micro-LED pixel unit, the first planarized transparent dielectric layer is composed of solid inorganic materials or plastic materials.

In some exemplary embodiments or any combination of preceding exemplary embodiments of the micro-LED pixel unit, the second LED structure is embedded within a second planarized transparent dielectric layer.

In some exemplary embodiments or any combination of preceding exemplary embodiments of the micro-LED pixel unit, the second planarized transparent dielectric layer is composed of solid inorganic materials or plastic materials.

In some exemplary embodiments or any combination of preceding exemplary embodiments of the micro-LED pixel unit, the first transparent dielectric bonding layer is composed of solid inorganic materials or plastic materials.

In some exemplary embodiments or any combination of preceding exemplary embodiments of the micro-LED pixel unit, the first LED structure includes a first bottom electrode conductive contact layer formed on the bottom of the first LED structure; the second LED structure includes a second bottom electrode conductive contact layer formed on the bottom of the second LED structure; the first bottom electrode conductive contact layer is electrically connected with the IC substrate by a first contact in a first via at the bottom of the first bottom electrode conductive contact layer; and the second bottom electrode conductive contact layer is electrically connected with the IC substrate by a second contact in a second via through the first transparent dielectric bonding layer.

In some exemplary embodiments or any combination of preceding exemplary embodiments of the micro-LED pixel unit, the first bottom electrode conductive contact layer is transparent, and the second bottom electrode conductive contact layer is transparent.

In some exemplary embodiments or any combination of preceding exemplary embodiments of the micro-LED pixel unit, the first LED structure includes a first light emitting layer; a first side portion is extended from a side of the first light emitting layer; the second LED structure includes a second light emitting layer; a second side portion is extended from a side of the second light emitting layer; and a third contact in a third via connects the first side portion and the second side portion to the top electrode layer through the second transparent dielectric bonding layer.

In some exemplary embodiments or any combination of preceding exemplary embodiments of the micro-LED pixel unit, an optical isolation structure is formed around the micro-LED pixel unit.

In some exemplary embodiments or any combination of preceding exemplary embodiments of the micro-LED pixel unit, the optical isolation structure is a reflective cup.

In some exemplary embodiments or any combination of preceding exemplary embodiments of the micro-LED pixel unit, the lateral dimension of the first LED structure is the same as that of the second LED structure.

In some exemplary embodiments or any combination of preceding exemplary embodiments of the micro-LED pixel unit, the first LED structure and the second LED structure have a same central axis.

In some exemplary embodiments or any combination of preceding exemplary embodiments of the micro-LED pixel unit, a first reflective layer is formed at the bottom of the first LED structure; a second reflective layer is formed at the bottom of the second LED structure.

In some exemplary embodiments or any combination of preceding exemplary embodiments of the micro-LED pixel unit, a thickness of the first reflective layer is 5 to 10 nm; a thickness of the second reflective layer is 5 to 10 nm; a thickness of the first LED structure is not more than 300 nm; and, a thickness of the second LED is not more than 300 nm.

In some exemplary embodiments or any combination of preceding exemplary embodiments of the micro-LED pixel unit, a bonding metal layer is formed at the bottom of the first LED structure.

Some exemplary embodiments provide a micro-light LED pixel unit, that includes: a first color LED structure, formed on an IC substrate, wherein the first color LED structure includes a first light emitting layer, and a first reflective structure is formed on a bottom of the first light emitting layer; a first bonding metal layer, formed at a bottom of the first color LED structure, and configured to bond the IC substrate and the first color LED structure; a second bonding layer, formed on a top of the first color LED structure; a second color LED structure, formed on the second bonding layer, wherein the second color LED structure includes a second light emitting layer, and a second reflective structure is formed on a bottom of the second light emitting layer; a top electrode layer, covering the first color LED structure and the second color LED structure and electrically contacting with the first color LED structure and the second color LED structure, wherein the IC substrate is electrically connected with the first color LED structure and the second color LED structure; and a reflective cup, surrounding the first color LED structure and the second color LED structure.

In some exemplary embodiments or any combination of preceding exemplary embodiments of the micro-LED pixel unit, the first reflective structure includes at least one first reflective layer and the second reflective structure includes at least one second reflective layer, reflectivity of the first reflective layer or the second reflective layer being above 60%.

In some exemplary embodiments or any combination of preceding exemplary embodiments of the micro-LED pixel unit, the material of the first reflective layer or the second reflective layer comprises one or more of Rh, Al, Ag, or Au.

In some exemplary embodiments or any combination of preceding exemplary embodiments of the micro-LED pixel unit, the first reflective structure includes two first reflective layers and refractive indices of the two first reflective layers are different, and wherein the second reflective structure includes two second reflective layers and refractive indices of the two second reflective layers are different.

In some exemplary embodiments or any combination of preceding exemplary embodiments of the micro-LED pixel unit, the two first reflective layers comprise $SiO_2$ and $Ti_3O_5$ respectively, and the two second reflectivity layers comprise $SiO_2$ and $Ti_3O_5$ respectively.

In some exemplary embodiments or any combination of preceding exemplary embodiments of the micro-LED pixel unit, the first reflective structure further includes a first transparent layer on the first reflective layer, and the second reflective structure further includes a second transparent layer on the second reflective layer.

In some exemplary embodiments or any combination of preceding exemplary embodiments of the micro-LED pixel unit, the first transparent layer comprises one or more of indium tin oxide (ITO) or $SiO_2$, and the second transparent layer comprises one or more of ITO or $SiO_2$.

In some exemplary embodiments or any combination of preceding exemplary embodiments of the micro-LED pixel unit, the first color LED structure further includes a first bottom conductive contact layer and a first top conductive contact layer, and the second color LED structure further includes a second bottom conductive contact layer and a second top conductive contact layer; the first light emitting layer is between the first bottom conductive contact layer and the first top conductive contact layer, and the second light emitting layer is between the second bottom conductive contact layer and the second top conductive contact layer; the first bottom conductive contact layer is electrically connected with the IC substrate through the first reflective structure and the first bonding metal layer through a first contact via, and the second bottom conductive contact layer is electrically connected with the IC substrate through a second contact via; and an edge of the first top conductive contact layer is in contact with the top electrode layer, and a top surface of the second top conductive contact layer is in contact with the top electrode layer.

In some exemplary embodiments or any combination of preceding exemplary embodiments of the micro-LED pixel unit, the material of the reflective cup comprises metal.

In some exemplary embodiments or any combination of preceding exemplary embodiments of the micro-LED pixel unit, a micro-lens is formed above the top electrode layer.

In some exemplary embodiments or any combination of preceding exemplary embodiments of the micro-LED pixel unit, a spacer is formed between the micro-lens and the top electrode layer.

In some exemplary embodiments or any combination of preceding exemplary embodiments of the micro-LED pixel unit, the material of the spacer comprises silicon oxide.

In some exemplary embodiments or any combination of preceding exemplary embodiments of the micro-LED pixel unit, the lateral dimension of the micro-lens is larger than that of an active emitting area of the first LED structure; and the lateral dimension of the micro-lens is larger than that of an active emitting area of the second LED structure.

In some exemplary embodiments or any combination of preceding exemplary embodiments of the micro-LED pixel unit, the first color LED structure and the second color LED structure have a same lateral dimension.

In some exemplary embodiments or any combination of preceding exemplary embodiments of the micro-LED pixel unit, the first color LED structure and the second color LED structure have a same center axis.

In some exemplary embodiments or any combination of preceding exemplary embodiments of the micro-LED pixel unit, a thickness of the at least one first reflective layer is in a range of 5 nm to 10 nm, and a thickness of the at least one second reflective layer is in a range of 5 nm to 10 nm, and wherein a thickness of the first color LED structure is not more than 300 nm, and a thickness of the second color LED structure is not more than 300 nm.

Some exemplary embodiments provide a micro-LED pixel unit that includes: an IC substrate; a light emitting region, formed on the IC substrate, including a plurality of color LED structures, a bottom of each of the plurality of color LED structures being connected to a corresponding bonding layer in the light emitting region, wherein each of the plurality of color LED structures includes a light emitting layer and a reflective structure at a bottom of the light emitting layer; a top electrode layer, covering each of the plurality of color LED structures and electrically contacting to each of the plurality of color LED structures, wherein the IC substrate is electrically connected with each of the plurality of color LED structures; and, a stair-shaped reflective cup forming a cavity, surrounding the light emitting region.

In some exemplary embodiments or any combination of preceding exemplary embodiments of the micro-LED pixel unit, an inner sidewall of the cavity includes a plurality of inclined surfaces.

In some exemplary embodiments or any combination of preceding exemplary embodiments of the micro-LED pixel unit, angles of the plurality of inclined surfaces relative to surface of the IC substrate from bottom to top of the cavity become smaller.

In some exemplary embodiments or any combination of preceding exemplary embodiments of the micro-LED pixel unit, sub-cavities formed by the plurality of inclined surfaces have different dimensions in the horizontal direction.

In some exemplary embodiments or any combination of preceding exemplary embodiments of the micro-LED pixel unit, inner sidewalls of the sub-cavities are not arranged in a same plane.

In some exemplary embodiments or any combination of preceding exemplary embodiments of the micro-LED pixel unit, the heights of the sub-cavities are different.

In some exemplary embodiments or any combination of preceding exemplary embodiments of the micro-LED pixel unit, the height of a sub-cavity in middle of the cavity is less than the heights of other sub-cavities.

In some exemplary embodiments or any combination of preceding exemplary embodiments of the micro-LED pixel unit, the height of a sub-cavity at top of the cavity is larger than the height of a sub-cavity at the bottom of the cavity.

In some exemplary embodiments or any combination of preceding exemplary embodiments of the micro-LED pixel unit, the plurality of color LED structures further includes a top color LED structure.

In some exemplary embodiments or any combination of preceding exemplary embodiments of the micro-LED pixel unit, the top of the cavity is higher than the top of the top color LED structure.

In some exemplary embodiments or any combination of preceding exemplary embodiments of the micro-LED pixel unit, the cavity includes a plurality of sub-cavities, and each of the plurality of color LED structures is in a respectively different one of the sub-cavities.

In some exemplary embodiments or any combination of preceding exemplary embodiments of the micro-LED pixel unit, a transparent dielectric bonding layer covers at least one of the plurality of color LED structures, wherein the transparent dielectric bonding layer comprises solid inorganic materials or plastic materials.

In some exemplary embodiments or any combination of preceding exemplary embodiments of the micro-LED pixel unit, the solid inorganic materials comprise one or more materials selected from the group consisting of $SiO_2$, $Al_2O_3$, $Si_3N_4$, Phosphosilicate glass (PSG), and Borophosphosilicate glass (BPSG).

In some exemplary embodiments or any combination of preceding exemplary embodiments of the micro-LED pixel unit, the plastic materials comprise one or more polymers selected from the group consisting of SU-8, PermiNex, Benzocyclobutene (BCB), and spin-on glass (SOG).

In some exemplary embodiments or any combination of preceding exemplary embodiments of the micro-LED pixel unit, each of the plurality of color LED structures includes a bottom conductive contact layer and a top conductive contact layer, and the light emitting layer is formed between the bottom conductive contact layer and the top conductive contact layer; and wherein the bottom conductive contact layer is electrically connected with the IC substrate through the reflective structure and the corresponding bonding layer through a contact via, and, a top surface of the top conductive contact layer of the top color LED structure is in contact with the top electrode layer, and an edge of the top conductive contact layer of a color LED structure under the top color LED structure is in contact with the top electrode layer.

In some exemplary embodiments or any combination of preceding exemplary embodiments of the micro-LED pixel unit, an extended portion is extended from one side of the light emitting layer of a color LED structure under the top color LED structure, a contact via connecting the extended portion to the top electrode layer.

In some exemplary embodiments or any combination of preceding exemplary embodiments of the micro-LED pixel unit, the lateral dimension of the micro-lens is larger than a light emitting dimension of each of the plurality of color LED structures.

In some exemplary embodiments or any combination of preceding exemplary embodiments of the micro-LED pixel unit, the plurality of color LED structures have a same center axis.

In some exemplary embodiments or any combination of preceding exemplary embodiments of the micro-LED pixel unit, the reflective structure includes a reflective layer and a thickness of the reflective layer is in a range of 5 nm to 10 nm, and a thickness of each of the plurality of color LED structures is not more than 300 nm.

In some exemplary embodiments or any combination of preceding exemplary embodiments of the micro-LED pixel unit, the material of the top electrode layer is selected from the group consisting of graphene, Indium tin oxide (ITO), Aluminum-Doped Zinc Oxide (AZO), and Fluorine doped Tin Oxide (FTO).

Some exemplary embodiments provide a micro-LED pixel unit, that includes: a semiconductor substrate; a light emitting region, formed on the semiconductor substrate, including a plurality of color LED structures, a bottom of each of the plurality of color LED structures being connected to a corresponding bonding layer in the light emitting region, wherein each of the plurality of color LED structure includes a light emitting layer and a reflective structure at a bottom of the light emitting layer; a top electrode layer, covering each of the plurality of color LED structures and electrically contacting with each of the plurality of color LED structures, wherein the semiconductor substrate is electrically connected with each of the plurality of color LED structures; a reflective cup, surrounding the light emitting region; and a refractive structure, formed between the reflective cup and the light emitting region.

In some exemplary embodiments or any combination of preceding exemplary embodiments of the micro-LED pixel unit, a micro-lens is formed on a top surface of the refractive structure.

In some exemplary embodiments or any combination of preceding exemplary embodiments of the micro-LED pixel unit, the lateral dimension of the micro-lens is not less than the lateral dimension of the light emitting region.

In some exemplary embodiments or any combination of preceding exemplary embodiments of the micro-LED pixel unit, the reflective cup has a top opening area, and the lateral dimension of the micro-lens is less than the lateral dimension of the top opening area.

In some exemplary embodiments or any combination of preceding exemplary embodiments of the micro-LED pixel unit, a bottom dielectric layer is formed between the bottom of the reflective cup and the semiconductor substrate.

In some exemplary embodiments or any combination of preceding exemplary embodiments of the micro-LED pixel unit, a top conductive layer formed on the top of the light emitting region, and the top conductive layer is electrically connected with the reflective cup.

In some exemplary embodiments or any combination of preceding exemplary embodiments of the micro-LED pixel unit, the top conductive layer directly contacts with the top of the reflective cup or the bottom of the reflective cup.

In some exemplary embodiments or any combination of preceding exemplary embodiments of the micro-LED pixel unit, the top of the refractive structure is higher than the top of the reflective cup.

In some exemplary embodiments or any combination of preceding exemplary embodiments of the micro-LED pixel unit, the semiconductor substrate is an IC substrate.

In some exemplary embodiments or any combination of preceding exemplary embodiments of the micro-LED pixel unit, the reflective cup is a stair-shaped reflective cup forming a cavity encompassing the light emitting region.

In some exemplary embodiments or any combination of preceding exemplary embodiments of the micro-LED pixel unit, sub-cavities formed by the plurality of inclined surfaces have different dimensions in the horizontal direction.

In some exemplary embodiments or any combination of preceding exemplary embodiments of the micro-LED pixel unit, each of the plurality of color LED structures includes a respective extended portion extended from one side of the respective color LED structure, and the respective extended portion is electrically connected with the top electrode layer via a respective first contact via, and the bottom of each of the plurality of color LED structures is electrically connected with the semiconductor substrate via a respective second contact via.

Some exemplary embodiments provide a micro-LED pixel unit, that includes: a semiconductor substrate; a light emitting region, formed on the semiconductor substrate, including a plurality of color LED structures, a bottom of each of the plurality of color LED structures being connected to a corresponding bonding layer in the light emitting region, wherein each of the plurality of color LED structures includes a light emitting layer and a reflective structure at a bottom of the light emitting layer; a top electrode layer, covering each of the plurality of color LED structures and electrically contacting with each of the plurality of color LED structures, wherein the semiconductor substrate is electrically connected with each of the plurality of color LED structures; and, a reflective cup, surrounding the light emitting region, a top of the reflective cup being higher than a top of the light emitting region.

In some exemplary embodiments or any combination of preceding exemplary embodiments of the micro-LED pixel unit, a micro-lens is formed above the light emitting region.

In some exemplary embodiments or any combination of preceding exemplary embodiments of the micro-LED pixel unit, the top of the reflective cup is higher than a top of the micro-lens.

In some exemplary embodiments or any combination of preceding exemplary embodiments of the micro-LED pixel unit, a refractive structure is at the bottom of the micro-lens and formed between the reflective cup and the light emitting region.

In some exemplary embodiments or any combination of preceding exemplary embodiments of the micro-LED pixel unit, the bottom of the light emitting region is electrically connected with the semiconductor substrate.

Some exemplary embodiments provide a micro-LED pixel unit, that includes: a semiconductor substrate; a light emitting region, formed on the semiconductor substrate, including a plurality of color LED structures, a bottom of each of the plurality of color LED structures being connected to a corresponding bonding layer in the light emitting region, wherein each of the plurality of color LED structures includes a light emitting layer and a reflective structure at a bottom of the light emitting layer; a top electrode layer, covering each of the plurality of color LED structures and electrically contacting with each of the plurality of color LED structures, wherein the semiconductor substrate is electrically connected with each of the plurality of color LED structures; and, a floating reflective cup, surrounding the light emitting region, wherein a bottom of the floating reflective cup is above the semiconductor substrate.

In some exemplary embodiments or any combination of preceding exemplary embodiments of the micro-LED pixel unit, the bottom of the floating reflective cup is higher than a top surface of the corresponding bonding layer at the bottom of one of the plurality of color LED structures.

In some exemplary embodiments or any combination of preceding exemplary embodiments of the micro-LED pixel unit, the floating reflective cup is stair-shaped.

In some exemplary embodiments or any combination of preceding exemplary embodiments of the micro-LED pixel unit, the top of the floating reflective cup is higher than the top of the micro-lens.

In some exemplary embodiments or any combination of preceding exemplary embodiments of the micro-LED pixel unit, a refractive structure is at the bottom of the micro-lens and formed between the floating reflective cup and the light emitting region.

In some exemplary embodiments or any combination of preceding exemplary embodiments of the micro-LED pixel unit, the floating reflective cup has a top opening area, and the lateral dimension of the micro-lens is less than the lateral dimension of the top opening area.

In some exemplary embodiments or any combination of preceding exemplary embodiments of the micro-LED pixel unit, a bottom dielectric layer is formed between the floating reflective cup and the semiconductor substrate.

In some exemplary embodiments or any combination of preceding exemplary embodiments of the micro-LED pixel unit, the top electrode layer directly contacts the top of the floating reflective cup or the bottom of the floating reflective cup.

In some exemplary embodiments or any combination of preceding exemplary embodiments of the micro-LED pixel unit, the stair-shaped floating reflective cup forms a cavity encompassing the light emitting region.

In some exemplary embodiments or any combination of preceding exemplary embodiments of the micro-LED pixel unit, the material of the floating reflective cup comprises metal.

In some exemplary embodiments or any combination of preceding exemplary embodiments of the micro-LED pixel unit, the reflective structure includes a reflective layer formed at the bottom of each of the plurality of color LED structures respectively.

In some exemplary embodiments or any combination of preceding exemplary embodiments of the micro-LED pixel unit, a thickness of the reflective layer is in a range of 5 nm to 10 nm, and a thickness of each of the plurality of color LED structures is not more than 300 nm.

The compact design of the multi-color LED devices and systems disclosed herein utilizes the lateral overlapping of the light emission LED structures, thereby improving the light emission efficiency, resolution, and overall performance of the LED display systems. Furthermore, the fabrication of the multi-color LED display systems can reliably and efficiently form the LED structure patterns without using or retaining extra substrates. In some instances, the design of the display devices and systems disclosed herein utilizes the direct formation of the micro-lens on top of the multi-color LED devices on the substrate by utilizing the conformity of the shape of the micro-lens material to the shape of the multi-color LED device, thereby greatly reducing the steps of the micro-lens fabrication and improving the efficiency of the display panel structure formation. Reduced viewing angle and reduced light interference improve the light emission efficiency, resolution, and overall performance of the display systems. Thus, implementation of the multi-color LED display systems can satisfy the rigorous display requirements for AR and VR, HUD, mobile device displays, wearable device displays, high definition small projectors, and automotive displays compared with the use of the conventional LEDs.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1A:
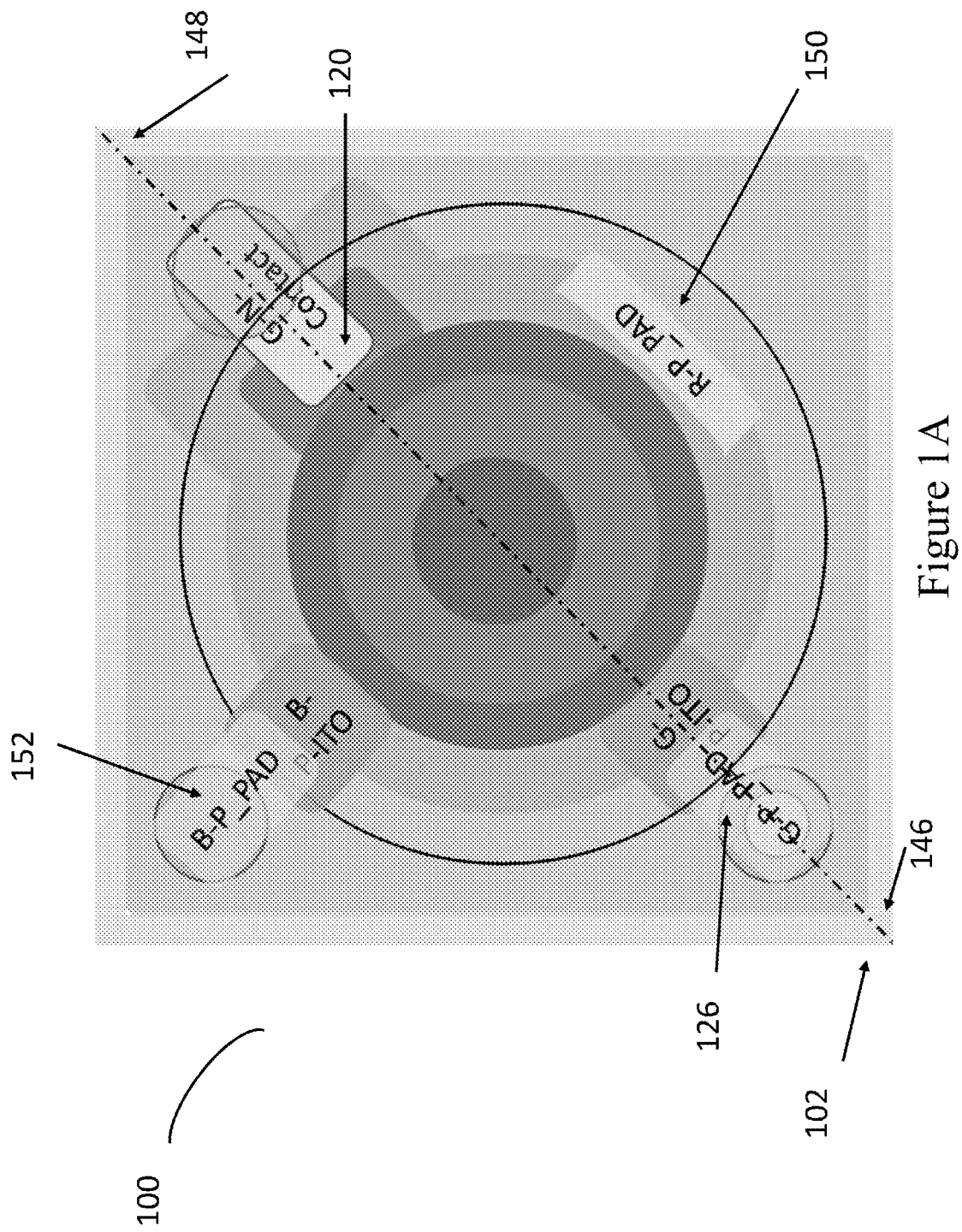
FIG. 1A is a top view of a single pixel tri-color LED device 100 with layered planarization, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

In some embodiments, a single pixel multi-color LED device includes two or more LED structures. In some embodiments, each of the LED structures includes at least a LED light emitting layer that emits a distinct color. When two LED structures are within a single pixel multi-color LED device, two colors and the combinations of the two colors can be emitted from the single pixel multi-color LED device. When three LED structures are within a single pixel multi-color LED device, three colors and the combinations of the three colors can be emitted from the single pixel multi-color LED device.

FIG. 1A is a top view of a single pixel tri-color LED device 100, in accordance with some embodiments.

Figure 1B:
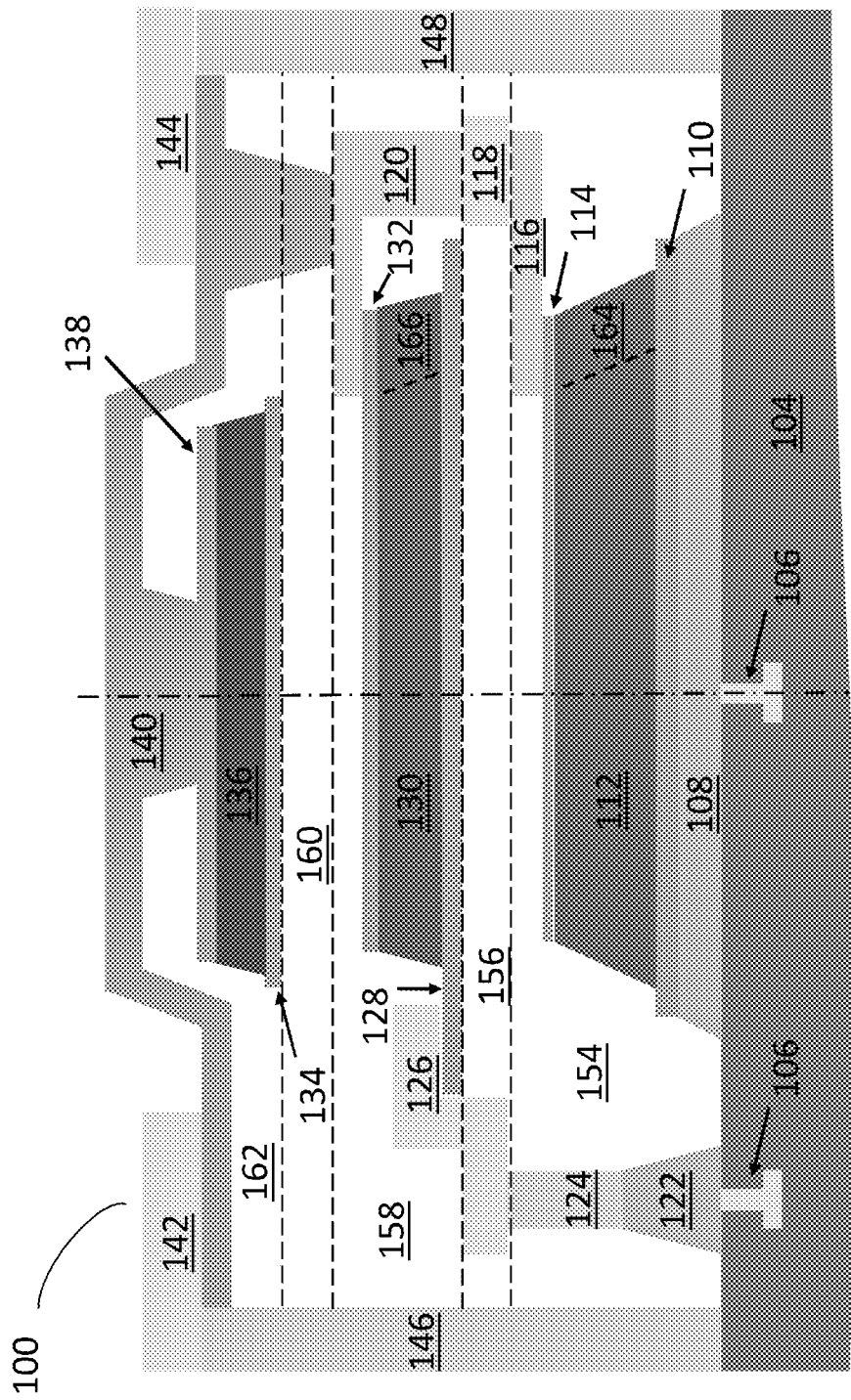
FIG. 1B is a cross-sectional view of a single pixel tri-color LED device 100 along the diagonal line 102 in FIG. 1A with layered planarization, in accordance with some embodiments.

FIG. 1B is a cross-sectional view of a single pixel tri-color LED device 100 along the diagonal line 102 in FIG. 1A, in accordance with some embodiments. The diagonal line passes through the center of the single pixel tri-color LED device 100. In some embodiments, the tri-color LED device 100 includes a substrate 104.

For convenience, "up" is used to mean away from the substrate 104, "down" means toward the substrate 104, and other directional terms such as top, bottom, above, below, under, beneath, etc. are interpreted accordingly. The supporting substrate 104 is the substrate on which the array of individual driver circuits 106 is fabricated. In some embodiments, the driver circuits could also be located in one of the layers above the substrate 104, or above the micro tri-color LED structure 100. Each driver circuit is a pixel driver 106. In some instances, the driver circuits 106 are thin-film transistor pixel drivers or silicon CMOS pixel drivers. In one embodiment, the substrate 104 is a Si substrate. In another embodiment, the supporting substrate 104 is a transparent substrate, for example, a glass substrate. Other example substrates include GaAs, GaP, InP, SiC, ZnO, and sapphire substrates. In some embodiments, the substrate 104 is around 700 microns thick. The driver circuits 106 form individual pixel drivers to control the operation of the individual single pixel tri-color LED device 100. The circuitry on substrate 104 includes contacts to each individual driver circuit 106 and also a ground contact. As shown in both FIG. 1A and FIG. 1B, each micro tri-color LED structure 100 also has two types of contacts: P electrodes or anodes, such as 150 (or 108), 152, and the combined section 122, 124 and 126, which are connected to the pixel driver; and N electrodes or cathodes, such as 140, 142, 144, and the combined section 116, 118, and 120, which are connected to the ground (i.e., the common electrode).

In some embodiments, the N-electrode (or N-electrodes contact pad) and its connections, such as 140, 142, 144, and the combined section 116, 118, and 120, are made of materials such as graphene, ITO, Aluminum-Doped Zinc Oxide (AZO), or Fluorine doped Tin Oxide (FTO), or any combinations thereof. In some embodiments, the N-electrode (or N-electrodes contact pad) and its connections, such as 140, 142, 144, and the combined section 116, 118, and 120, are made of non-transparent or transparent conductive materials and, in a preferred embodiment especially for a top electrode such as 140, transparent conductive materials. In some embodiments, the P-electrode (or P-electrodes contact pad) and its connections, such as 150, 152, and the combined section 122, 124 and 126, are made of materials such as graphene, ITO, AZO, or FTO, or any combinations thereof. In some embodiments, the P-electrode (or P-electrodes contact pad) and its connections, such as 150, 152, and the combined section 122, 124 and 126, are made of non-transparent or transparent conductive materials and, in a preferred embodiment especially for a top electrode, transparent conductive materials. In some embodiments, the locations of the P-electrodes (or P-electrodes contact pad) and its connections, and N-electrodes (or N-electrodes contact pad) and its connections can be switched.

Although some features are described herein with the term "layer", it should be understood that such features are not limited to a single layer but may include a plurality of sublayers. In some instance, a "structure" can take the form of a "layer".

In some embodiments, three LED structures including LED light emitting layers 112, 130, and 136, respectively, are formed in a stacked structure, for example, a green LED light emitting layer 130 is formed on top of a red LED light emitting layer 112, and a blue LED light emitting layer 136 is formed on top of the green LED light emitting layer 130.

In general, an LED light emitting layer includes a PN junction with a p-type region/layer and an n-type region/layer, and an active layer between the p-type region/layer and n-type region/layer.

In some embodiments, the light emitted from the red LED light emitting layer 112 is able to propagate through the green LED light emitting layer 130 and then through the blue LED light emitting layer 136 to be emitted out of the tri-color LED device 100. In some embodiments, the light emitted from the green LED light emitting layer 130 is able to propagate through the blue LED light emitting layer 136 to be emitted out of the tri-color LED device 100. In some embodiments, an LED light emitting layer such as 112, 130, and 136 includes many epitaxial sub-layers with different compositions. Examples of the LED epitaxial layers include III-V nitride, III-V arsenide, III-V phosphide, and III-V antimonide epitaxial structures. Examples of micro LEDs include GaN based UV/blue/green micro LEDs, AlInGaP based red/orange micro LEDs, and GaAs or InP based infrared (IR) micro LEDs.

In some embodiments, each of the stacked LED structures can be controlled individually to generate its individual light. In some embodiments, the combined light from the top LED epitaxial layer as a result from the operations all the LED epitaxial layers in the tri-color LED device 100 can change the color of the single pixel on a display panel within a small footprint.

In some embodiments, depending on the design of the LED device 100, the emitted colors of the LED structures included in the same device are not limited to red, green and blue. For example, suitable colors can be selected from a range of different colors from a wavelength of 380 nm to 700 nm in visible color range. In some embodiments, LED structures emitting other colors from invisible range such as ultra-violet and infrared can be implemented. For example, the three-color choice, from bottom to top can be red, green, and blue. In another embodiment, the three-color choice, from bottom to top can be infrared, orange, and ultra-violet. In some embodiments, the wavelength of the light from the LED structure on one layer of the device 100 has to be longer than the wavelength from the LED structure on a layer on top of the current layer. For instance, the wavelength of the light from the bottom LED light emitting layer 112 is longer than that of the middle LED light emitting layer 130, and the wavelength of the light from the middle LED light emitting layer 130 is longer than that of the top LED light emitting layer 136.

In some embodiments, the bottom red LED light emitting layer 112 is bonded to the substrate 104 through a metal bonding layer 108. The metal bonding layer 108 may be disposed on the substrate 104. In one approach, a metal bonding layer 108 is grown on the substrate 104. In some embodiments, the metal bonding layer 108 is electrically connected to both the driver circuit 106 on the substrate 104 and the red LED light emitting layer 112 above the metal bonding layer 108, acting like a P-electrode. In some embodiments, the thickness of the metal bonding layer 108 is about 0.1 micron to about 3 microns. In a preferred embodiment, the thickness of a metal bonding layer 108 is about 0.3 μm. The metal bonding layer 108 may include ohmic contact layers, and metal bonding layers. In some instances, two metal layers are included in the metal bonding layer 108. One of the metal layers is deposited the layer above the metal bonding layer within the LED device 100. A counterpart bonding metal layer is also deposited on the substrate 104. In some embodiments, compositions for the metal bonding layer 108 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bond the two layers together. Eutectic bonding, thermal compression bonding, and transient liquid phase (TLP) bonding are example techniques that may be used.

In some embodiments, the metal bonding layer 108 can also be used as a reflector to reflect light emitted from the LED structures above. In some embodiments, a conductive layer 110 for electrode connection is formed at the bottom of the red LED light emitting layer 112. In some embodiments, the conductive layer 110 is a conductive transparent layer 110 transparent to the light emitted from the LED device 100, such as an Indium tin oxide (ITO) layer, that is formed between the red LED light emitting layer 112 and the metal bonding layer 108 to improve conductivity and transparency. In some embodiments, as shown in FIG. 1A and not shown in FIG. 1B, the red LED structure has a P-electrode contact pad 150 electrically connected to the red LED light emitting layer 112. In some embodiments, the P-electrode contact pad 150 is connected to the conductive transparent layer 110. In some embodiments, a conductive layer 114 for electrode connection is formed at the top of the red LED light emitting layer 112. In some embodiments, the conductive layer 114 is a conductive transparent layer 114, such as an ITO layer, that is formed between the red LED light emitting layer 112 and an N-electrode contact pad 116 to improve conductivity and transparency.

In some embodiments, the red LED light emitting layer 112 has an extended portion 164 relative to the layers above it at one side of the red LED light emitting layer 112. In some embodiments, the extended portion 164 is extended with the conductive transparent layers 110 and 114. In some embodiments, the extended portion 164 is connected to the N-electrode contact pad 116 through the extended portion of the conductive transparent layer 114 above the extended portion 164.

In one approach, the red LED light emitting layer 112 is grown on a separate substrate (referred to as the epitaxy substrate). The epitaxy substrate is then removed after bonding, for example, by a laser lift-off process or wet chemical etching, leaving the structure shown in FIG. 1B.

In some embodiments, the red LED light emitting layer 112 is for forming red micro LEDs. Examples of a red LED light emitting layer include III-V nitride, III-V arsenide, III-V phosphide, and III-V antimonide epitaxial structures. In some instances, films within the red LED light emitting layer 112 can include the layers of P-type GaP/P-type AlGaInP light-emitting layer/AlGaInP/N-type AlGaInP/N-type GaAs. In some embodiments, P type layer is generally Mg-doped, and N-type layer is generally Si-doped. In some examples, the thickness of the red LED light emitting layer is about 0.1 micron to about 5 microns. In a preferred embodiment, the thickness of the red LED light emitting layer is about 0.3 micron.

In some embodiments, the red LED structure includes the metal bonding layer 108, the conductive transparent layer 110, the red LED light emitting layer 112, the conductive transparent layer 114, and the N-electrode contact pad 116. In some embodiments, the red LED structure is formed within a planarized insulation layer 154, for example, Silicon Dioxide (SiO2) layer. In some embodiments, the planarized insulation layer 154 covers the whole red LED structure. In some embodiments, the whole red LED structure is embedded within the planarized insulation layer 154. In some embodiments, the surface of the planarized insulation layer 154 is smoothed or planarized by the method of chemical mechanical polishing.

In some embodiments, the planarized layer, such as 154, is transparent to the light emitted from the micro LED 100. In some embodiments, the planarized layer is made of dielectric materials such as solid inorganic materials or plastic materials. In some embodiments, the solid inorganic materials include SiO2, Al2O3, Si3N4, Phosphosilicate glass (PSG), or Borophosphosilicate glass (BPSG), or any combination thereof. In some embodiments, the plastic materials include polymers such as SU-8, PermiNex, Benzocyclobutene (BCB), or transparent plastic (resin) including spin-on glass (SOG), or bonding adhesive Micro Resist BCL-1200, or any combination thereof. In some embodiments, the planarized layer can facilitate the light emitted from the micro LED 100 to pass through. In some embodiments, the planarized layers such as 154, 168, and 162 have the same composition as the bonding layer such as 156 and 160. In some embodiments, the planarized layers such as 154, 168, and 162 have different composition than the bonding layer such as 156 and 160.

In some embodiments, a via or through hole is formed within the planarized insulation layer 154 to accommodate the P-electrode contact components 122 and 124 for the green LED structure. The P-electrode contact components 122 and 124 are connected to a driver circuit 106.

In some embodiments, a transparent bonding layer 156, is used to bond the red LED structure and the green LED structure together. In some embodiments, the transparent bonding layer 156 is made of dielectric materials such as solid inorganic materials or plastic materials. In some embodiments, the solid inorganic materials include SiO2, Al2O3, Si3N4, Phosphosilicate glass (PSG), or Borophosphosilicate glass (BPSG), or any combination thereof. In some embodiments, the plastic materials include polymers such as SU-8, PermiNex, Benzocyclobutene (BCB), or transparent plastic (resin) including spin-on glass (SOG), or bonding adhesive Micro Resist BCL-1200, or any combination thereof. In some embodiments, the transparent bonding layers can facilitate the light emitted from the layers below the bonding layers to pass through. The thickness of the transparent bonding layer 156 is the same or similar to the thickness of the metal bonding layer 108 as described above. In some embodiments, the transparent bonding layer 156 can also be used as a reflector to reflect light emitted from the LED structures above.

In some embodiments, a conductive layer 128 for electrode connection is formed at the bottom of the green LED light emitting layer 130. In some embodiments, the conductive layer 128 is a conductive transparent layer 128, such as an ITO layer, that is formed between the green LED light emitting layer 130 and the transparent bonding layer 156 to improve conductivity and transparency.

In some embodiments, as shown in both FIG. 1A and in FIG. 1B, the green LED structures has a P-electrode contact pad 126 electrically connected to the green LED light emitting layer 130. In some embodiments, the P-electrode contact pad 126 is connected to the conductive transparent layer 128. In some embodiments, the P-electrode contact pad 126 is also connected to the P-electrode contact components 122 and 124 within the planarized insulation layer 154 through a portion of the P-electrode contact pad 126 within the transparent bonding layer 156. In some embodiments, the P-electrode contact component 122 has a cylindrical shape. In some embodiments, the P-electrode contact component 124 has a funnel like shape with the top side narrow that matches the width of the component 122 and the bottom side wide, and this shape is to support the component 122 above it. In some embodiments, a conductive layer 132 for electrode connection is formed at the top of the green LED light emitting layer 130. In some embodiments, the conductive layer 132 is a conductive transparent layer 132, such as an ITO layer, that is formed between the green LED light emitting layer 130 and an N-electrode contact pad 120 to improve conductivity and transparency. In some embodiments, shown in both FIG. 1A and in FIG. 1B, the green LED structure has the N-electrode contact pad 120 electrically connected to the green LED light emitting layer 130. In some embodiments, the N-electrode contact pad 120 is connected to the conductive transparent layer 132. In some embodiments, the N-electrode contact pad 120 of the green LED structure is also electrically connected to the N-electrode contact pad 116 of the red LED structure through an N-electrode contact component 118 within the transparent bonding layer 156. In some embodiments, vias or through holes are formed within the transparent bonding layer 156 to accommodate a portion of the P-electrode contact pad 126 and the N-electrode contact component 118.

In some embodiments, the green LED light emitting layer 130 has an extended portion 166 relative to the layers above it at one side of the green LED light emitting layer 130. In some embodiments, the extended portion 166 is extended with the conductive transparent layers 128 and 132. In some embodiments, the extended portion 166 is connected to the N-electrode contact pad 120 through the extended portion of the conductive transparent layer 132 above the extended portion 166.

In some embodiments, the lateral dimension of the green LED light emitting layer 130 is substantially the same as the lateral dimension of the red LED light emitting layer 112, especially for the effective light emitting area.

In one approach, the green LED light emitting layer 130 is grown on a separate substrate (referred to as the epitaxy substrate). The epitaxy substrate is then removed after bonding, for example, by a laser lift-off process or wet chemical etching, leaving the structure shown in FIG. 1B.

In some embodiments, the green LED light emitting layer 130 is for forming green micro LEDs. Examples of a green LED light emitting layer include III-V nitride, III-V arsenide, III-V phosphide, and III-V antimonide epitaxial structures. In some instances, films within the green LED light emitting layer 130 can include the layers of P-type GaN/InGaN light-emitting layer/N-type GaN. In some embodiments, P type is generally Mg-doped, and N-type is generally Si-doped. In some examples, the thickness of the green LED light emitting layer is about 0.1 micron to about 5 microns. In a preferred embodiment, the thickness of the green LED light emitting layer is about 0.3 micron.

In some embodiments, the green LED structure includes the conductive transparent layer 128, the green LED light emitting layer 130, the conductive transparent layer 132, the N-electrode contact pad 120. In some embodiments, the green LED structure is formed within a planarized insulation layer 158. In some embodiments, the planarized insulation layer 158 covers the whole green LED structure and a portion of the P-electrode contact pad 126. In some embodiments, the whole green LED structure is embedded within the planarized insulation layer 158. In some embodiments, both surfaces of the planarized insulation layer 158 is smoothed or planarized by the method of chemical mechanical polishing.

In some embodiments, the lateral dimension of the green LED structure is substantially the same as the lateral dimension of the red LED structure. In some embodiments, the first LED structure, e.g., the red LED structure and the second LED structure, e.g. the green LED structure, have the same central axis when the extended portions, such as 164 and 166, are excluded. In some embodiments, the first LED structure and the second LED structure are aligned along the same central axis when the extended portions, such as 164 and 166, are excluded.

In some embodiments, a transparent bonding layer 160 is used to bond the green LED structure and the blue LED structure together. In some embodiments, the transparent bonding layer 156 is made of dielectric materials such as solid inorganic materials or plastic materials. In some embodiments, the solid inorganic materials include SiO2, Al2O3, Si3N4, PSG, or BPSG, or any combination thereof. In some embodiments, the plastic materials include polymers such as SU-8, PermiNex, BCB, or transparent plastic (resin) including SOG, or bonding adhesive Micro Resist BCL-1200, or any combination thereof. In some embodiments, the transparent bonding layers can facilitate the light emitted from the layers below the bonding layers to pass through. The thickness of the transparent bonding layer 160 is the same or similar to the thickness of the metal bonding layer 108 as described above. In some embodiments, the transparent bonding layer 160 can also be used as a reflector to reflect light emitted from the LED structure above.

In some embodiments, a conductive layer 134 for electrode connection is formed at the bottom of the blue LED light emitting layer 136. In some embodiments, the conductive layer 134 is a conductive transparent layer 134, such as an ITO layer, that is formed between the blue LED light emitting layer 136 and the transparent bonding layer 160 to improve conductivity and transparency. In some embodiments, as shown in FIG. 1A and not shown in FIG. 1B, the blue LED structure has a P-electrode contact pad 152 electrically connected to the blue LED light emitting layer 136. In some embodiments, the P-electrode contact pad 152 is connected to the conductive transparent layer 134. In some embodiments, the P-electrode contact pad 152 is also connected to some P-electrode contact components (not shown in FIGS. 1A and 1B), similar to 122 and 124, within the planarized insulation layers 154 and 158, and within the transparent bonding layers 156 and 160. Those P-electrode contact components are connected to a driver circuit 106.

In some embodiments, a conductive layer 138 for electrode connection is formed at the top of the blue LED light emitting layer 136. In some embodiments, the conductive layer 138 is a conductive transparent layer 138, such as an ITO layer, that is formed between the blue LED light emitting layer 136 and an N-electrode 140 to improve conductivity and transparency. In some embodiments, as shown in FIG. 1B, the N-electrode 140 has the N-electrode contact pads 142 and 144 electrically connected to the blue LED light emitting layer 136 through the N-electrode 140 and the conductive transparent layer 138. In some embodiments, the N-electrode 140 is also electrically connected to the N-electrode contact pad 120 of the green LED structure. In some embodiments, the N-electrode 140 is made of materials such as graphene, ITO, AZO, or FTO, or any combinations thereof.

In some embodiments, the lateral dimension of the blue LED light emitting layer 136 is substantially the same as the lateral dimension of the green LED light emitting layer 130, especially for the effective light emitting area.

In one approach, the blue LED light emitting layer 136 is grown on a separate substrate (referred to as the epitaxy substrate). The epitaxy substrate is then removed after bonding, for example, by a laser lift-off process or wet chemical etching, leaving the structure shown in FIG. 1B.

In some embodiments, the blue LED light emitting layer 136 is for forming blue micro LEDs. Examples of a blue LED light emitting layer include III-V nitride, III-V arsenide, III-V phosphide, and III-V antimonide epitaxial structures. In some instances, films within the blue LED light emitting layer 136 can include the layers of P-type GaN/InGaN light-emitting layer/N-type GaN. In some embodiments, P type is generally Mg-doped, and N-type is generally Si-doped. In some examples, the thickness of the blue LED light emitting layer is about 0.1 micron to about 5 microns. In a preferred embodiment, the thickness of the blue LED light emitting layer is about 0.3 micron.

In some embodiments, the blue LED structure includes the conductive transparent layer 134, the blue LED light emitting layer 136, and the conductive transparent layer 138. In some embodiments, the blue LED structure is formed within a planarized insulation layer 162. In some embodiments, the planarized insulation layer 162 covers the whole blue LED structure. In some embodiments, the whole blue LED structure is embedded within the planarized insulation layer 162. In some embodiments, the bottom surface of the planarized insulation layer 162 is smoothed or planarized by the method of chemical mechanical polishing.

In some embodiments, vias or through holes are formed within the planarized insulation layer 162 and the transparent bonding layer 160 to accommodate a portion of the N-electrode 140 to connect to the N-electrode contact pad 120 of the green LED structure.

In some embodiments, the N-electrode 140 covers the top of the planarized insulation layer 162. In some embodiments, the N-electrode 140 covers the top of the tri-color LED device 100. In some embodiments, the N-electrode 140 connects to an N-electrode in an adjacent tri-color LED device (not shown in FIG. 1A or 1B) via the N-electrode contact pads 142 and 144, and therefore serves as a common electrode.

In some embodiments, the lateral dimension of the blue LED structure is substantially the same as the lateral dimension of the green LED structure. In some embodiments, the second LED structure, e.g., the green LED structure and the third LED structure, e.g. the blue LED structure, have the same central axis when the extended portions, such as 166, are excluded. In some embodiments, the second LED structure and the third LED structure are aligned along the same central axis when the extended portions, such as 166, are excluded.

In some embodiments, the thickness of each of the conductive layers 110, 114, 128, 132, 134, and 138 is about 0.01 micron to about 1 micron. In some instances, before any bonding process with the next epitaxial layer, each of the conductive layers 110, 114, 128, 132, 134, and 138 is deposited on the respective corresponding epitaxial layer commonly by vapor deposition, for example, electron beam evaporation or sputtering deposition. In some examples, conductive layers are used to maintain a good conductivity for electrode connection while in some instances, improving optical properties of the LED devices, such as reflectivity or transparency.

In some embodiments, in order to improve the light emission efficiency from the tri-color LED device 100, optical isolation structures such as 146 and 148 are formed along the sidewall of the tri-color LED device 100. In some embodiments, the optical isolation structures 146 and 148 are made from dielectric materials such as SiO2.

As shown in FIG. 1A from the top view, in some embodiments, the tri-color LED device 100 has a circular shape. In some embodiments, the optical isolation structures, such as 146 and 148, are connected as one piece and formed as a circular sidewall around the tri-color LED device 100. In some embodiments, the optical isolation structures are formed as a reflective cup as described in further detail below. In some embodiments, the three stacked LED structures within the tri-color LED device 100 are also in circular shapes.

As shown in FIG. 1B, in some embodiments, the red LED light emitting layer 112, the green LED light emitting layer 130 and the blue LED light emitting layer 136 has oblique side surfaces. As used here, the oblique side surface may refer to a surface that is not perpendicular to the top or bottom surfaces of the respective LED light emitting layer. In some embodiments, the angle between the oblique sidewall and the bottom surface of the respective LED light emitting layer is less than 90 degrees. In some embodiments, the metal bonding layer 108 also has an oblique side surface. The oblique side surfaces may enhance easy connections for different connectors to the LED light emitting layers, prevent disconnections of those connectors because of sharp angles, and enhance the overall stability of the device.

In some embodiments, the light transmission efficiency of the multi-color LED device changes as the angle of the oblique side surface of the LED light emitting layers relative to a normal line to the surface of the substrate 104 changes. In some embodiments, the light transmission efficiency of the multi-color LED device increases as the angle of the oblique side surface of the LED light emitting layers relative to a normal line to the surface of the substrate 104 increases. For example, when the angle of the side surface of the LED light emitting layers relative to the normal line to the surface of the substrate 104 is ±5 degrees and when the optical isolation structures such as 146, and/or 148, are not reflective cups as described below, the light emission efficiency of a multi-color LED device is 0.32%. For example, when the angle of the side surface of the LED light emitting layers relative to the normal line to the surface of the substrate 104 is ±15 degrees and when the optical isolation structures such as 146, and/or 148, are not reflective cups as described below, the light emission efficiency of a multi-color LED device is 2.7%. For example, when the angle of the side surface of the LED light emitting layers relative to the normal line to the surface of the substrate 104 is at (for example, when the light emitting layer is tilted) or very close to ±90 degrees and when the optical isolation structures such as 146, and/or 148, are not reflective cups as described below, the light emission efficiency of a multi-color LED device is equal to or very close to 56.4%.

In contrast, the implementation of reflective cup structures, as described in further detail below, improves the light transmission efficiency of the multi-color LED device. For example, when the angle of the side surface of the LED light emitting layers relative to the normal line to the surface of the substrate 104 is ±5 degrees and when the optical isolation structures such as 146, and/or 148, are reflective cups as described below, the light emission efficiency of a multi-color LED device is 0.65%, that is an increase of 104.6% compared with the LED device without a reflective cup. For example, when the angle of the side surface of the LED light emitting layers relative to the normal line to the surface of the substrate 104 is ±15 degrees and when the optical isolation structures such as 146, and/or 148, are reflective cups as described below, the light emission efficiency of a multi-color LED device is 6.65%, that is an increase of 144.4% compared with the LED device without a reflective cup. For example, when the angle of the side surface of the LED light emitting layers relative to the normal line to the surface of the substrate 104 is at (for example, when the light emitting layer is tilted) or very close to ±90 degrees and when the optical isolation structures such as 146, and/or 148, are reflective cups as described below, the light emission efficiency of a multi-color LED device is equal to or very close to 66.65%, that is an increase of 18.4% compared with the LED device without a reflective cup.

In some embodiments, the size of the red LED light emitting layer 112, the green LED light emitting layer 130 and the blue LED light emitting layer 136 are similar. For example, the surface areas of the red LED light emitting layer 112, the green LED light emitting layer 130 and the blue LED light emitting layer 136 are substantially the same, especially for the effective light emitting areas.

Figure 2:
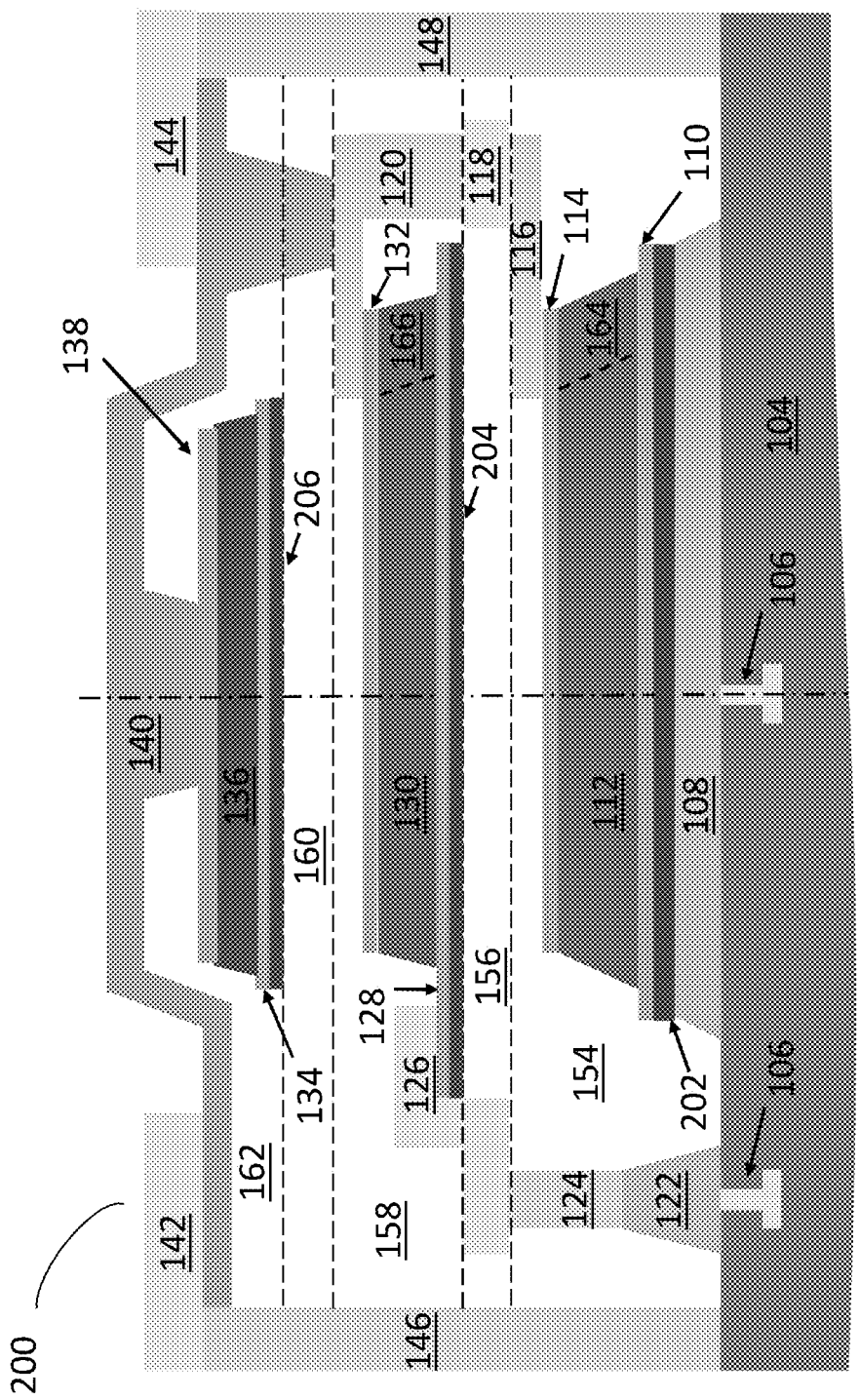
FIG. 2 is a cross-sectional view of a single pixel tri-color LED device 200 along the diagonal line 102 in FIG. 1A with reflective layers, in accordance with some embodiments.

FIG. 2 is a cross-sectional view of a single pixel tri-color LED device 200 along the diagonal line 102 in FIG. 1A with reflective layers, in accordance with some embodiments. In some embodiments, the single pixel tri-color LED device 200 has similar structures as the single pixel tri-color LED device 100 shown in FIG. 1A and FIG. 1B with the addition of the reflective layers formed below and between the LED light emitting layers to improve light emission efficiency. In some embodiments, a reflective layer 202 is formed between the metal bonding layer 108 and the red LED light emitting layer 112. In some embodiments, the reflective layer 202 is formed between the metal bonding layer 108 and the conductive transparent layer 110 when the conductive transparent layer 110 is present. In some embodiments, a reflective layer 204 is formed between the transparent bonding layer 156 and the green LED light emitting layer 130. In some embodiments, the reflective layer 204 is formed between the transparent bonding layer 156 and the conductive transparent layer 128 when the conductive transparent layer 128 is present. In some embodiments, a reflective layer 206 is formed between the transparent bonding layer 160 and the blue LED light emitting layer 136. In some embodiments, the reflective layer 206 is formed between the transparent bonding layer 160 and the conductive transparent layer 134 when the conductive transparent layer 134 is present.

In some embodiments, the materials of the reflective layers 202, 204 and 206 have a high reflectivity, especially to the light emitted by the single pixel tri-color LED device 200. For example, the reflectivity of the reflective layers 202, 204 and 206 is above 60%. In another example, the reflectivity of the reflective layers 202, 204 and 206 is above 70%. In yet another example, the reflectivity of the reflective layers 202, 204 and 206 is above 80%.

In some embodiments, the material of the reflective layers 202, 204 and 206 is metal selected from one or more of Rh, Al, Ag, and Au. In some embodiments, any one of the reflective layers 202, 204 and 206 can include at least two sublayers with different refractive index. Each of the sublayers also has a high reflectivity such as above 60%, 70% or 80%.

In some embodiments, each of the reflective layers, such as 202, 204 and 206, is coated on each of the light emitting layers such as 112, 130 and 136, or the conductive transparent layers 110, 128 and 134, when the conductive transparent layers are included before bonding. In some instances, the thickness of each of the reflective layers such as 202, 204 and 206, is about 2 nanometers (nm) to about 5 microns. In some embodiments, the thickness of each of the reflective layers such as 202, 204 and 206, is equal to or below 1 micron. In some preferred embodiments, the thickness of each of the reflective layers such as 202, 204 and 206, is about 5 nm to 10 nm.

In some embodiments, any one of the reflective layers, such as 202, 204 and 206, includes a distributed Bragg reflector (DBR) structure. For example, any one of the reflective layers, such as 202, 204 and 206, is formed from multiple layers of alternating or different materials with varying refractive index. In some instances, each layer boundary of the DBR structure causes a partial reflection of an optical wave. The reflective layers, such as 202, 204 and 206, can be used to reflect some selected wavelengths, for example, reflective layer 202 for red light, the reflective layer 204 for green light, and reflective layer 206 for blue light. In some embodiments, any one of the reflective layers, such as 202, 204 and 206, is made of multiple layers, e.g., at least two layers, of SiO2 and Ti3O5 respectively. By varying the thicknesses and numbers of layers of SiO2 and Ti3O5 respectively, selective reflection or transmission of light at different wavelengths can be formed.

In some embodiments, any one of the reflective layers, such as 202, 204 and 206, further includes a transparent layer on one of the high reflectivity sub-layers. For example, the transparent layer, preferably formed on either side of the reflective layer, such as 202, 204 and 206, is selected from one or more of ITO and SiO2.

In some embodiments, the reflective layer 202 for a red light LED includes multiple layers of Au or/and Indium Tin Oxide (ITO).

In some embodiments, the reflective layer 202 for a red light LED structure has a low absorbance (for example, equal to or less than 25%) of the light generated by different layers of the tri-color LED device 200. In some embodiments, the reflective layer 202 for a red light LED structure has a high reflectance (for example, equal to or more than 75%) of the light generated above the current reflective layer, for example, the red light, the green light and the blue light.

In one example, the following DBR structure shown in table 1 is used to reflect green light from a green light LED:

TABLE 1

DBR layer structure for a green light LED reflective layer.

| Layer composition | Layer thickness (in nanometer) |
| --- | --- |
| SiO2 | 1000 |
| TiO2 | 109.54 |
| SiO2 | 318.48 |
| TiO2 | 64.95 |
| SiO2 | 106.07 |
| TiO2 | 245.76 |
| SiO2 | 137.08 |
| TiO2 | 65.14 |
| SiO2 | 106.77 |
| TiO2 | 338.95 |
| SiO2 | 37.27 |
| TiO2 | 12.41 |
| SiO2 | 352.18 |
| TiO2 | 70.83 |
| SiO2 | 229.25 |
| ITO | 20 |

In some embodiments, the reflective layer 204 for a green light LED structure has a low absorbance (for example, equal to or less than 25%) of the light generated by different layers of the tri-color LED device 200. In some embodiments, the reflective layer 204 for a green light LED structure has a high reflectance (for example, equal to or more than 75%) of the light generated above the current reflective layer, for example, the green light and the blue light.

In one example, the following DBR structure shown in table 2 is used to reflect blue light from a blue light LED:

TABLE 2

DBR layer structure for a blue light LED reflective layer.

| Layer composition | Layer thickness (in nanometer) |
| --- | --- |
| SiO2 | 1000 |
| SiO2 | 183.36 |
| TiO2 | 96 |
| SiO2 | 84.65 |
| TiO2 | 51.37 |
| SiO2 | 332.37 |
| TiO2 | 79.95 |
| SiO2 | 423.13 |
| TiO2 | 52.99 |
| SiO2 | 35.87 |
| TiO2 | 235.03 |
| SiO2 | 253.67 |
| TiO2 | 64.38 |
| SiO2 | 336.08 |
| ITO | 20 |

In some embodiments, the reflective layer 206 for a blue light LED structure has a low absorbance (for example, equal to or less than 25%) of the light generated by different layers of the tri-color LED device 200. In some embodiments, the reflective layer 206 for a blue light LED structure has a high reflectance (for example, equal to or more than 75%) of the light generated above the current reflective layer, for example, the blue light.

In some embodiments, through dry etching and wet etching, a tri-color LED structure is formed and the axes of LED structures of different colors are aligned with one another vertically. In some embodiments, the LED structures of different colors share the same axis.

In some embodiments, each of the LED structures of different colors form a pyramid like shape or a trapezoidal cross-sectional shape within its respective planarized insulation structure. Each layer has a narrower width or smaller area compared to a layer beneath it. In this instance, the width or area is measured by the dimensions of a plane parallel to the surface of the substrate 104. In some embodiments, especially when planarized layered structures are used, each of the LED structures of different colors has substantially the same lateral dimension compared with other LED structures. When each of the LED structures have substantially the same area, the light emitting efficiency from the whole LED device is improved.

In some embodiments, especially when planarized layered structures are not used and each of the LED structures of different colors are bonded together by bonding layers that only cover the area of the LED structures without extension beyond the area of the LED structures, the whole multi-color LED device, forms a pyramid (or inverted cone) like shape or a trapezoidal cross-sectional shape (not shown in FIGS. 1A, 1B and 2). In some embodiments, the lateral dimension of the bottom LED structure, for example, the red LED structure, can be the longest, and the lateral dimension of the top LED structure, for example, the blue LED structure, can be the shortest. A pyramid like shape can be formed naturally when each of the layers within the LED device is etched and patterned from bottom up. A pyramid like structure can improve the electronic connections between the individual LED structures and to the electrodes, and simplify the fabrication process. For example, the electrode connections are exposed in each layer for easy connection.

In some embodiments, the bottom layer such as the metal bonding layer 108 has a lateral dimension of about 1 micron to about 500 microns. In a preferred embodiment, the lateral dimension of the metal bonding layer 108 at the bottom of the multi-color LED device is about 1.75 microns. In some embodiments, the vertical height of the multi-color LED device is about 1 micron to about 500 microns. In a preferred embodiment, the vertical height of the multi-color LED device is about 1.9 microns. In a preferred embodiment, the lateral dimension of the conductive layer 138 at the top of the multi-color LED device is about 1.0 micron.

In some embodiments, the aspect ratio of a cross section of a layer of the tri-color LED device remains substantially the same when the lateral dimension of the same layer varies. For example, when the lateral dimension of a patterned epitaxial layer is 5 microns, the thickness of the patterned epitaxial layer is less than a micron. In another example, when the lateral dimension of the same patterned epitaxial layer increases, the thickness of the same patterned epitaxial layer increases accordingly to maintain the same aspect ratio. In some embodiments, the aspect ratio of the cross-section of the epitaxial layers and other layers is less than 1/5 in thickness/width.

The shape of the LED device is not limited and in some other embodiments, the cross-sectional shape of the tri-color LED device can take the form of other shapes, for example, a reverse trapezoid, a semi-oval, a rectangle, a parallelogram, a triangle, or a hexagon, etc.

In some embodiments, with the planarized insulation layers, such as 154, 158 and 162, covering each of the LED structures of different colors, the fabrication process for the single pixel tri-color LED device is simplified and the light emission efficiency of the single pixel tri-color LED device is improved. For example, each of the LED structures of different colors can form on its own including the conductive layers, the reflective layers and the electrode contact pads and their related connections within the respective planarized insulation layer first, then the LED structures are bonded together with the respective bonding layer.

In contrast, in a process to fabricate a directly stacked tri-color LED device without planarization, where the LED structures of different colors are bonded together with some bonding layers directly, the single pixel tri-color LED device may be a pyramid (or inversed cone) like shape or a trapezoidal cross-sectional shape as a result of the layer by layer patterning (and/or etching). Thus, the effective light emitting area for an LED structure at the bottom of the stack of the single pixel tri-color LED device is the biggest while the effective light emitting area for an LED structure at the top of the stack is the smallest. The unevenness of the light emitting regions among the multiple LED structures within the LED device can degrade its light emission efficiency. While with the planarized layered structure, since each of the LED structures is fabricated within its own planarized insulation layer, the single pixel tri-color LED device are not limited to a pyramid structure as described above. Instead, the effective light emitting area of the different LED structures within the single pixel tri-color LED device can be adjusted according to the design. In some instance, the horizontal effective light emitting areas of the different LED structures within the single pixel tri-color LED device are substantially the same to improve the light emission efficiency and easiness for electrical connections. In some cases, compared with a similar tri-color LED structure without planarization, the planarized tri-color LED structure can improve light emission efficiency by at least 5%, at least 10%, or sometimes, at least 20%.

In some embodiments, when a respective epitaxy substrate is used to grow each of the LED light emitting layers as described above, an insulation layer can be deposited on each of the epitaxy substrate covering the corresponding LED light emitting layers and other layers such as the conductive layers and reflective layers first. A planarization process is then followed to even the surface of the insulation layer that embeds the respective LED structure. Vias for electrical connections are also formed within the planarized layers before bonding.

In another embodiment, the layers of an LED structure including the bonding layer can be formed on a planarized insulation layer that already embeds a formed LED structure directly, followed by the formation of the planarized insulation layer to cover the current LED structure. Vias for electrical connections are also formed within the planarized layer before the next LED structure is formed above the current LED structure.

Compared with some other processes without planarized insulation layers, where the bonding layer contacts the top or bottom of the LED structure directly in order to form a device, the bonding layer can contact with the planarized insulation layer without touching the LED structures. Thus the features and layers within each of the planarized LED structures are better protected and less susceptible to the outside destruction force. Furthermore, the planarized surface can improve the light transmission efficiency by reducing deflection from an uneven surface.

In some embodiments, the top conductive layer 138 above the third LED light emitting layer 136 is patterned using photolithography and etching. In some instances, the etching method used to form the pattern is dry etching, for example, inductively coupled plasma (ICP) etching, or wet etching with an ITO etching solution. In some embodiments, the same patterning methods can apply to all the other conductive layers, including layers 110, 114, 128, 132, 134, and 138 within the tri-color LED device 100 or 200.

In some embodiments, the blue LED light emitting layer 136 and the green LED light emitting layer 130 are patterned using photolithography and etching. In some instances, the etching method used to form the pattern is dry etching, for example, inductively coupled plasma (ICP) etching, with Cl2 and BCl3 etching gases.

In some embodiments, the transparent bonding layers including 160 and 156 are patterned using photolithography and etching. In some instances, the etching method used to form the pattern is dry etching, for example, inductively coupled plasma (ICP) etching, with CF4 and O2 etching gases.

In some embodiments, the reflective layers including 202, 204 and 206 are patterned using photolithography and etching. In some instances, the etching method used to form the pattern for the reflective layers especially the DBR layers is dry etching, for example, inductively coupled plasma (ICP) etching, with CF4 and O2 etching gases, or ion beam etching (IBE) with Ar gas.

In some embodiments, the red LED light emitting layer 112 is patterned using photolithography and etching. In some instances, the etching method used to form the pattern is dry etching, for example, inductively coupled plasma (ICP) etching, with Cl2 and HBr etching gases.

In some embodiments, the metal bonding layer 108 is patterned using photolithography and etching. In some instances, the etching method used to form the pattern is dry etching, for example, inductively coupled plasma (ICP) etching, with Cl2/BCl3/Ar etching gases, or ion beam etching (IBE) with Ar gas.

In some embodiments, after each of the LED device structures is patterned, an insulation layer, such as 154, 158, 162, is deposited on the surface of the patterned LED structure including all the patterned layers, side walls, and the exposed substrate. In some embodiments, the insulation layer is made of SiO2 and/or Si3N4. In some embodiments, the insulation layer is made of TiO2. In some embodiments, the insulation layer is formed with composition similar to SiO2 after curing a layer such as SOG at a high temperature. In some embodiments, the insulation layer is made of a material that has a similar thermal coefficient of the layers underneath the insulation layer. The surface of the insulation layer is then smoothed or planarized by a relevant method understood by a person of ordinary skill in the art, such as chemical mechanical polishing.

In some embodiments, the insulation layer after planarization is patterned to expose the electrode contact area using photolithography and etching. In some instances, the etching method used to form the pattern is dry etching, for example, inductively coupled plasma (ICP) etching, with CF4 and O2.

In some embodiments, P-electrode or anode metal pads are vapor deposited, or by other deposition method, on a suitable location of the patterned LED structure, such as on one side and/or in vias within the planarized insulation layer, to electrically connect the red LED structure, the green LED structure, and the blue LED structure.

In some embodiments, separate N-electrode or cathode metal pads are vapor deposited, or by other deposition method, on a suitable location of the patterned LED structure, such as on one side/top and/or in vias within the planarized insulation layer, to electrically connect the red LED structure, the green LED structure, and the blue LED structure.

In some embodiments, the external quantum efficiency for the red LED structure within the tri-color LED device is about 0.5-5%. In some embodiments, the external quantum efficiency for the green LED structure within the tri-color LED device is about 2-10%. In some embodiments, the external quantum efficiency for the blue LED structure within the tri-color LED device is about 5-15%. In some embodiments, the external quantum efficiency of the LED structure for each color is measured when the effects of all the related layers in addition to the LED structure such as reflective layers, bonding layers, ITO layers, and insulation layers are counted.

In some embodiments, the external quantum efficiency for the tri-color LED device 100 is about 20% or above. In some embodiments, the external quantum efficiency of the multi-color LED device is measured when the effects of all the layers in addition to the LED structure layers such as reflective layers, bonding layers, ITO layers, and insulation layers are counted.

Figure 3A:
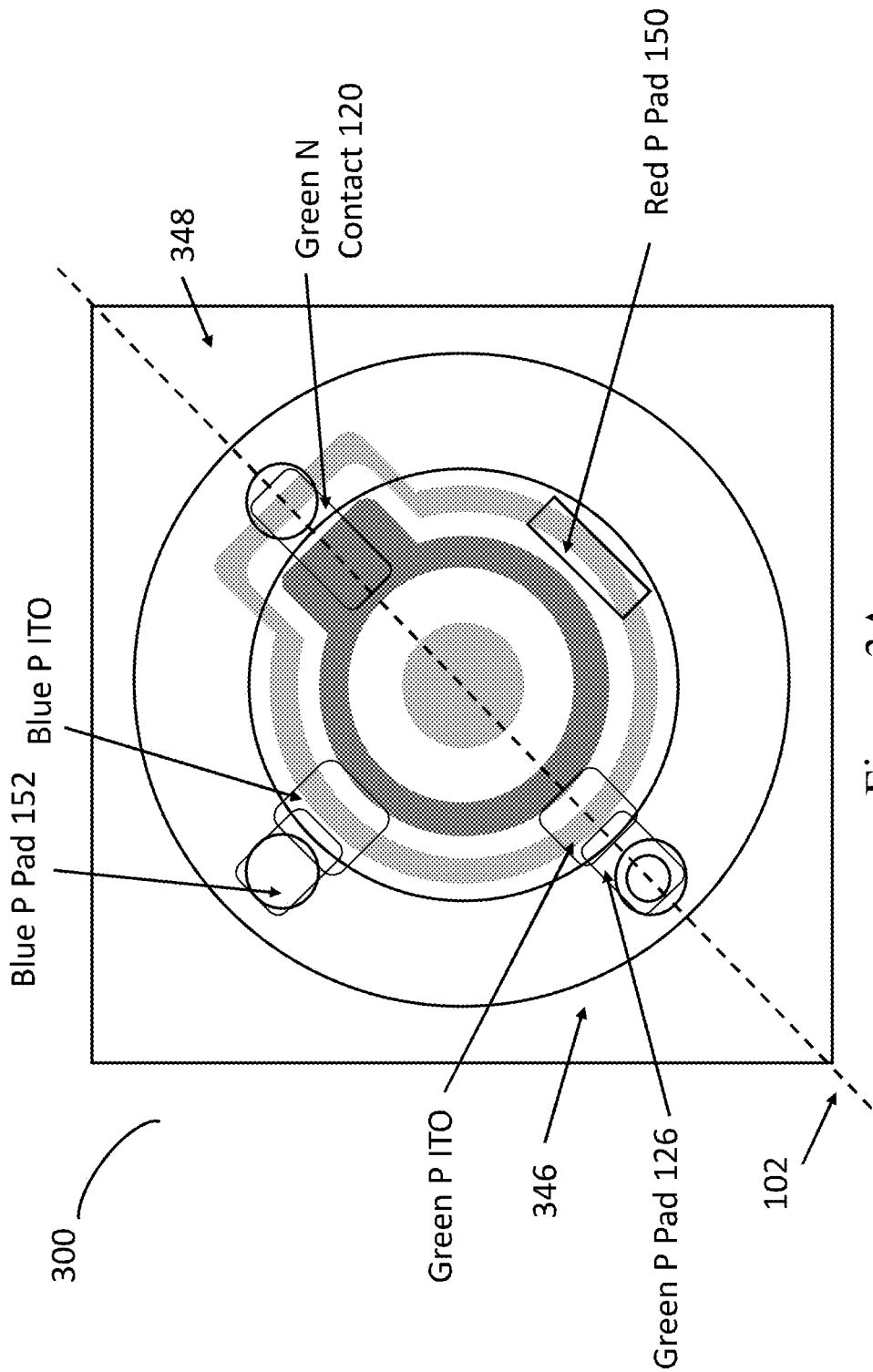
FIG. 3A is a top view of a single pixel tri-color LED device 300 with reflective cup structures around the device, in accordance with some embodiments.

FIG. 3A is a top view of a single pixel tri-color LED device 300 with reflective cup structures around the device, in accordance with some embodiments.

Figure 3B:
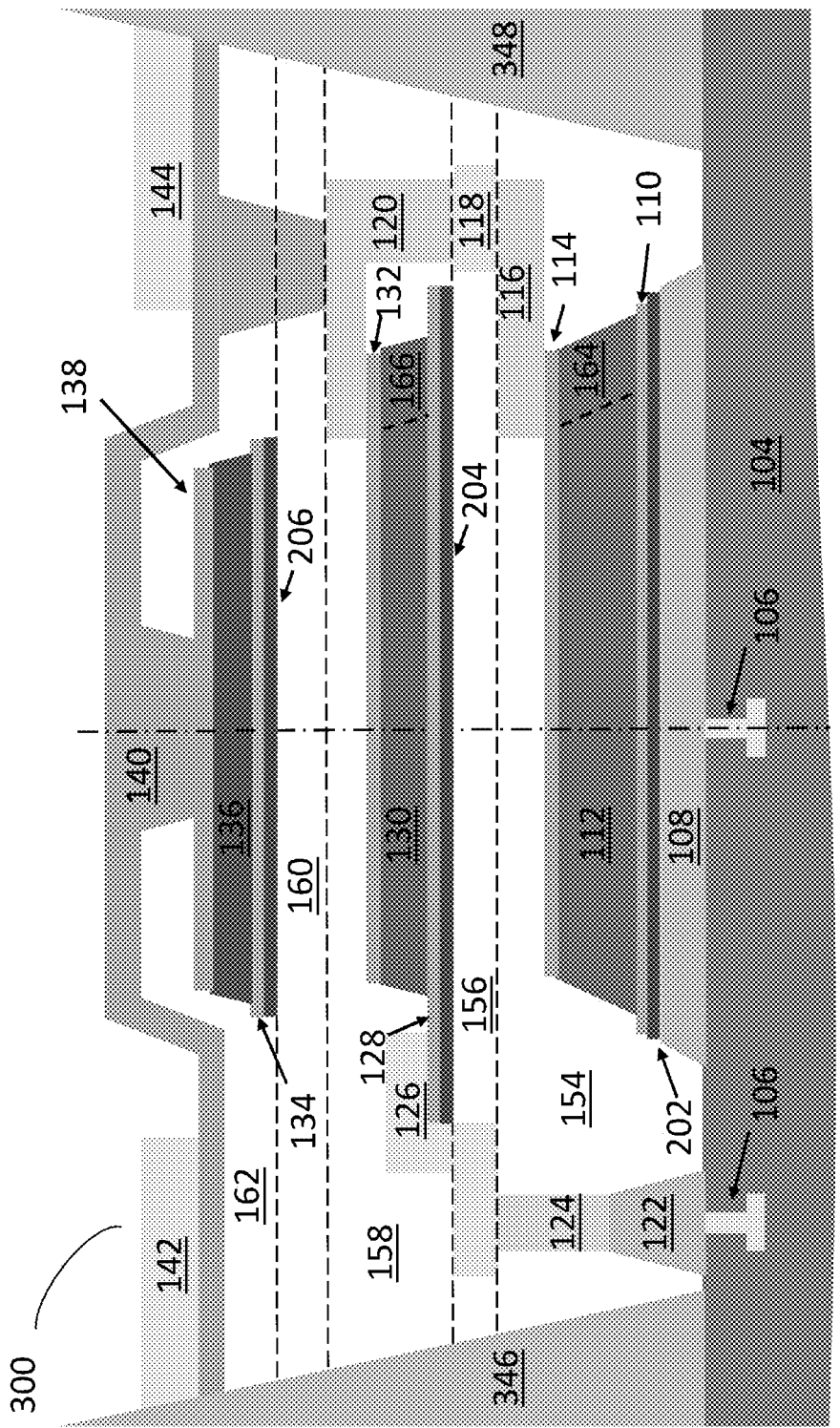
FIG. 3B is a cross-sectional view of a single pixel tri-color LED device 300 along the diagonal line 102 in FIG. 3A, in accordance with some embodiments.

FIG. 3B is a cross-sectional view of a single pixel tri-color LED device 300 along the diagonal line 102 in FIG. 3A, in accordance with some embodiments.

In some embodiments, the single pixel tri-color LED device 300 has similar structures as any one of the single pixel tri-color LED devices shown in FIGS. 1-2 with a reflective cup structure including reflective cup parts such as 346 and 348 in place of the optical isolation structures such as 146 and 148, as described further below, formed around the single pixel tri-color LED device to improve light emission efficiency. Compared with FIG. 1A, wherein, in some embodiments, the optical isolation structures form sidewall around the single pixel tri-color LED device as a rectangle/square, the reflective cup structures in FIG. 3A form a round sidewall around the single pixel tri-color LED device.

Figure 4A:
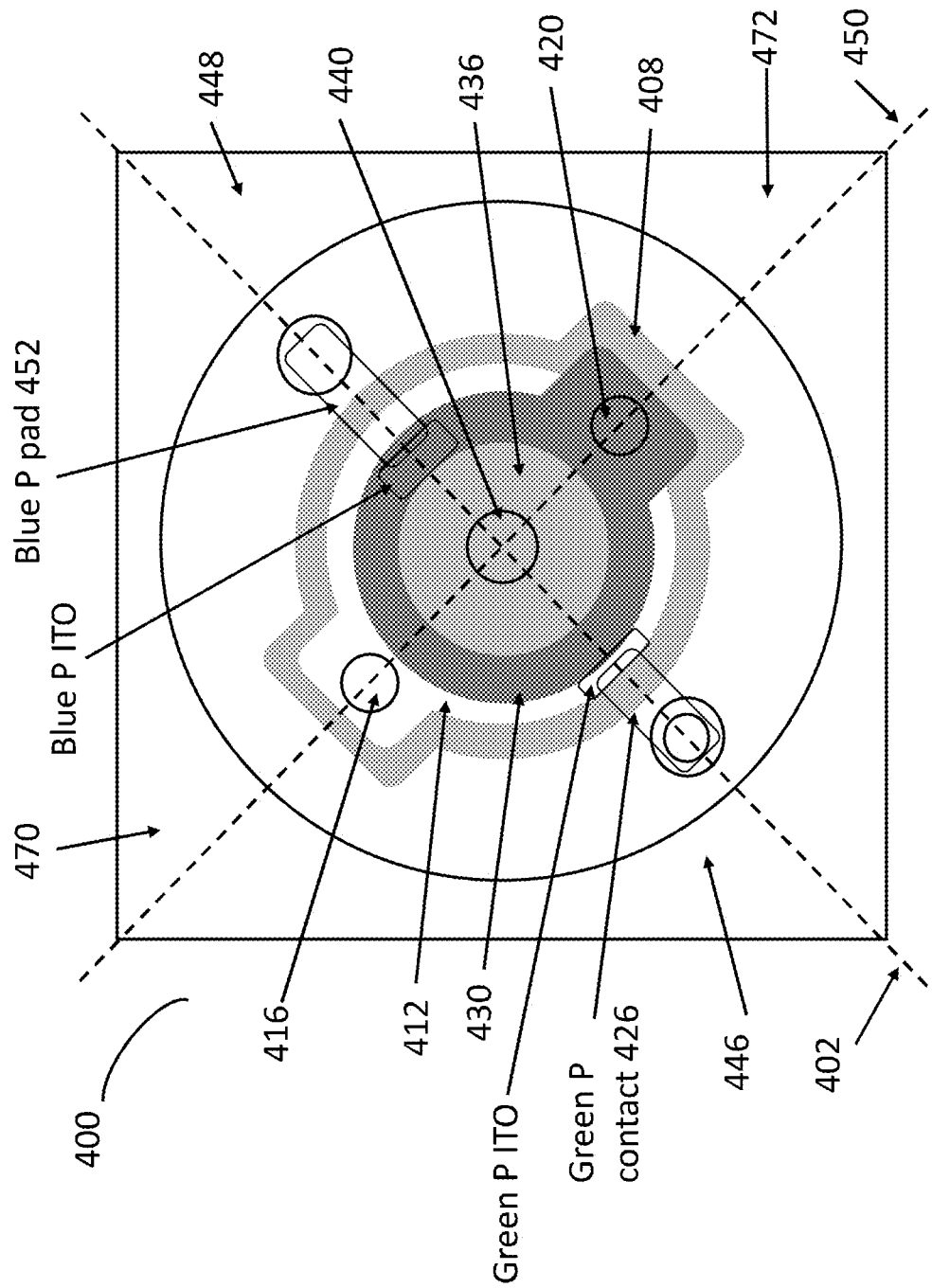
FIG. 4A is a top view of a single pixel tri-color LED device 400, in accordance with some embodiments.

FIG. 4A is a top view of a single pixel tri-color LED device 400, in accordance with some embodiments.

Figure 4B:
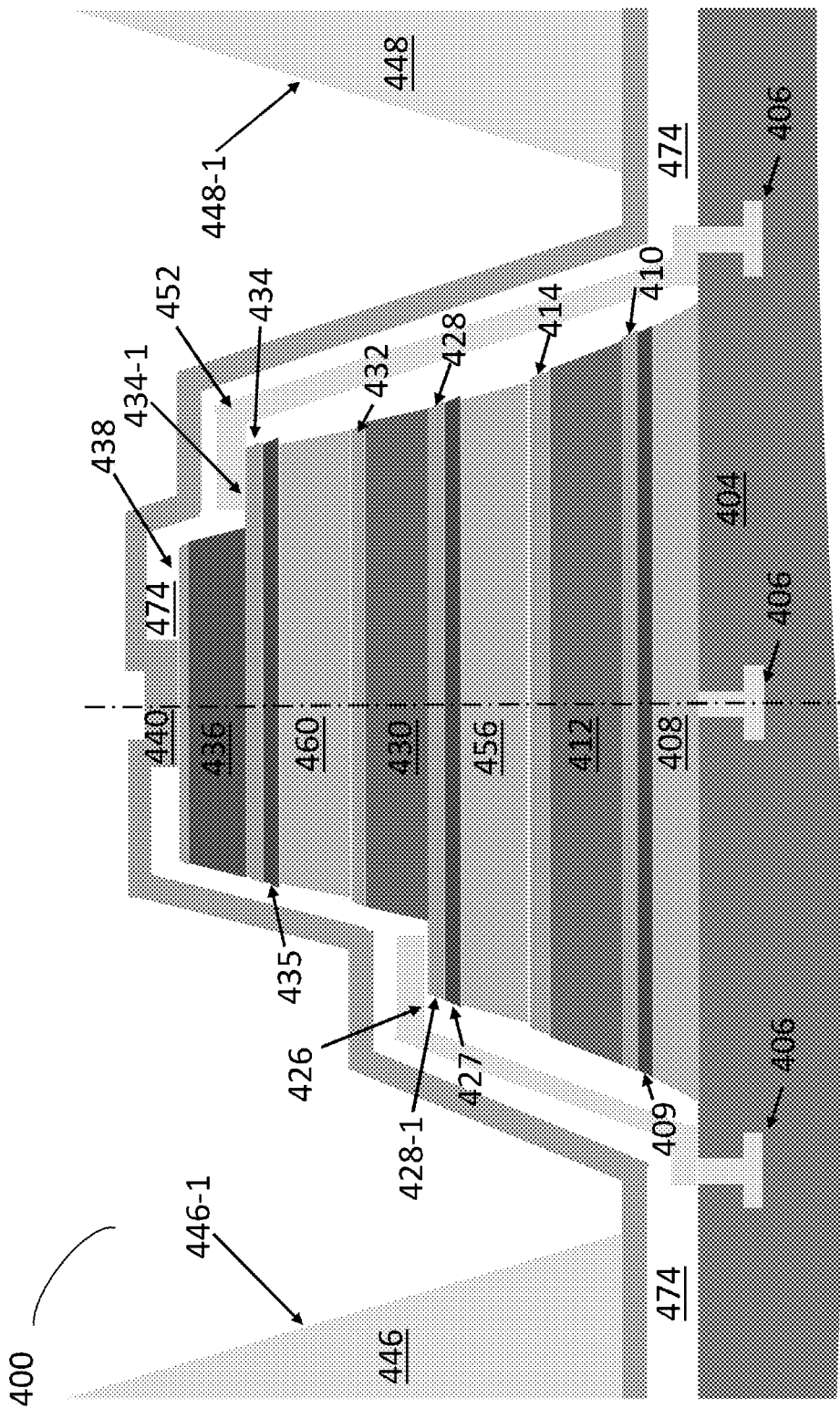
FIG. 4B is a cross-sectional view of a single pixel tri-color LED device 400 along the diagonal line 402 in FIG. 4A, in accordance with some embodiments.

FIG. 4B is a cross-sectional view of a single pixel tri-color LED device 400 along the diagonal line 402 in FIG. 4A, in accordance with some embodiments.

Figure 4C:
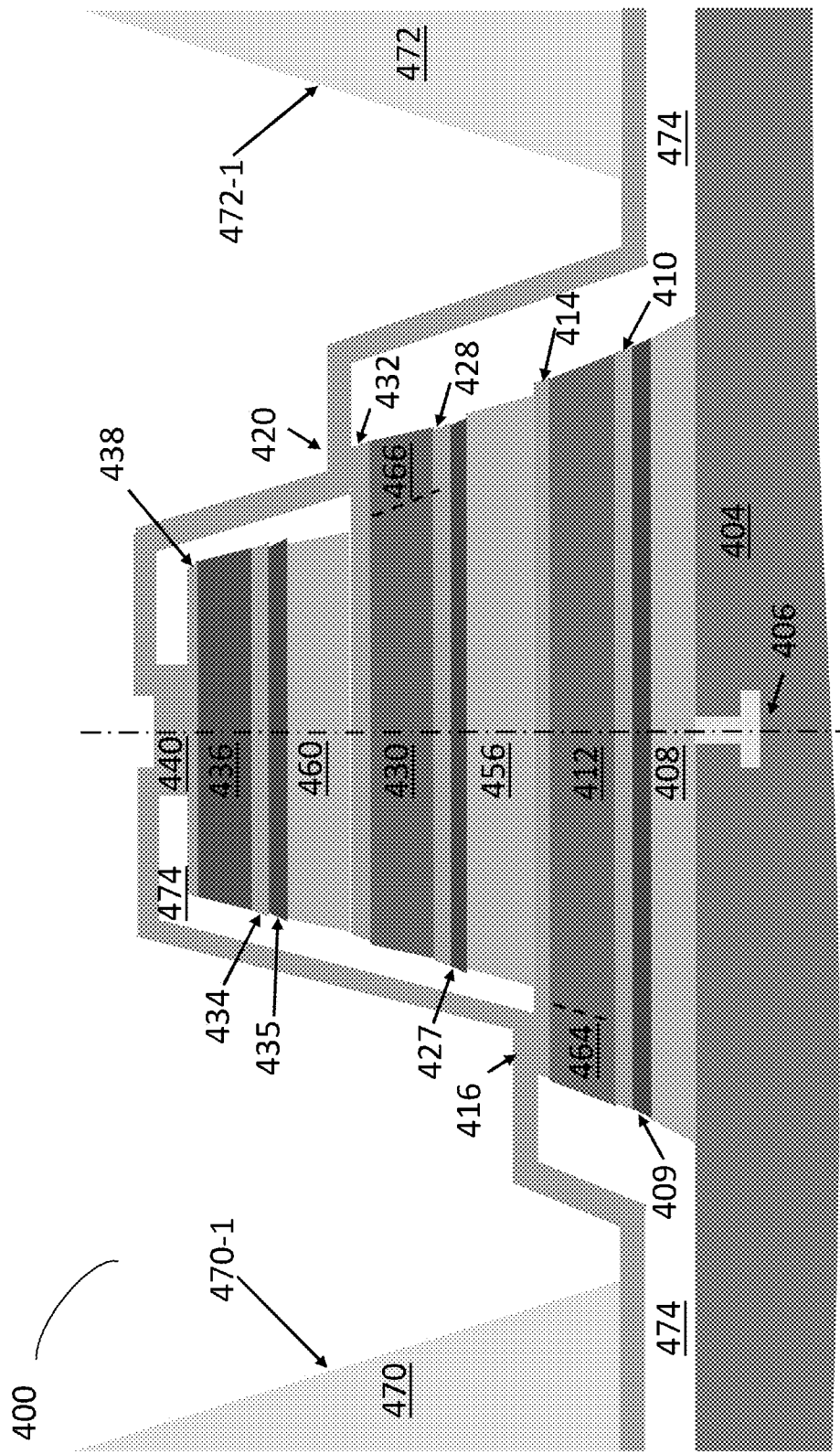
FIG. 4C is a cross-sectional view of a single pixel tri-color LED device 400 along the diagonal line 450 in FIG. 4A, in accordance with some embodiments.

FIG. 4C is a cross-sectional view of a single pixel tri-color LED device 400 along the diagonal line 450 in FIG. 4A, in accordance with some embodiments.

The diagonal lines 402 and 450 each pass through the center of the single pixel tri-color LED device 400. The diagonal lines 402 and 450 are orthogonal to each other. In some embodiments, the tri-color LED device 400 includes a substrate 404. For convenience, "up" is used to mean away from the substrate 404, "down" means toward the substrate 404, and other directional terms such as top, bottom, above, below, under, beneath, etc. are interpreted accordingly. The supporting substrate 404 is the substrate on which the array of individual driver circuits 406 is fabricated. In some embodiments, the driver circuits could also be located in one of the layers above the substrate 404, or above the micro tri-color LED structure 400. Each driver circuit is a pixel driver 406. In some instances, the driver circuits 406 are thin-film transistor pixel drivers or silicon CMOS pixel drivers. In one embodiment, the substrate 404 is a Si substrate. In another embodiment, the supporting substrate 404 is a transparent substrate, for example, a glass substrate. Other example substrates include GaAs, GaP, InP, SiC, ZnO, and sapphire substrates. The driver circuits 406 form individual pixel drivers to control the operation of the individual single pixel tri-color LED device 400. The circuitry on substrate 404 includes contacts to each individual driver circuit 406 and also a ground contact. As shown in both FIGS. 4A, 4B and 4C, each micro tri-color LED structure 400 also has two types of contacts: P-electrodes or anodes, such as 408, 426, 452, which are connected to the pixel driver 406; and N-electrodes or cathodes, such as 416, 420 and 440, which are connected to the ground (i.e., the common electrode).

In some embodiments, the N-electrode (or N-electrodes contact pad) and its connections, such as 416, 420 and 440, are made of materials such as graphene, ITO, Aluminum-Doped Zinc Oxide (AZO), or Fluorine doped Tin Oxide (FTO), or any combinations thereof. In some embodiments, the N-electrode (or N-electrodes contact pad) and its connections, such as 416, 420 and 440, are made of non-transparent or transparent conductive materials and in a preferred embodiment, transparent conductive materials. In some embodiments, the P-electrode (or P-electrodes contact pad) and its connections, such as 426, 452, are made of materials such as graphene, ITO, AZO, or FTO, or any combinations thereof. In some embodiments, the P-electrode (or P-electrodes contact pad) and its connections, such as 426, 452, are made of non-transparent or transparent conductive materials and in a preferred embodiment, transparent conductive materials. In some embodiments, the locations of the P-electrodes (or P-electrodes contact pad) and its connections, and N-electrodes (or N-electrodes contact pad) and its connections can be switched.

Although some features are described herein with the term "layer", it should be understood that such features are not limited to a single layer but may include a plurality of sublayers. In some instance, a "structure" can take the form of a "layer".

In some embodiments, three LED structures including LED light emitting layers 412, 430, and 436, respectively, are formed in a stacked structure, for example, a green LED light emitting layer 430 is formed on top of a red LED light emitting layer 412, and a blue LED light emitting layer 436 is formed on top of the green LED light emitting layer 430.

In general, an LED light emitting layer includes a PN junction with a p-type region/layer and an n-type region/layer, and an active layer between the p-type region/layer and n-type region/layer.

In some embodiments, as shown in FIGS. 4A and 4B, the area of the bottom red LED light emitting layer 412 is greater than the area of the middle green LED light emitting layer 430. In some embodiments, the area of the middle green LED light emitting layer 430 is greater than the area of the top blue LED light emitting layer 436.

In some embodiments, the light emitted from the red LED light emitting layer 412 is able to propagate through the green LED light emitting layer 430 and then through the blue LED light emitting layer 436 to be emitted out of the tri-color LED device 400. In some embodiments, the light emitted from the green LED light emitting layer 430 is able to propagate through the blue LED light emitting layer 436 to be emitted out of the tri-color LED device 400.

In some embodiments, the light emitted from the red LED light emitting layer 412 is able to horizontally or near horizontally propagate toward the sidewall of the red LED light emitting layer 412, then is reflected upward by a reflective element, such as 446 and/or 448, as described below and emitted out at the top surface of the single pixel tri-color LED device 400. As described below, a reflective layer 409 is positioned below the red LED light emitting layer 412.

In some embodiments, the light emitted from the green LED light emitting layer 430 is able to horizontally or near horizontally propagate toward the sidewall of the green LED light emitting layer 430, then is reflected upward by a reflective element, such as 446 and/or 448, as described below and emitted out at the top surface of the single pixel tri-color LED device 400. As described below, a reflective layer 427 is positioned below the green LED light emitting layer 430.

In some embodiments, the light emitted from the blue LED light emitting layer 436 is able to horizontally or near horizontally propagate toward the sidewall of the blue LED light emitting layer 436, then is reflected upward by a reflective element, such as 446 and/or 448, as described below and emitted out at the top surface of the single pixel tri-color LED device 400. As described below, a reflective layer 435 is positioned below the blue LED light emitting layer 436.

In some embodiments, the light emitted from the red LED light emitting layer 412 is able to propagate vertically through the green LED light emitting layer 430 and then through the blue LED light emitting layer 436 to be emitted out of the tri-color LED device 400. In some embodiments, the light emitted from the green LED light emitting layer 430 is able to propagate through the blue LED light emitting layer 436 to be emitted out of the tri-color LED device 400.

In some embodiments, an LED light emitting layer such as 412, 430, and 436 includes many epitaxial sub-layers with different compositions. Examples of the LED epitaxial layers include III-V nitride, III-V arsenide, III-V phosphide, and III-V antimonide epitaxial structures. Examples of micro LEDs include GaN based UV/blue/green micro LEDs, AlInGaP based red/orange micro LEDs, and GaAs or InP based infrared (IR) micro LEDs.

In some embodiments, each of the stacked LED structures can be controlled individually to generate its individual light. In some embodiments, the combined light from the top LED epitaxial layer as a result from the operations all the LED epitaxial layers in the tri-color LED device 400 can change the color of the single pixel on a display panel within a small footprint.

In some embodiments, depending on the design of the LED device 400, the emitted colors of the LED structures included in the same device are not limited to red, green and blue. For example, suitable colors can be selected from a range of different colors from a wavelength of 380 nm to 700 nm in visible color range. In some embodiments, LED structures emitting other colors from invisible range such as ultra-violet and infrared can be implemented.

In some embodiments, the three-color choice, from bottom to top can be red, green, and blue. In another embodiment, the three-color choice, from bottom to top can be infrared, orange, and ultra-violet. In some embodiments, the wavelength of the light from the LED structure on one layer of the device 400 is longer than the wavelength from the LED structure on a layer on top of the current layer. For instance, the wavelength of the light from the bottom LED light emitting layer 412 is longer than that of the middle LED light emitting layer 430, and the wavelength of the light from the middle LED light emitting layer 430 is longer than that of the top LED light emitting layer 436.

In some embodiments, each of the LED light emitting layers 412, 430 and 436 can be any suitable visible or invisible color.

In some embodiments, the bottom red LED light emitting layer 412 is bonded to the substrate 404 through a metal bonding layer 408. The metal bonding layer 408 may be disposed on the substrate 404. In one approach, a metal bonding layer 408 is grown on the substrate 404. In some embodiments, the metal bonding layer 408 is electrically connected to both the driver circuit 406 on the substrate 404 and the red LED light emitting layer 412 above the metal bonding layer 408, acting like a P-electrode. In some embodiments, the thickness of the metal bonding layer 408 is about 0.1 micron to about 3 microns. In a preferred embodiment, the thickness of a metal bonding layer 408 is about 0.3 µm. The metal bonding layer 408 may include ohmic contact layers, and metal bonding layers. In some instances, two metal layers are included in the metal bonding layer 408. One of the metal layers is deposited the layer above the metal bonding layer within the LED device 400. A counterpart bonding metal layer is also deposited on the substrate 404. In some embodiments, compositions for the metal bonding layer 408 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bond the two layers together. Eutectic bonding, thermal compression bonding, and transient liquid phase (TLP) bonding are example techniques that may be used.

In some embodiments, the metal bonding layer 408 can also be used as a reflector to reflect light emitted from the LED structures above.

In some embodiments, a conductive layer 410 for electrode connection is formed at the bottom of the red LED light emitting layer 412. In some embodiments, the conductive layer 410 can be a non-transparent metal layer which is not transparent to the light emitting from the LED device 400. In some embodiments, the conductive layer 410 is a conductive transparent layer, which is transparent to the light emitted from the LED device 400, such as an Indium tin oxide (ITO) layer, that is formed between the red LED light emitting layer 412 and the metal bonding layer 408 to improve conductivity and transparency.

In some embodiments, not shown in FIG. 4A to 4C, the red LED structure has a P-electrode contact pad 468 electrically connected to the red LED light emitting layer 412. In some embodiments, the P-electrode contact pad 468 is connected to the conductive layer 410. In some embodiments, a conductive layer 414 for electrode connection is formed at the top of the red LED light emitting layer 412. In some embodiments, the conductive layer 414 can be a metal layer or a conductive transparent layer, such as an ITO layer, that is formed between the red LED light emitting layer 412 and an N-electrode contact pad 416 as shown in FIG. 4C to improve conductivity and transparency. In some embodiments, the N-electrode contract pad, such as 416 is made of materials such as graphene, ITO, AZO, or FTO, or any combinations thereof.

In some embodiments, a reflective layer 409 is positioned below the red LED light emitting layer 412 between the conductive layer 410 and the metal bonding layer 408.

In some embodiments, the red LED light emitting layer 412 has an extended portion 464 at one side of the red LED light emitting layer 412 relative to the layers above it as shown in FIG. 4C. In some embodiments, the extended portion 464 is extended together with the conductive layers 410 and 414. In some embodiments, the extended portion 464 is extended together with the reflective layer 409 at the bottom of the red LED light emitting layer 412 and the metal bonding layer 408. In some embodiments, the red LED light emitting layer 412 is connected to the N-electrode contact pad 416 through the extended portion of the conductive layer 414 above the extended portion 464.

In one approach, the red LED light emitting layer 412 is grown on a separate substrate (referred to as the epitaxy substrate). The epitaxy substrate is then removed after bonding, for example, by a laser lift-off process or wet chemical etching, leaving the structure shown in FIGS. 4B and 4C.

In some embodiments, the red LED light emitting layer 412 is for forming red micro LEDs. Examples of a red LED light emitting layer include III-V nitride, III-V arsenide, III-V phosphide, and III-V antimonide epitaxial structures. In some instances, films within the red LED light emitting layer 412 can include the layers of P-type GaP/P-type AlGaInP light-emitting layer/AlGaInP/N-type AlGaInP/N-type GaAs. In some embodiments, P type layer is generally Mg-doped, and N-type layer is generally Si-doped. In some examples, the thickness of the red LED light emitting layer is about 0.1 micron to about 5 microns. In a preferred embodiment, the thickness of the red LED light emitting layer is about 0.3 micron.

In some embodiments, the red LED structure includes the metal bonding layer 408, the reflective layer 409, the conductive layer 410, the red LED light emitting layer 412, the conductive layer 414, and the N-electrode contact pad 416.

In some embodiments, the bonding layer 456, is used to bond the red LED structure and the green LED structure together. In some embodiments, the bonding layer 456 is not transparent to the light emitted from the LED device 400. In some embodiments, the materials and the thickness of the bonding layer 456 is the same as described above for the metal bonding layer 408. In some embodiments, the bonding layer 456 can also be used as a reflector to reflect light emitted from the LED structures above.

In some embodiments, when vertical transmission is used, the bonding layer 456 is transparent to the light emitted from the micro LED 400. In some embodiments, the bonding layer 456 is made of dielectric materials such as solid inorganic materials or plastic materials. In some embodiments, the solid inorganic materials include $SiO_2$, $Al_2O_3$, $Si_3N_4$, Phosphosilicate glass (PSG), or Borophosphosilicate glass (BPSG), or any combination thereof. In some embodiments, the plastic materials include polymers such as SU-8, PermiNex, Benzocyclobutene (BCB), or transparent plastic (resin) including spin-on glass (SOG), or bonding adhesive Micro Resist BCL-1200, or any combination thereof. In some embodiments, the transparent bonding layers can facilitate the light emitted from the layers below the bonding layers to pass through.

In some embodiments, as shown in both FIG. 4A and in FIG. 4B, the green LED structures has a P-electrode contact pad 426 electrically connected to the green LED light emitting layer 430. In some embodiments, the P-electrode contact pad 426 is connected to a conductive layer 428. In some embodiments, the conductive layer 428 for electrode connection is formed at the bottom of the green LED light emitting layer 430. In some embodiments, the conductive layer 428 can be a metal layer or a conductive transparent layer, such as an ITO layer, that is formed between the green LED light emitting layer 430 and a P-electrode contact pad 426 as shown in FIGS. 4A and 4B to improve conductivity and transparency.

In some embodiments, the conductive layer 428 has an extended portion 428-1 at one side of the conductive layer 428 relative to the layers above it as shown in FIG. 4B. In some embodiments, the extended portion 428-1 is extended together with all the layers below the conductive layer 428 within the LED device 400. In some embodiments, the green LED light emitting layer 430 is electrically connected to the P-electrode contact pad 426 through the extended portion 428-1 of the conductive layer 428. In some embodiments, the P-electrode contact pad 426 is also electrically connected to the driver circuit 406 in the substrate 404.

In some embodiments, an insulation layer 474 made of dielectric materials, such as a $SiO_2$ layer, is deposited on the surface of the LED device 400. The P-electrode contact pad 426 is extended from its contact with the driver circuit 406 to its contact with the conductive layer 428 through a via or passage within the insulation layer 474. The P-electrode contact pad 426 does not contact with other layers within the LED device 400.

In some embodiments, a conductive layer 432 for electrode connection is formed at the top of the green LED light emitting layer 430. In some embodiments, the conductive layer 432 can be a metal layer or a conductive transparent layer, such as an ITO layer, that is formed between the green LED light emitting layer 430 and an N-electrode contact pad 420 to improve conductivity and transparency. In some embodiments, the N-electrode contract pad 420 is made of transparent conductive materials such as ITO. In some embodiments, the N-electrode contact pad 420 is made of materials such as graphene, ITO, AZO, or FTO, or any combinations thereof.

In some embodiments, shown in FIG. 4C, the green LED structure has the N-electrode contact pad 420 electrically connected to the green LED light emitting layer 430. In some embodiments, the N-electrode contact pad 420 is connected to the conductive layer 432. In some embodiments, the N-electrode contact pad 420 of the green LED structure is also electrically connected to the N-electrode contact pad 416 of the red LED structure.

As shown in FIG. 4C, in some embodiments, the green LED light emitting layer 430 has an extended portion 466 at one side of the green LED light emitting layer 430. In some embodiments, the extended portion 466 is extended together with the conductive layers 428 and 432 and all other layers below the conductive layer 428. In some embodiments, the extended portion 466 is electrically connected to the N-electrode contact pad 420 through the extended portion of the conductive layer 432 above the extended portion 466.

In some embodiments, the lateral dimension of the green LED light emitting layer 430 is smaller than the lateral dimension of the red LED light emitting layer 412.

In some embodiments, a reflective layer 427 is positioned below the green LED light emitting layer 430 between the conductive layer 428 and the bonding layer 456.

In one approach, the green LED light emitting layer 430 is grown on a separate substrate (referred to as the epitaxy substrate). The epitaxy substrate is then removed after bonding, for example, by a laser lift-off process or wet chemical etching, leaving the structure shown in FIGS. 4B and 4C.

In some embodiments, the green LED light emitting layer 430 is for forming green micro LEDs. Examples of a green LED light emitting layer include III-V nitride, III-V arsenide, III-V phosphide, and III-V antimonide epitaxial structures. In some instances, films within the green LED light emitting layer 430 can include the layers of P-type GaN/InGaN light-emitting layer/N-type GaN. In some embodiments, P type is generally Mg-doped, and N-type is generally Si-doped. In some examples, the thickness of the green LED light emitting layer is about 0.1 micron to about 5 microns. In a preferred embodiment, the thickness of the green LED light emitting layer is about 0.3 micron.

In some embodiments, the green LED structure includes the reflective layer 427, the conductive layer 428, the green LED light emitting layer 430, the conductive layer 432, the P-electrode contact pad 426, and the N-electrode contact pad 420.

In some embodiments, the first LED structure, e.g., the red LED structure and the second LED structure, e.g. the green LED structure, have the same central axis when the extended portions such as 464, 466, and portions below 428-1 of the conductive layer 428 are excluded. In some embodiments, the first LED structure and the second LED structure are aligned along the same central axis when the extended portions such as 464, 466, and portions below 428-1 of the conductive layer 428 are excluded.

In some embodiments, the bonding layer 460, is used to bond the green LED structure and the blue LED structure together. In some embodiments, the bonding layer 456 is not transparent to the light emitted from the LED device 400. In some embodiments, the materials and the thickness of the bonding layer 460 is the same as described above for the metal bonding layer 408. In some embodiments, the bonding layer 460 can also be used as a reflector to reflect light emitted from the LED structures above.

In some embodiments, when vertical transmission is used, the bonding layer 460 is transparent to the light emitted from the LED device 400. In some embodiments, the bonding layer 460 is made of dielectric materials such as solid inorganic materials or plastic materials same as described above for the bonding layer 456. In some embodiments, the transparent bonding layers can facilitate the light emitted from the layers below the bonding layers to pass through.

In some embodiments, as shown in both FIG. 4A and in FIG. 4B, the blue LED structures has a P-electrode contact pad 452 electrically connected to the blue LED light emitting layer 436. In some embodiments, the P-electrode contact pad 452 is connected to a conductive layer 434. In some embodiments, the conductive layer 434 for electrode connection is formed at the bottom of the blue LED light emitting layer 436. In some embodiments, the conductive layer 434 can be a metal layer or a conductive transparent layer, such as an ITO layer, that is formed between the blue LED light emitting layer 436 and a P-electrode contact pad 452 as shown in FIGS. 4A and 4B to improve conductivity and transparency.

In some embodiments, the conductive layer 434 has an extended portion 434-1 at one side of the conductive layer 434 relative to the layers above it as shown in FIG. 4B. In some embodiments, the extended portion 434-1 is extended together with all the layers below the conductive layer 434 within the LED device 400. In some embodiments, the blue LED light emitting layer 436 is electrically connected to the P-electrode contact pad 452 through the extended portion 434-1 of the conductive layer 434. In some embodiments, the P-electrode contact pad 452 is also electrically connected to the driver circuit 406 in the substrate 404.

In some embodiments, an insulation layer 474 made of dielectric materials, such as a SiO2 layer, is deposited on the surface of the LED device 400. The P-electrode contact pad 452 is extended from its contact with the driver circuit 406 to its contact with the conductive layer 434 through a via or passage within the insulation layer 474. The P-electrode contact pad 452 does not contact with other layers within the LED device 400.

In some embodiments, a conductive layer 438 for electrode connection is formed at the top of the blue LED light emitting layer 436. In some embodiments, the conductive layer 438 can be a metal layer or a conductive transparent layer, such as an ITO layer, that is formed between the blue LED light emitting layer 436 and an N-electrode contact pad 440 to improve conductivity and transparency. In some embodiments, the N-electrode contract pad 440 is made of transparent conductive materials such as ITO. In some embodiments, the N-electrode contact pad 440 is made of materials such as graphene, ITO, AZO, or FTO, or any combinations thereof. In some embodiments, the N-electrode contact pads 416, 420 and 440 are all electrically connected together as a common N-electrode. In some embodiments, the N-electrode contact pads 416, 420 and 440 are formed as one integral piece as a common N-electrode.

In some embodiments, shown in FIG. 4B, the blue LED structure has the N-electrode contact pad 440 electrically connected to the blue LED light emitting layer 436. In some embodiments, the N-electrode contact pad 440 is connected to the conductive layer 438.

In some embodiments, the lateral dimension of the blue LED light emitting layer 436 is smaller than the lateral dimension of the green LED light emitting layer 430.

In some embodiments, the top electrode elements, such as the N-electrode pad 440, is connected through electrical connections below the optical isolation structures, such as 446, 448, 470 and 472. In some embodiments, the top electrode is connected through electrical connections embedded in the substrate 404. In an example, the top electrode 440 is connected through electrical connection elements that is above the insulation layer 474 and below the optical isolation structures, such as 446, 448, 470 and 472.

In some embodiments, a reflective layer 435 is positioned below the blue LED light emitting layer 436 between the conductive layer 434 and the bonding layer 460.

In one approach, the blue LED light emitting layer 436 is grown on a separate substrate (referred to as the epitaxy substrate). The epitaxy substrate is then removed after bonding, for example, by a laser lift-off process or wet chemical etching, leaving the structure shown in FIGS. 4B and 4C.

In some embodiments, the blue LED light emitting layer 436 is for forming blue micro LEDs. Examples of a blue LED light emitting layer include III-V nitride, III-V arsenide, III-V phosphide, and III-V antimonide epitaxial structures. In some instances, films within the blue LED light emitting layer 436 can include the layers of P-type GaN/InGaN light-emitting layer/N-type GaN. In some embodiments, P type is generally Mg-doped, and N-type is generally Si-doped. In some examples, the thickness of the blue LED light emitting layer is about 0.1 micron to about 5 microns. In a preferred embodiment, the thickness of the blue LED light emitting layer is about 0.3 micron.

In some embodiments, the blue LED structure includes the reflective layer 435, the conductive layer 434, the blue LED light emitting layer 436, the conductive layer 438, the P-electrode contact pad 452, and the N-electrode contact pad 440.

In some embodiments, the second LED structure, e.g., the green LED structure, and the third LED structure, e.g., the blue LED structure, have the same central axis when the extended portions such as 466, and portions below 434-1 of the conductive layer 434 are excluded. In some embodiments, the first LED structure and the second LED structure are aligned along the same central axis when the extended portions such as 466, and portions below 434-1 of the conductive layer 434 are excluded.

In some embodiments, the N-electrode 440 covers the top of the tri-color LED device 400. In some embodiments, the N-electrode 440 connects to an N-electrode in an adjacent tri-color LED device (not shown in FIG. 4A-4C) via some electrical connections components, and therefore serves as a common electrode.

In some embodiments, the thickness of each of the conductive layers 410, 414, 428, 432, 434, and 438 is about 0.01 micron to about 1 micron. In some instances, before any bonding process with the next epitaxial layer, each of the conductive layers 410, 414, 428, 432, 434, and 438 is deposited on the respective corresponding epitaxial layer commonly by vapor deposition, for example, electron beam evaporation or sputtering deposition. In some examples, conductive layers are used to maintain a good conductivity for electrode connection while in some instances, improving optical properties of the LED devices, such as reflectivity or transparency.

In some embodiments, an additional dielectric layer (not shown in FIGS. 4A-4C) such as a SiO2 layer is formed above the bottom light emitting layer 412 (and above the conductive layer 414), and below the bonding layer 456, to electrically separate the N-type layer of the light emitting layer 412 from the bonding layer 456. In some embodiments, the thickness of the additional dielectric layer is from 20 nanometers to 2 microns. In a preferred embodiment, the thickness of the additional dielectric layer is about 100 nanometers. In some embodiments, an additional dielectric layer (not shown in FIGS. 4A-4C) such as a SiO2 layer is formed above the middle light emitting layer 430 (and above the conductive layer 432), and below the bonding layer 460, to electrically separate the N-type layer of the light emitting layer 430 from the bonding layer 460. In some embodiments, the thickness of the additional dielectric layer is from 20 nanometers to 2 microns. In a preferred embodiment, the thickness of the additional dielectric layer is about 100 nanometers.

In some embodiments, in order to improve the light emission efficiency from the tri-color LED device 400, optical isolation structures as further described below such as 446, 448, 470 and 472 are formed along the sidewall of the tri-color LED device 400. In some embodiments, the optical isolation structures such as 446, 448, 470 and 472 are made from dielectric materials such as SiO2.

As shown in FIG. 4A from the top view, in some embodiments, the tri-color LED device 400 has a circular shape. In some embodiments, the optical isolation structures, such as 446, 448, 470 and 472, are connected as one piece and formed as a circular sidewall around the tri-color LED device 400. In some embodiments, the optical isolation structures are formed as a reflective cup as described in further detail below. In some embodiments, the three stacked LED structures within the tri-color LED device 400 are also in circular shapes. In some embodiments, the tri-color LED device 400 can be in other shapes, such as rectangle, square, triangle, trapezoid, polygon. In some embodiments, the optical isolation structures, such as 446, 448, 470 and 472, are connected as one piece and formed as a sidewall around the tri-color LED device 400 with other shapes such as rectangle, square, triangle, trapezoid, polygon.

As shown in FIGS. 4B and 4C, in some embodiments, the red LED light emitting layer 412, the green LED light emitting layer 430 and the blue LED light emitting layer 436 has oblique side surfaces. As used here, the oblique side surface may refer to a surface that is not perpendicular to the top or bottom surfaces of the respective LED light emitting layer. In some embodiments, the angle between the oblique side wall and the bottom surface of the respective LED light emitting layer is less than 90 degrees. In some embodiments, the bonding layers 408, 456 and 460 also has an oblique side surface. The oblique side surfaces may enhance easy connections for different connectors to the LED light emitting layers, prevent disconnections of those connectors because of sharp angles, and enhance the overall stability of the device.

In some embodiments, the light transmission efficiency of the multi-color LED device changes as the angle of the oblique side surface of the LED light emitting layers relative to a normal line to the surface of the substrate 404 changes. In some embodiments, the light transmission efficiency of the multi-color LED device increases as the angle of the oblique side surface of the LED light emitting layers relative to a normal line to the surface of the substrate 404 increases. For example, when the angle of the side surface of the LED light emitting layers relative to the normal line to the surface of the substrate 404 is ±5 degrees and when the optical isolation structures such as 446, 448, 470 and/or 472 are not reflective cups as described below, the light emission efficiency of a multi-color LED device is 0.32%. For example, when the angle of the side surface of the LED light emitting layers relative to the normal line to the surface of the substrate 404 is ±15 degrees and when the optical isolation structures such as 446, 448, 470 and/or 472 are not reflective cups as described below, the light emission efficiency of a multi-color LED device is 2.7%. For example, when the angle of the side surface of the LED light emitting layers relative to the normal line to the surface of the substrate 404 is at (for example, when the light emitting layer is tilted) or very close to ±90 degrees and when the optical isolation structures such as 446, 448, 470 and/or 472 are not reflective cups as described below, the light emission efficiency of a multi-color LED device is equal to or very close to 56.4%.

In contrast, the implementation of reflective cup structures, as described in further detail below, improves the light transmission efficiency of the multi-color LED device. For example, when the angle of the side surface of the LED light emitting layers relative to the normal line to the surface of the substrate 404 is ±5 degrees and when the optical isolation structures such as 446, 448, 470 and/or 472 are reflective cups as described below, the light emission efficiency of a multi-color LED device is 0.65%, that is an increase of 104.6% compared with the LED device without a reflective cup. For example, when the angle of the side surface of the LED light emitting layers relative to the normal line to the surface of the substrate 404 is ±15 degrees and when the optical isolation structures such as 446, 448, 470 and/or 472 are reflective cups as described below, the light emission efficiency of a multi-color LED device is 6.65%, that is an increase of 144.4% compared with the LED device without a reflective cup. For example, when the angle of the side surface of the LED light emitting layers relative to the normal line to the surface of the substrate 404 is at (for example, when the light emitting layer is tilted) or very close to ±90 degrees and when the optical isolation structures such as 446, 448, 470 and/or 472 are reflective cups as described below, the light emission efficiency of a multi-color LED device is equal to or very close to 66.65%, that is an increase of 18.4% compared with the LED device without a reflective cup.

In some embodiments, reflective layers are formed below each of the LED light emitting layers to improve light transmission efficiency. As shown in both FIGS. 4B and 4C, in some embodiments, a reflective layer 409 is formed between the bonding layer 408 and the red LED light emitting layer 412. In some embodiments, the reflective layer 409 is formed between the bonding layer 408 and the conductive layer 410 when the conductive layer 410 is present.

In some embodiments, a reflective layer 427 is formed between the bonding layer 456 and the green LED light emitting layer 430. In some embodiments, the reflective layer 427 is formed between the bonding layer 456 and the conductive layer 428 when the conductive layer 428 is present.

In some embodiments, a reflective layer 435 is formed between the bonding layer 460 and the blue LED light emitting layer 436. In some embodiments, the reflective layer 435 is formed between the bonding layer 460 and the conductive layer 434 when the conductive layer 434 is present.

In some embodiments, the materials, composition, properties and fabrication of the reflective layers, such as 409, 427, and 435 are the same as described above with respect to the reflective layers, such as the 202, 204 and 206 as shown in FIGS. 2-3.

Figure 4D:
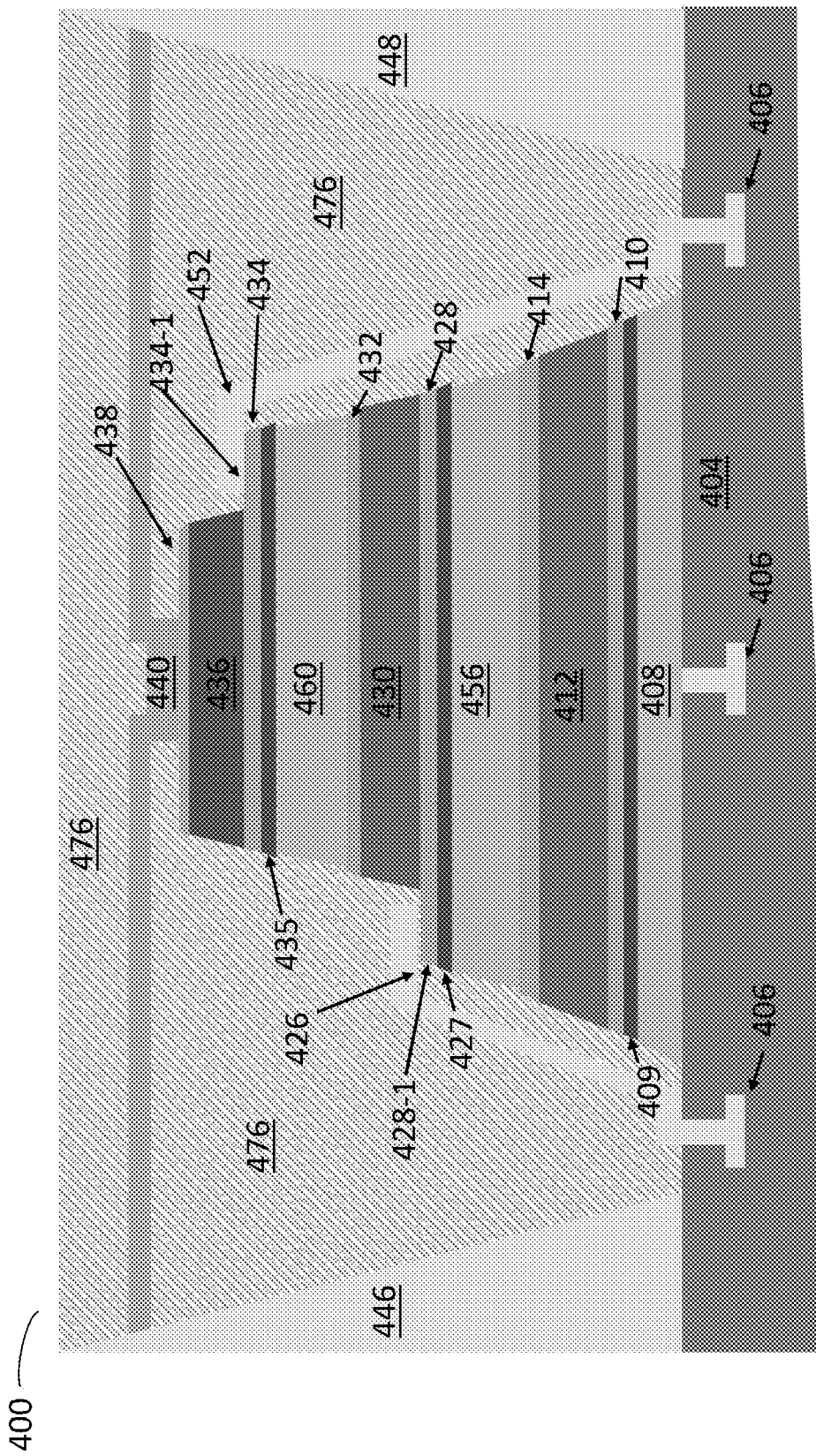
FIG. 4D is a cross-sectional view of a single pixel tri-color LED device 400 along the diagonal line 402 in FIG. 4A with planarization, in accordance with some embodiments.

FIG. 4D is a cross-sectional view of a single pixel tri-color LED device 400 along the diagonal line 402 in FIG. 4A with planarization, in accordance with some embodiments. In some embodiments, the single pixel tri-color LED device 400 has similar structures as the single pixel tri-color LED device 400 shown in FIGS. 4A, 4B and 4C with the addition of a planarized layer 476 covering the single pixel tri-color LED device 400.

Figure 4E:
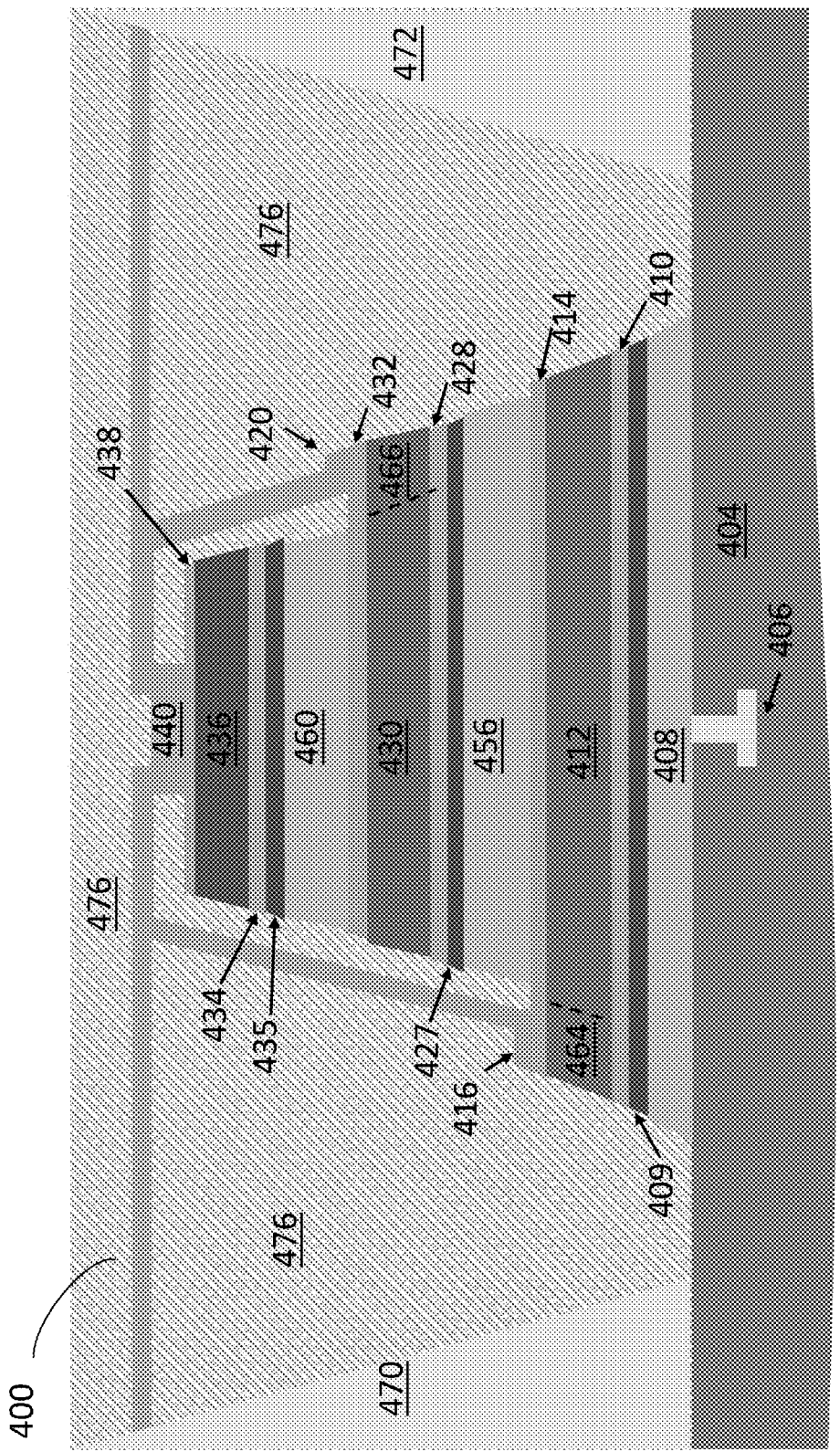
FIG. 4E is a cross-sectional view of a single pixel tri-color LED device 400 along the diagonal line 450 in FIG. 4A with planarization, in accordance with some embodiments.

FIG. 4E is a cross-sectional view of a single pixel tri-color LED device 400 along the diagonal line 450 in FIG. 4A with planarization, in accordance with some embodiments. In some embodiments, the single pixel tri-color LED device 400 has similar structures as the single pixel tri-color LED device 400 shown in FIGS. 4A, 4B and 4C with the addition of a planarized layer 476 covering the single pixel tri-color LED device 400.

In some embodiments, the planarized layer, such as 476, is transparent to the light emitted from the micro LED 400. In some embodiments, the planarized layer is made of dielectric materials such as solid inorganic materials or plastic materials. In some embodiments, the solid inorganic materials include SiO2, Al2O3, Si3N4, Phosphosilicate glass (PSG), or Borophosphosilicate glass (BPSG), or any combination thereof. In some embodiments, the plastic materials include polymers such as SU-8, PermiNex, Benzocyclobutene (BCB), or transparent plastic (resin) including spin-on glass (SOG), or bonding adhesive Micro Resist BCL-1200, or any combination thereof. In some embodiments, the planarized layer can facilitate the light emitted from the micro LED 400 to pass through.

In some embodiments, the planarized layer 476 has the same height as the optical isolation structures, for example 446, 448, 470 and 472, relative to the surface of the substrate 404. For example, the planarized layer 476 covers the whole single pixel tri-color LED device 400 and the sidewall of the optical isolation structures. The planarized layer 476 is on the same plane as the top surface of the optical isolation structures.

Figure 4F:
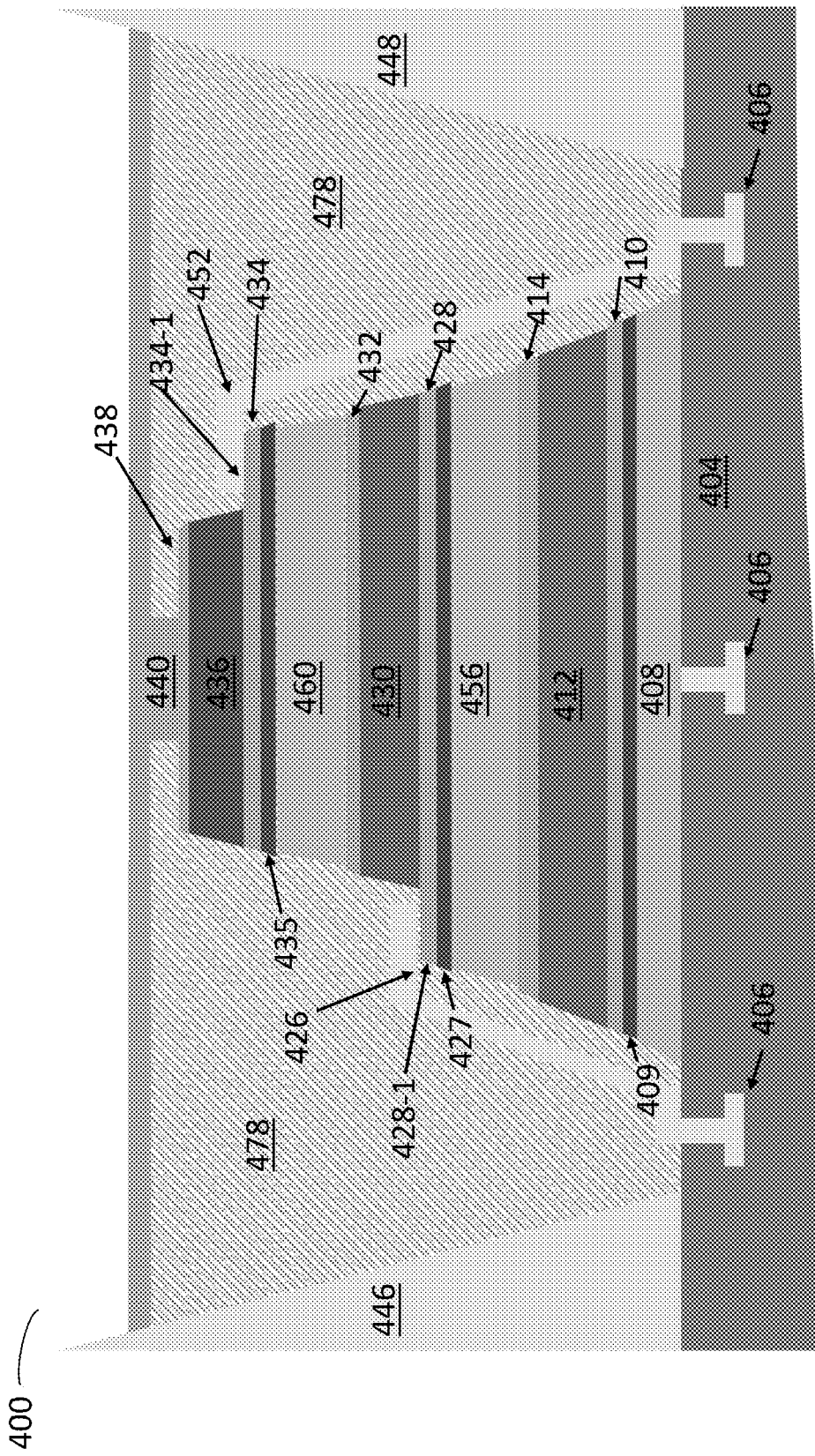
FIG. 4F is a cross-sectional view of a single pixel tri-color LED device 400 with planarization along the diagonal line 402 in FIG. 4A with planarization, in accordance with some embodiments.

FIG. 4F is a cross-sectional view of a single pixel tri-color LED device 400 along the diagonal line 402 in FIG. 4A with planarization, in accordance with some embodiments. In some embodiments, the single pixel tri-color LED device 400 has similar structures as the single pixel tri-color LED device 400 shown in FIGS. 4A, 4B and 4C with the addition of a planarized layer 478 covering the single pixel tri-color LED device 400.

Figure 4G:
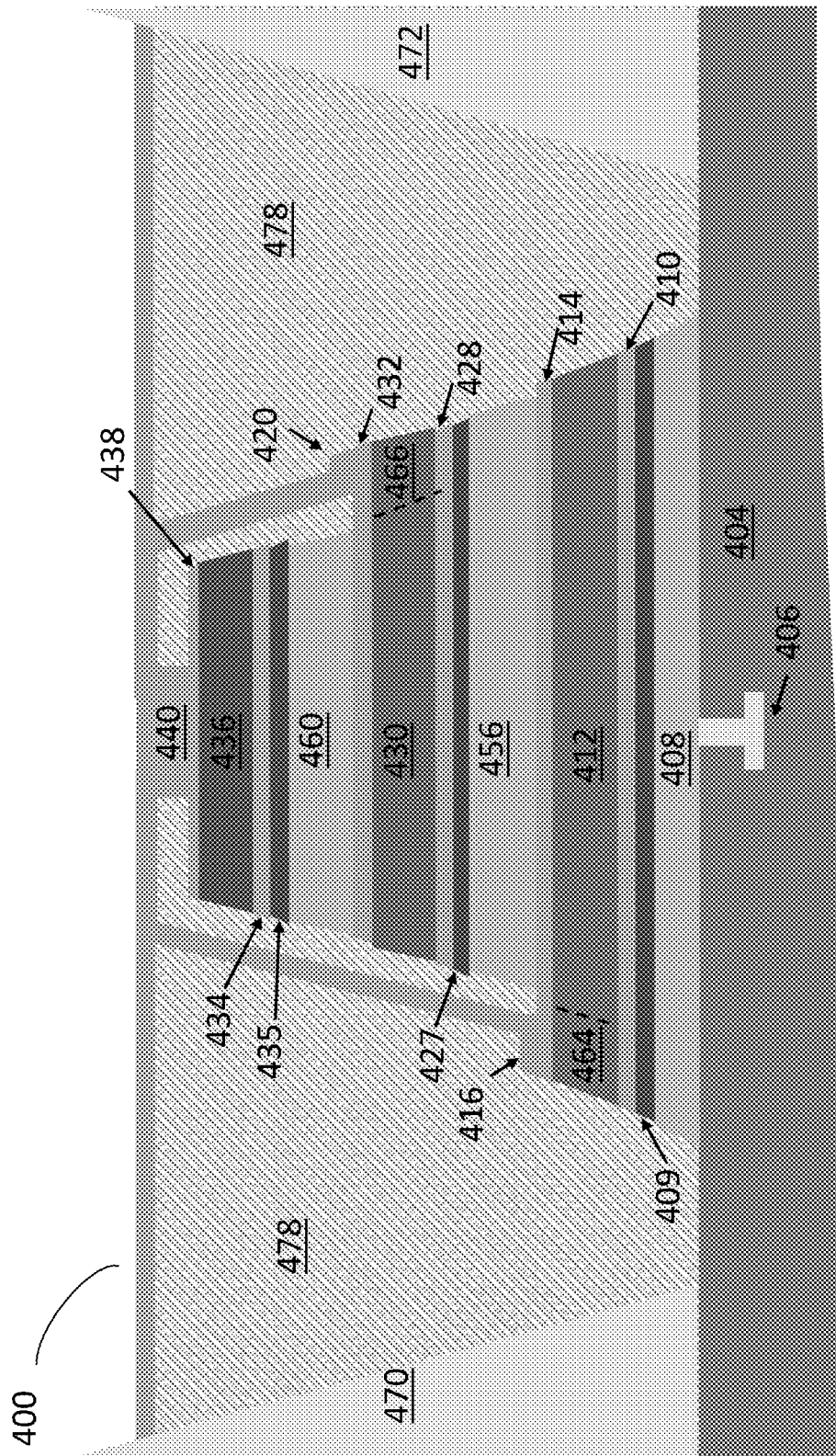
FIG. 4G is a cross-sectional view of a single pixel tri-color LED device 400 along the diagonal line 450 in FIG. 4A with planarization, in accordance with some embodiments.

FIG. 4G is a cross-sectional view of a single pixel tri-color LED device 400 along the diagonal line 450 in FIG. 4A with planarization, in accordance with some embodiments. In some embodiments, the single pixel tri-color LED device 400 has similar structures as the single pixel tri-color LED device 400 shown in FIGS. 4A, 4B and 4C with the addition of a planarized layer 478 covering the single pixel tri-color LED device 400.

In some embodiments, the planarized layer 478 has the same height as the top electrode elements, for example 440. The planarized layer 478 is on the same plane as the top surface of the top electrode elements, such as the N-electrode pad 440. In some embodiments, the top electrode elements, for example 440, is right on top of the planarized layer 478. The planarized layer 478 is on the same plane as the bottom surface of the top electrode elements, such as the N-electrode pad 440. For example, the planarized layer 478 covers the whole single pixel tri-color LED device 400 and a portion of the sidewall of the optical isolation structures, for example 446, 448, 470 and 472.

Unlike the electrode connections shown in FIG. 4A-4C, where the top electrode elements, such as the N-electrode pad 440, is connected through electrical connections below the optical isolation structures, such as 446, 448, 470 and 472, in FIGS. 4D-4E, 4F-4G, the top electrode elements, such as the N-electrode pad 440, is connected through electrical connections at least at the sidewall of the optical isolation structures such as 446, 448, 470 and 472. In some embodiments, the N-electrode pad 440 is fixed through or on a surface of the optical isolation structures, such as 446, 448, 470 and 472. The top electrode structure can simplify the fabrication process especially with the planarized layer and the make the single pixel tri-color LED device 400 compact.

In some embodiments, an insulation layer can be deposited on the single pixel multi-color LED device on the LED light emitting layers and other layers such as the conductive layers and reflective layers. A planarization process is then followed to even the surface of the insulation layer that embeds the single pixel multi-color LED device. Vias for electrical connections are also formed within the planarized layers. Compared with some other processes without planarized insulation layers, the features and layers within the planarized LED structures are better protected and less susceptible to the outside destruction force. Furthermore, the planarized surface can improve the light transmission efficiency by reducing deflection from an uneven surface.

In some embodiments, through dry etching and wet etching, a tri-color LED structure is formed and the axes of LED structures of different colors are aligned with one another vertically. In some embodiments, the LED structures of different colors share the same axis.

In some embodiments, each of the LED structures of different colors form a pyramid like shape or a trapezoidal cross-sectional shape. Each layer has a narrower width or smaller area compared to a layer beneath it. In this instance, the width or area is measured by the dimensions of a plane parallel to the surface of the substrate 404.

In some embodiments, each of the LED structures of different colors are bonded together by bonding layers that only cover the area of the LED structures without extension beyond the area of the LED structures, the whole multi-color LED device, forms a pyramid (or inverted cone) like shape or a trapezoidal cross-sectional shape (as shown in FIGS. 1-4). In some embodiments, the lateral dimension of the bottom LED structure, for example, the red LED structure, can be the longest, and the lateral dimension of the top LED structure, for example, the blue LED structure, can be the shortest. A pyramid like shape can be formed naturally when each of the layers within the LED device is etched and patterned from bottom up. A pyramid like structure can improve the electronic connections between the individual LED structures and to the electrodes, and simplify the fabrication process. For example, the electrode connections are exposed in each layer for easy connection.

In some embodiments, the bottom layer such as the metal bonding layer 408 has a lateral dimension of about 1 micron to about 500 microns. In a preferred embodiment, the lateral dimension of the metal bonding layer 408 at the bottom of the multi-color LED device is about 1.75 microns. In some embodiments, the vertical height of the multi-color LED device is about 1 micron to about 500 microns. In a preferred embodiment, the vertical height of the multi-color LED device is about 1.9 microns. In a preferred embodiment, the lateral dimension of the conductive layer 438 at the top of the multi-color LED device is about 1.0 micron.

In some embodiments, the aspect ratio of a cross section of a layer of the tri-color LED device remains substantially the same when the lateral dimension of the same layer varies. For example, when the lateral dimension of a patterned epitaxial layer is 5 microns, the thickness of the patterned epitaxial layer is less than a micron. In another example, when the lateral dimension of the same patterned epitaxial layer increases, the thickness of the same patterned epitaxial layer increases accordingly to maintain the same aspect ratio. In some embodiments, the aspect ratio of the cross-section of the epitaxial layers and other layers is less than ⅕ in thickness/width.

The shape of the LED device is not limited and in some other embodiments, the cross-sectional shape of the tri-color LED device can take the form of other shapes, for example, a reverse trapezoid, a semi-oval, a rectangle, a parallelogram, a triangle, or a hexagon, etc.

In some embodiments, the top conductive layer 438 above the third LED light emitting layer 436 is patterned using photolithography and etching. In some instances, the etching method used to form the pattern is dry etching, for example, inductively coupled plasma (ICP) etching, or wet etching with an ITO etching solution. In some embodiments, the same patterning methods can apply to all the other conductive layers, including conductive layers 410, 414, 428, 432, 434, and 438 within the tri-color LED device 400.

In some embodiments, the blue LED light emitting layer 436 and the green LED light emitting layer 430 are patterned using photolithography and etching. In some instances, the etching method used to form the pattern is dry etching, for example, inductively coupled plasma (ICP) etching, with Cl2 and BCl3 etching gases.

In some embodiments, the bonding layers including 460 and 456 are patterned using photolithography and etching. In some instances, the etching method used to form the pattern is dry etching, for example, inductively coupled plasma (ICP) etching, with CF4 and O2 etching gases.

In some embodiments, the reflective layers including 409, 427, and 435 are patterned using photolithography and etching. In some instances, the etching method used to form the pattern for the reflective layers especially the DBR layers is dry etching, for example, inductively coupled plasma (ICP) etching, with CF4 and O2 etching gases, or ion beam etching (IBE) with Ar gas.

In some embodiments, the red LED light emitting layer 412 is patterned using photolithography and etching. In some instances, the etching method used to form the pattern is dry etching, for example, inductively coupled plasma (ICP) etching, with Cl2 and HBr etching gases.

In some embodiments, the metal bonding layer 408 is patterned using photolithography and etching. In some instances, the etching method used to form the pattern is dry etching, for example, inductively coupled plasma (ICP) etching, with Cl2/BCl3/Ar etching gases, or ion beam etching (IBE) with Ar gas.

In some embodiments, after each of the LED device structures is patterned, an insulation layer, such as 474, 476, 478, is deposited on the surface of the patterned LED structure including all the patterned layers, side walls, and the exposed substrate. In some embodiments, the insulation layer is made of SiO2 and/or Si3N4. In some embodiments, the insulation layer is made of TiO2. In some embodiments, the insulation layer is formed with composition similar to SiO2 after curing a layer such as SOG at a high temperature. In some embodiments, the insulation layer is made of a material that has a similar thermal coefficient of the layers underneath the insulation layer. The surface of the insulation layers, such as 476 and 478, is then smoothed or planarized by a relevant method understood by a person of ordinary skill in the art, such as chemical mechanical polishing.

In some embodiments, the insulation layers, such as 476 and 478 after planarization are patterned to expose the electrode contact area using photolithography and etching. In some instances, the etching method used to form the pattern is dry etching, for example, inductively coupled plasma (ICP) etching, with CF4 and O2.

In some embodiments, P-electrode or anode metal pads are vapor deposited, or by other deposition method, on a suitable location of the patterned LED structure, such as on one side and/or in vias within the planarized insulation layer, to electrically connect the red LED structure, the green LED structure, and the blue LED structure.

In some embodiments, separate N-electrode or cathode metal pads are vapor deposited, or by other deposition method, on a suitable location of the patterned LED structure, such as on one side/top and/or in vias within the planarized insulation layer, to electrically connect the red LED structure, the green LED structure, and the blue LED structure.

Figure 5:
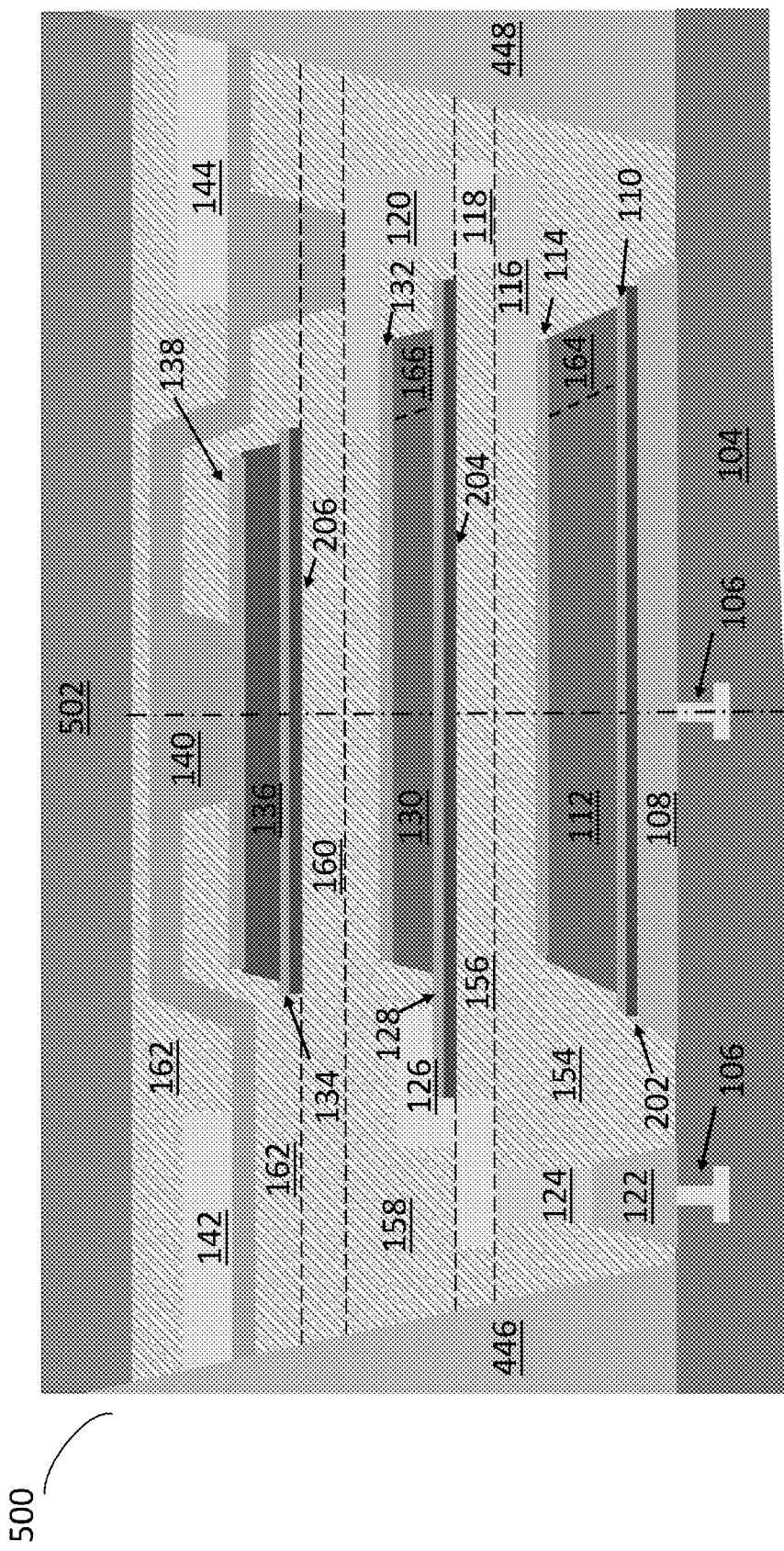
FIG. 5 is a cross-sectional view of a single pixel tri-color LED device 500 along the diagonal line 102 in FIG. 1A with a refractive structure, in accordance with some embodiments.

FIG. 5 is a cross-sectional view of a single pixel tri-color LED device 500 along the diagonal line 102 in FIG. 1A with a refractive structure, in accordance with some embodiments. In some embodiments, although not all shown in FIG. 5, the single pixel tri-color LED device 500 has similar structures as any one of the single pixel tri-color LED devices shown in FIGS. 1-4 with the addition of a refractive structure 502 formed above the top surface of the single pixel tri-color LED device to improve light emission efficiency. Light emitted from the single pixel tri-color LED device is emitted out through a top surface of the single pixel tri-color LED device without the refractive structure (the light emitting out area). In some embodiments, the top surface of the refractive structure 502 is planarized. In some embodiments, the refractive structure 502 covers and is in contract with the exposed surface of the top electrode, such as the N-electrode 140. In some embodiments, the refractive structure 502 is formed directly on the surface of the planarized insulation layer 162. In some embodiments, the refractive structure 502 is the same as the planarized insulation layer 162 and integrated with the planarized insulation layer 162.

In some embodiments, the refractive structure 502 is formed between the optical isolation structures, for example, a reflective cup, such as 446 and 448 and the top surface of the single pixel tri-color LED device without the refractive structure, i.e., the light emitting out area. In some embodiments, the top surface of the refractive structure 502 is above the top of the optical isolation structures. In some embodiments, the top surface of the refractive structure 502 is the same or below the top of the optical isolation structures. In some embodiments, the top surface of the refractive structure is above the top electrode, such as the N-electrode 140. In some embodiments, the top surface of the refractive structure is the same or below the top electrode, such as the N-electrode 140.

In some embodiments, the refractive structure 502 changes the light path emitted from the single pixel tri-color LED device by either making the light emitted from the LED device more focused or more divergent according to the design needs.

In some embodiments, the refractive layer 502 is made of dielectric materials. In some embodiments, the dielectric material is transparent to the light emitted by the single pixel tri-color LED device, such as silicon oxide, silicon nitride, silicon carbide, titanium oxide, zirconium oxide, aluminum oxide, etc. In some embodiments, the dielectric material is selected from one or more polymers such as SU-8, photo-sensitive polyimide (PSPI), BCB, etc.

In some embodiments, the refractive layer 502 is formed directly above the planarized insulation layers. In some embodiments, the refractive layer 502 is formed by deposition, sputtering, or other methods.

Figure 6A:
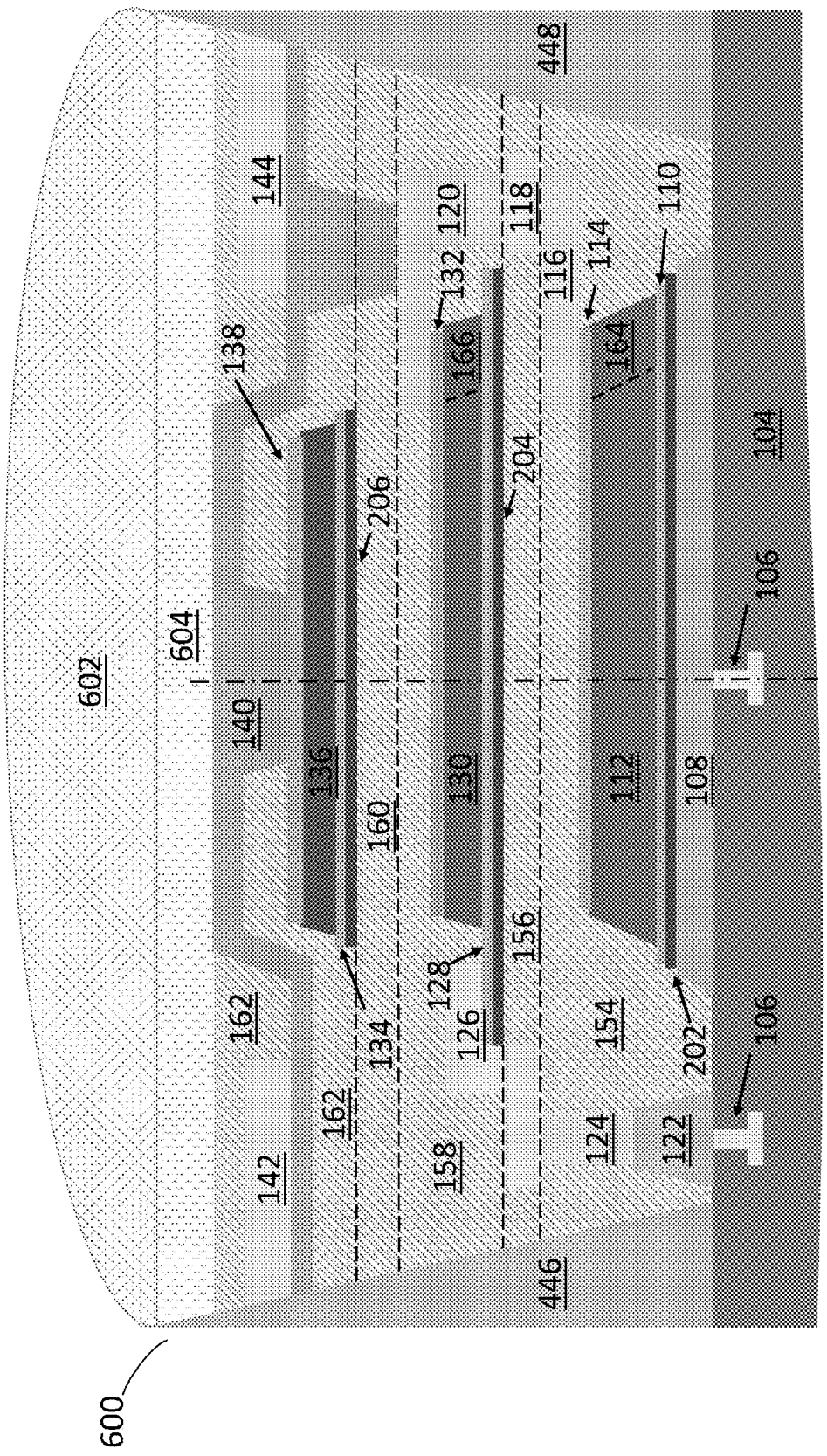
FIG. 6A is a cross-sectional view of a single pixel tri-color LED device 600 along the diagonal line 102 in FIG. 1A with a micro-lens above a reflective structure, in accordance with some embodiments.

FIG. 6A is a cross-sectional view of a single pixel tri-color LED device 600 along the diagonal line 102 in FIG. 1A with a micro-lens above a reflective structure, in accordance with some embodiments.

Figure 6B:
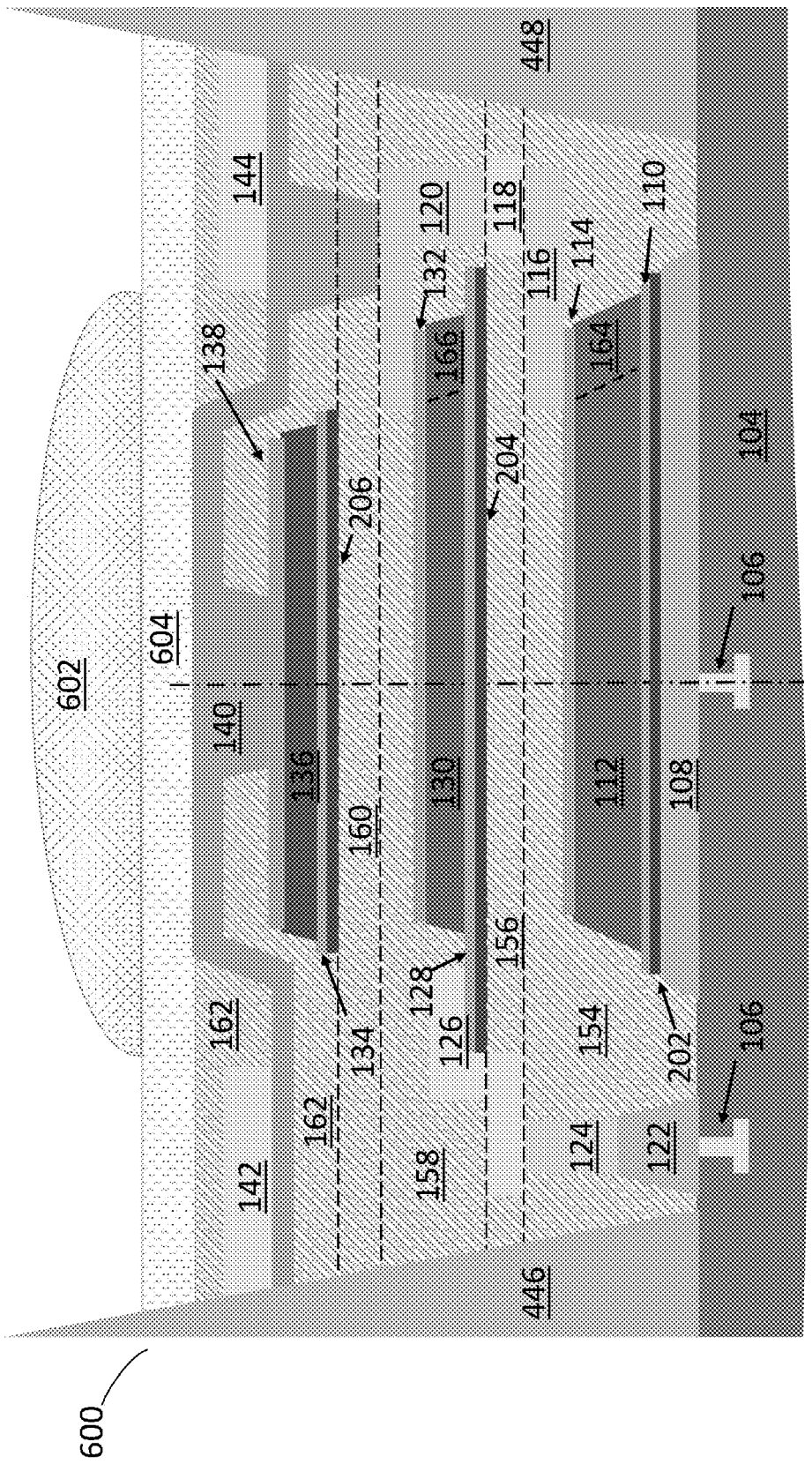
FIG. 6B is a cross-sectional view of a single pixel tri-color LED device 600 along the diagonal line 102 in FIG. 1A with a micro-lens within the area formed by a reflective structure, in accordance with some embodiments.

FIG. 6B is a cross-sectional view of a single pixel tri-color LED device 600 along the diagonal line 102 in FIG. 1A with a micro-lens within the area formed by a reflective structure, in accordance with some embodiments.

In some embodiments, although not all shown in FIGS. 6A-6B, the single pixel tri-color LED device 600 has similar structures as any one of the single pixel tri-color LED devices shown in FIGS. 1-5 with the addition of a micro-lens 602 formed above the top surface of the single pixel tri-color LED device to improve light emission efficiency. Light emitted from the single pixel tri-color LED device is emitted out through the top surface of the single pixel tri-color LED device without the micro-lens structure (the light emitting out area). In some embodiments, the micro-lens 602 is formed directly on the surface of the planarized insulation layer 162. In some embodiments, the micro-lens 602 is formed directly on the surface of the refractive structure 502 as shown in FIG. 5. In some embodiments, the micro-lens 602 covers and is in contract with the exposed surface of the top electrode, such as the N-electrode 140.

In some embodiments, an optional spacer 604 is formed on top of the light emitting out area at the bottom of the micro-lens 602. In some embodiments, the top surface of the spacer 604 is planarized. In some embodiments, the spacer 604 is formed directly on the surface of the planarized insulation layer 162. In some embodiments, the spacer 604 is formed directly on the surface of the refractive structure 502 as shown in FIG. 5. In some embodiments, the spacer 604 is the same as the refractive structure 502 as shown in FIG. 5 and integrated with the refractive structure 502. In some embodiments, the spacer 604 covers and is in contract with the exposed surface of the top electrode, such as the N-electrode 140.

In some embodiments, the spacer 604 is integrated with the micro-lens 602. In some embodiments, the spacer 604 is the same as the planarized insulation layer 162 and integrated with the planarized insulation layer 162.

In some embodiments, the micro-lens 602 is formed between the optical isolation structures, for example, a reflective structure or a reflective cup, such as 446 and 448 and the top surface of the single pixel tri-color LED device between the optical isolation structures without the micro-lens, i.e., the light emitting out area. In some embodiments, the top surface of the micro-lens 602 is above the top of the optical isolation structures as shown in FIG. 6A. When the top surface of the micro-lens 602 is above the top of the reflective structures, such as 446 and 448, substantially all the light emitted from the single pixel tri-color LED device including the reflective cup can be captured and focused by the micro-lens 602. In some embodiments, the top surface of the micro-lens 602 is the same or below the top of the optical isolation structures as shown in FIG. 6B. When the top surface of the micro-lens 602 is below or at the same level as the top of the reflective structures, such as 446 and 448, at least a portion of the light emitted from the micro-lens 602 is further reflected by the reflective structures or reflective cup which is confined in a certain area.

In some embodiments, the lateral dimension of the bottom of the micro-lens 602 is smaller than that of the light emitting out area. In some embodiments, the lateral dimension of the bottom of the micro-lens 602 is the same or greater than that of the light emitting out area. In some embodiments, the lateral dimension of the bottom of the micro-lens 602 is smaller than that of the top surface area of the top light emitting layer 136. In some embodiments, the lateral dimension of the bottom of the micro-lens 602 is the same or greater than that of the top surface area of the top light emitting layer 136.

In some embodiments, the optional spacer 604 is formed between the optical isolation structures, for example, a reflective cup, such as 446 and 448 and the top surface of the single pixel tri-color LED device without the micro-lens and the spacer, i.e., the light emitting out area. In some embodiments, the top surface of the spacer 604 is above the top of the optical isolation structures. In some embodiments, the top surface of the spacer 604 is the same or below the top of the optical isolation structures. In some embodiments, the top surface of the spacer 604 is above the top electrode, such as the N-electrode 140. In some embodiments, the top surface of the spacer 604 is the same or below the top electrode, such as the N-electrode 140. In some embodiments, the lateral dimension of the bottom of the micro-lens 602 is smaller than that of the top surface of the spacer 604. In some embodiments, the lateral dimension of the bottom of the micro-lens 602 is the same or greater than that of the top surface of the spacer 604.

In some embodiments, the micro-lens 602 changes the light path emitted from the single pixel tri-color LED device by making the light emitted from the LED device more focused or more divergent according to the design needs.

In some embodiments, the spacer 604 extends the light path emitted from the single pixel tri-color LED device. In some embodiments, the spacer 604 changes the light path emitted from the single pixel tri-color LED device by making the light emitted from the LED device more focused or more divergent according to the design needs.

In some embodiments, the micro-lens 602 can be made from a variety of materials that are transparent at the wavelengths emitted from the single pixel tri-color LED device. Example transparent materials for the micro-lens 602 include polymers, dielectrics and semiconductors. In some embodiments, the dielectric materials include one or more materials, such as silicon oxide, silicon nitride, silicon carbide, titanium oxide, zirconium oxide, aluminum oxide, etc. In some embodiments, the micro-lens 602 is made of photoresist.

The spacer 604 is an optically transparent layer that is formed to maintain the position of the micro-lens 602 relative to the pixel light source, such as the single pixel tri-color LED device, underneath it. The spacer 604 can be made from a variety of materials that are transparent at the wavelengths emitted from the pixel light source. Example transparent materials for the spacer 604 include polymers, dielectrics and semiconductors. In some embodiments, the dielectric materials include one or more materials, such as silicon oxide, silicon nitride, silicon carbide, titanium oxide, zirconium oxide, aluminum oxide, etc. In some embodiments, the spacer 604 is made of photoresist. In some embodiments, the spacer 604 and the microlens 602 have the same material. In some embodiments, the spacer 604 and the microlens 602 have different materials.

In some embodiments, the height of the micro-lens 602 is not more than 2 micrometers. In some embodiments, the height of the micro-lens 602 is not more than 1 micrometers. In some embodiments, the height of the micro-lens 602 is not more than 0.5 micrometers. In some embodiments, the width of the micro-lens 602 is not more than 4 micrometers. In some embodiments, the width of the micro-lens 602 is not more than 3 micrometers. In some embodiments, the width of the micro-lens 602 is not more than 2 micrometers. In some embodiments, the width of the micro-lens 602 is not more than 1 micrometers. In some embodiments, the ratio of the width and the height of the micro-lens 602 is more than 2.

In some embodiments, the shape of the micro-lens 602 is generally hemisphere. In some embodiments, the center axis of the micro-lens 602 is aligned with or the same as the center axis of the lens-less single pixel tri-color LED device.

For clarity, FIGS. 6A-6B show in some embodiments, in a display panel, each of single pixel light sources such as the tri-color LED device corresponds to one single micro-lens 602. It should be understood that a full display panel includes an array of many individual pixels and many micro-lenses. In addition, it may not have to be a one to one correspondence between micro-lenses and pixel light sources, nor a one to one correspondence between the pixel driver circuits (not shown) and the pixel light sources. Pixel light sources could also be made of multiple individual light elements, for example, single pixel LEDs connected in parallel. In some embodiments, one micro-lens 602 can cover several lens-less single pixel tri-color LED device.

The individual micro-lens 602 has a positive optical power and is positioned to reduce the divergence or viewing angle for light that is emitted from the corresponding pixel light source. In one example, the light beam emitted from the pixel light source has an original divergence angle that is fairly wide. In one embodiment, the original angle for the edge light ray of the light beam relative to a vertical axis orthogonal to the substrate 104 is greater than 60 degrees. The light is bent by the micro-lens 602, so that the new edge light ray now has a reduced divergence angle. In one embodiment, the reduced angle is less than 30 degrees. The micro-lenses in the micro-lens array are typically the same. Examples of micro-lenses include spherical micro-lenses, aspherical micro-lenses, Fresnal micro-lenses and cylindrical micro-lenses.

The micro-lens 602 typically has a flat side and a curved side. In FIG. 6, the bottom of the micro-lens 602 is the flat side, and the top of the micro-lens 602 is the curved side. Typical shapes of the base of each micro-lens 602 include circle, square, rectangle, and hexagon. The individual micro-lenses in a micro-lens array of a display panel may be the same or different: in shape, curvature, optical power, size, base, spacing, etc. In some embodiments, the micro-lens 602 conforms to the shape of the single pixel tri-color LED device. In one example, the shape of the base of the micro-lens 602 is the same as that of the single pixel tri-color LED device, for example, in FIGS. 6A-6B, they are both circular. In another example, the shape of the base of the micro-lens 602 is not the same as that of the single pixel tri-color LED device, for instance, the circular base of micro-lens has a same width as the single pixel tri-color LED, but a smaller area since the micro-lens base is a circle and the base of the single pixel tri-color LED is a square. In some embodiments, the micro-lens base area is the smaller than the area of the pixel light source. In some embodiments, the micro-lens base area is the same or larger than the area of the pixel light source.

In some embodiments, where the micro-lens 602 is formed, the spacer layer 604 can be formed with the micro-lens 602 in the same process with the same material. In some embodiments, the height of the pixel light source is larger than, the same, or smaller than the thickness of the spacer 604 measured from the bottom of the substrate 104.

The thickness of the spacer 604 is designed to maintain the proper spacing between the micro-lens 604 and the pixel light source. As one example, for a spacer that maintains an optical spacing between pixel light source and micro-lens that is more than a focal length of the micro-lens, an image of a single pixel is formed at a certain distance. As another example, for an optical spacer that maintains an optical spacing between pixel light source and micro-lens that is less than a focal length of the micro-lens, a reduced divergence/viewing angle is achieved. The amount of reduction of divergence/viewing angle also partly depends on the thickness of the spacer 604 measured from the top surface of the pixel light source. In some embodiments, the thickness of the spacer 604 measured from the top surface of the pixel light source is not more than 1 micrometer. In some embodiments, the thickness of the spacer 604 measured from the top surface of the pixel light source is not more than 0.5 micrometer. In some embodiments, the thickness of the spacer 604 measured from the top surface of the pixel light source is not more than 0.2 micrometer. In some embodiments, the thickness of the spacer 604 measured from the top surface of the pixel light source is about 1 micrometer.

In some embodiments, a brightness enhancement effect is achieved via integrating a micro-lens array onto the display panel. In some examples, the brightness with the micro-lens array is 4 times the brightness without the micro-lens array in the direction perpendicular to the display surface, due to light concentrating effect of micro-lenses. In alternative embodiments, the brightness enhancement factor can vary according to different designs of the micro-lens array and the optical spacer. For example, a factor greater than 8 can be achieved.

In some embodiments, a first method for fabricating a micro-lens includes a step of depositing a micro-lens material layer directly on at least the top of the pixel light source and in direct physical contact with the pixel light source. In some embodiments, the shape of the micro-lens material layer is conformed to the shape of the pixel light source and forms a hemisphere on the pixel light source. In some embodiments, the top of the pixel light source is generally flat and the shape of the formed micro-lens 602 is generally hemispheric. In some embodiments, the micro-lens material layer is deposited on the surface of the pixel light source, such as the planarized surface of the single pixel tri-color LED device, directly by chemical vapor deposition (CVD) technology. In some embodiments, the deposition parameters for the CVD process are: the power is about 0 W to about 1000 W, the pressure is about 100 milli-torr to about 2000 milli-torr, the temperature is around 23° C. to around 500° C., the gas flow is about 0 to about 3000 sccm (standard cubic centimeters per minute), and the time is about 1 hour to about 3 hours. In some embodiments, the material of the micro-lens material layer is a dielectric material such as silicon dioxide.

In some embodiments, the first method for fabricating a micro-lens further includes a step of patterning the micro-lens material layer to expose the electrode area of the substrate. In some embodiments, the step of patterning the micro-lens material layer includes an etching step. In some embodiments, the etching step includes a step of forming a mask on the surface of the micro-lens material. The etching step also includes a step of patterning the mask via a photolithography process, thereby forming openings in the mask and exposing the micro-lens material layer above the electrode area of the pixel light source. The etching step further includes a step of etching the portions of the micro-lens material layer exposed by the openings with the mask protection in place. In some embodiments, the exposed micro-lens material layer is etched by a wet etching method.

In some embodiments, a second method for fabricating a micro-lens also includes an optional step of forming a mark layer with marks for aligning to the micro-lens material layer deposited in later steps. For example, the mark layer is formed to align the units of the light emitting pixels to the micro-lens material layer in order to form the micro-lens at the center of the pixel light source. In some embodiments, the mark layer is formed to align the pixel light source to the layers above it especially the micro-lens material layer in order to form the micro-lens on the top of the pixel light source.

Figure 6C:
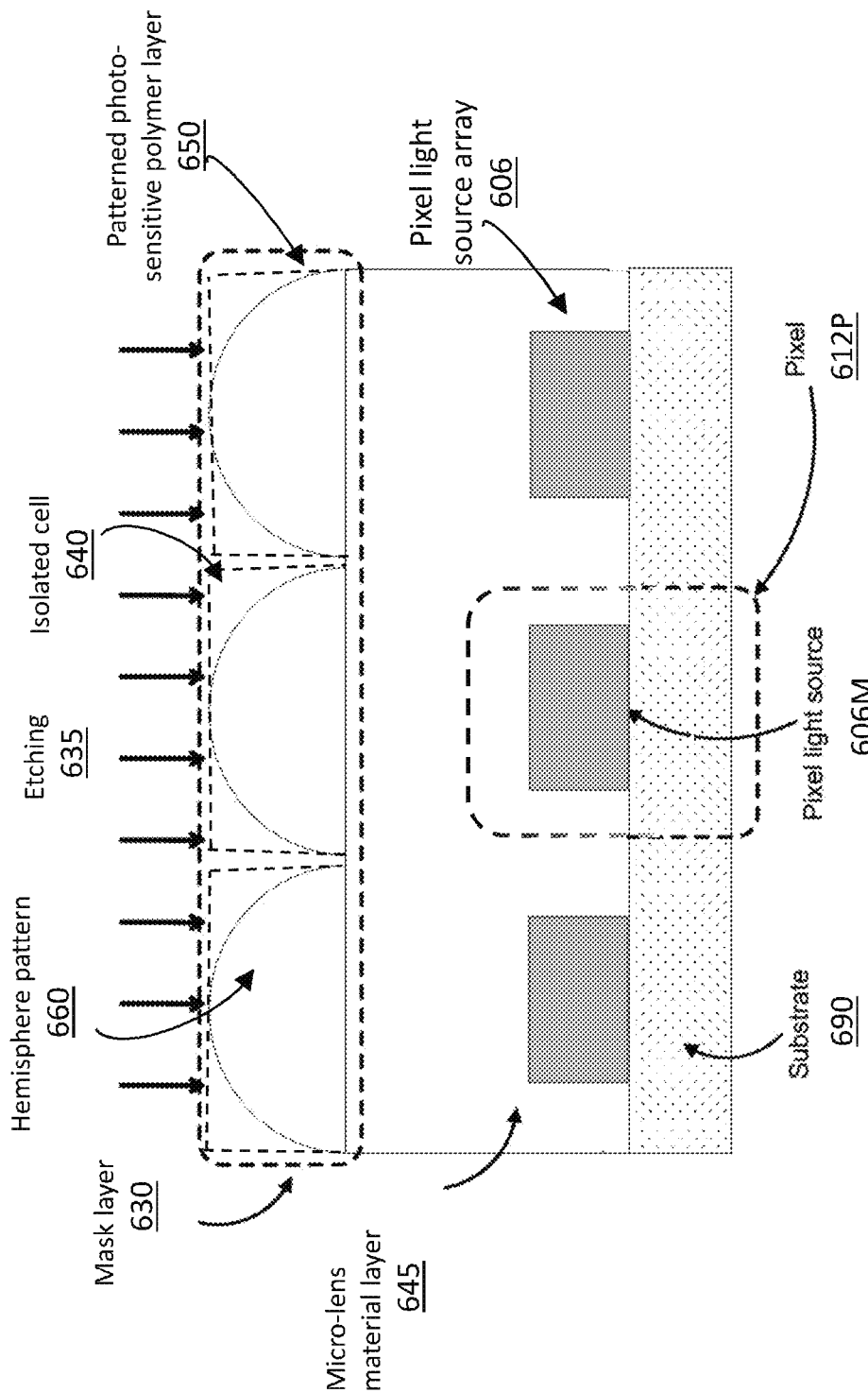
FIG. 6C illustrates a fabrication method to form a display panel integrated with a micro-lens array using top down pattern transfer, according to some embodiments.
Figure 6D:
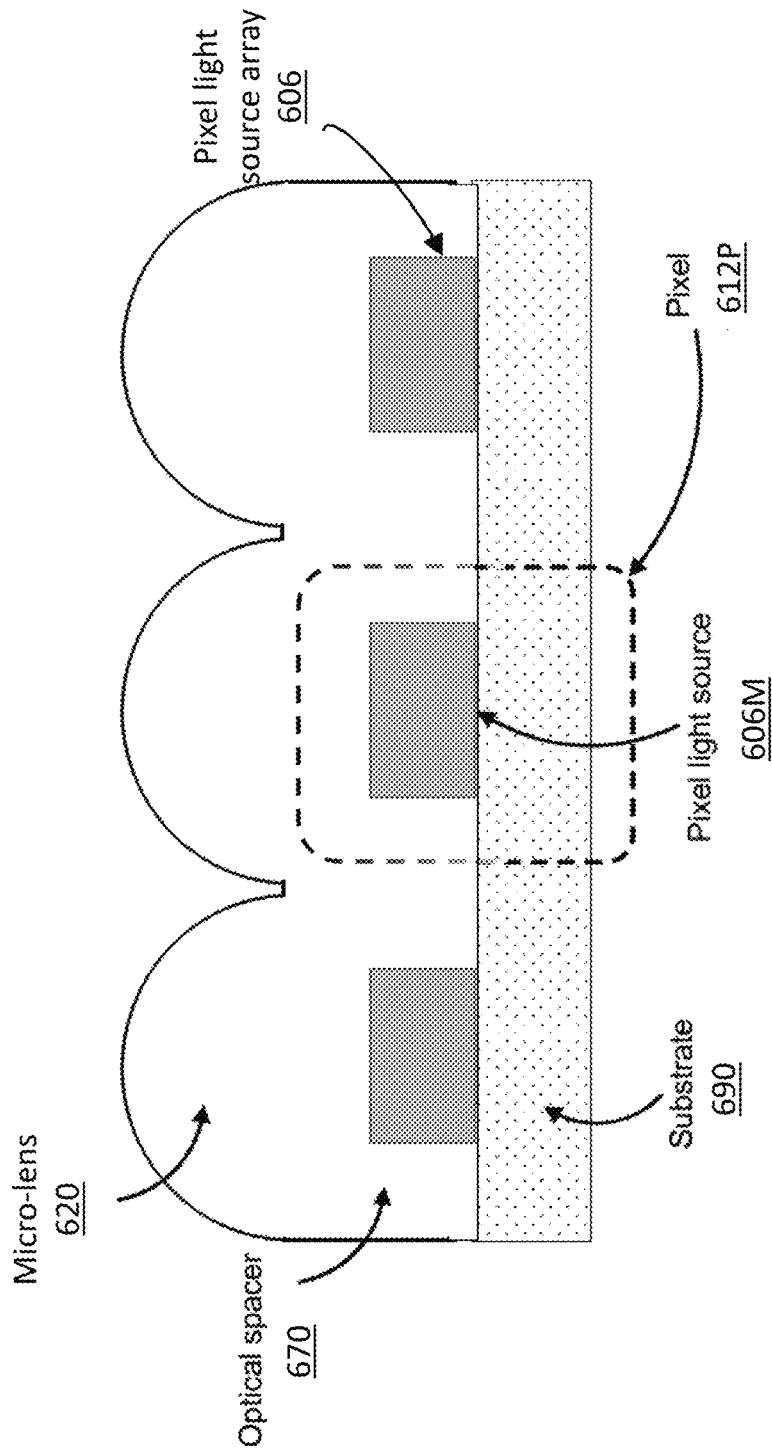
FIG. 6D illustrates a fabrication method to form a display panel integrated with a micro-lens array using top down pattern transfer, according to some embodiments.

The second method for fabricating a micro-lens further includes a step of depositing a micro-lens material layer directly on at least the top of one pixel light source. FIGS. 6C-6D further show a fabrication method to form a display panel integrated with a micro-lens array using top down pattern transfer, according to some embodiments. In some embodiments, the micro-lens material layer 645 covers the top of the pixel light source 606M as shown in FIG. 6C and the top surface of the micro-lens material layer 645 is flat. In some embodiments, the micro-lens material layer 645 is deposited on the top of the pixel light source array 606 by spin coating. In some embodiments, the material of the micro-lens material layer 645 is photoresist. In some embodiments, the material of the micro-lens material layer 645 is dielectric material such as silicon oxide.

The second method for fabricating a micro-lens further includes a step of patterning the micro-lens material layer from the top down, thereby forming at least a hemisphere in the micro-lens material layer as shown in FIGS. 6C-6D. In some embodiments, the patterning is carried out without passing through or etching to the bottom of the micro-lens material layer 645. In some embodiments, the hemisphere of the micro-lens 620 is placed above at least one pixel light source 606M.

In some embodiments, the step of patterning the micro-lens material layer from the top down further includes a first step of depositing a mask layer 630 on the surface of the micro-lens material layer 645 as shown in FIG. 6C.

The step of patterning the micro-lens material layer from the top down also includes a second step of patterning the mask layer 630 to form a hemisphere pattern in the mask layer 630. In some examples, the mask layer 630 is patterned by a photolithography process firstly and then a reflowing process. In some embodiments, the photo-sensitive polymer mask layer 630 is patterned into isolated cells 640, as shown in FIG. 6C in dotted rectangle cells, to prepare for the formation of the hemisphere pattern. As one example, the isolated cells 640 are patterned and formed via a photolithography process. The patterned photo-sensitive polymer mask layer 650 with the isolated cells 640 is then shaped into hemisphere pattern 660 using high temperature reflow process. In one approach, the isolated cells 640 are formed into isolated hemisphere pattern 660 via high temperature reflow. In some embodiments, the isolated hemisphere pattern 660 of one pixel is not in direct physical contact with a hemisphere pattern of an adjacent pixel. In some embodiments, the hemisphere pattern 660 of one pixel only contacts with a hemisphere pattern of an adjacent pixel at the bottom of the hemisphere pattern 660. The patterned photo-sensitive polymer mask layer 650 is heated to a temperature above the melting point of the polymer material for a certain time. After the polymer material melts into a liquefied state, the surface tension of the liquefied material will render it into a shape with a smooth curvature surface. For a cell with a round base of a radius R when the height of the cell is 2R/3, a hemispherical shape/pattern will be formed after the reflow process. FIG. 6C shows a display panel integrated with the array of hemisphere patterns 660 after the high temperature reflow process is finished. In some embodiments, the hemisphere pattern in the mask layer can be formed by other fabrication method including the fabrication method for the micro-lens described in the first method for fabricating a micro-lens. In some other embodiments, the hemisphere pattern in the mask layer can be formed using grayscale mask photolithography exposure. In some other embodiments, the hemisphere pattern in the mask layer can be formed via a mold/imprinting process.

The step of patterning the micro-lens material layer from the top down further includes a third step of using the hemisphere pattern 660 as a mask, etching the micro-lens material layer 645 to form the hemisphere in the micro-lens material layer 645. In some examples, etching the micro-lens material layer 645 is by a photolithography process. In some examples, etching the micro-lens material layer 645 is by a dry etching such as plasma etching process 635 as shown in FIG. 6C. In some embodiments, after the micro-lens material layer 645 is etched, the micro-lens material layer 645 is not etched through to expose the top surface of the pixel light source 606M as shown in FIGS. 6C-6D, thereby a spacer 670 is formed on the top of the pixel light source 606M or covering the top of the pixel light source 606M as shown in FIG. 6D.

The second method for fabricating a micro-lens further includes a step of patterning the micro-lens material layer to expose the electrode area (not shown in FIG. 6D) of the substrate. In some embodiments, the step of patterning the micro-lens material layer includes an etching step. In some embodiments, the etching step includes a step of forming a mask on the surface of the micro-lens material. The etching step also includes a step of patterning the mask via a photolithography process, thereby forming openings in the mask and exposing the micro-lens material layer above the electrode area of the pixel light source. The etching step further includes a step of etching the exposed micro-lens material layer with the mask protection. In some embodiments, the exposed micro-lens material layer is etched by a wet etching method. In some embodiments, the opening for an electrode is positioned outside the display array area.

As described above, FIGS. 6A to 6D show various fabrication methods to form a display panel integrated with a micro-lens array. It should be understood that these are merely examples, and other fabrication techniques can also be used.

Although the detailed description contains many specifics, these should not be construed as limiting the scope of the invention but merely as illustrating different examples and aspects of the invention. It should be appreciated that the scope of the invention includes other embodiments not discussed in detail above. For example, micro-lenses with different shape bases may also be used, such as square base or other polygon base.

Figure 7:
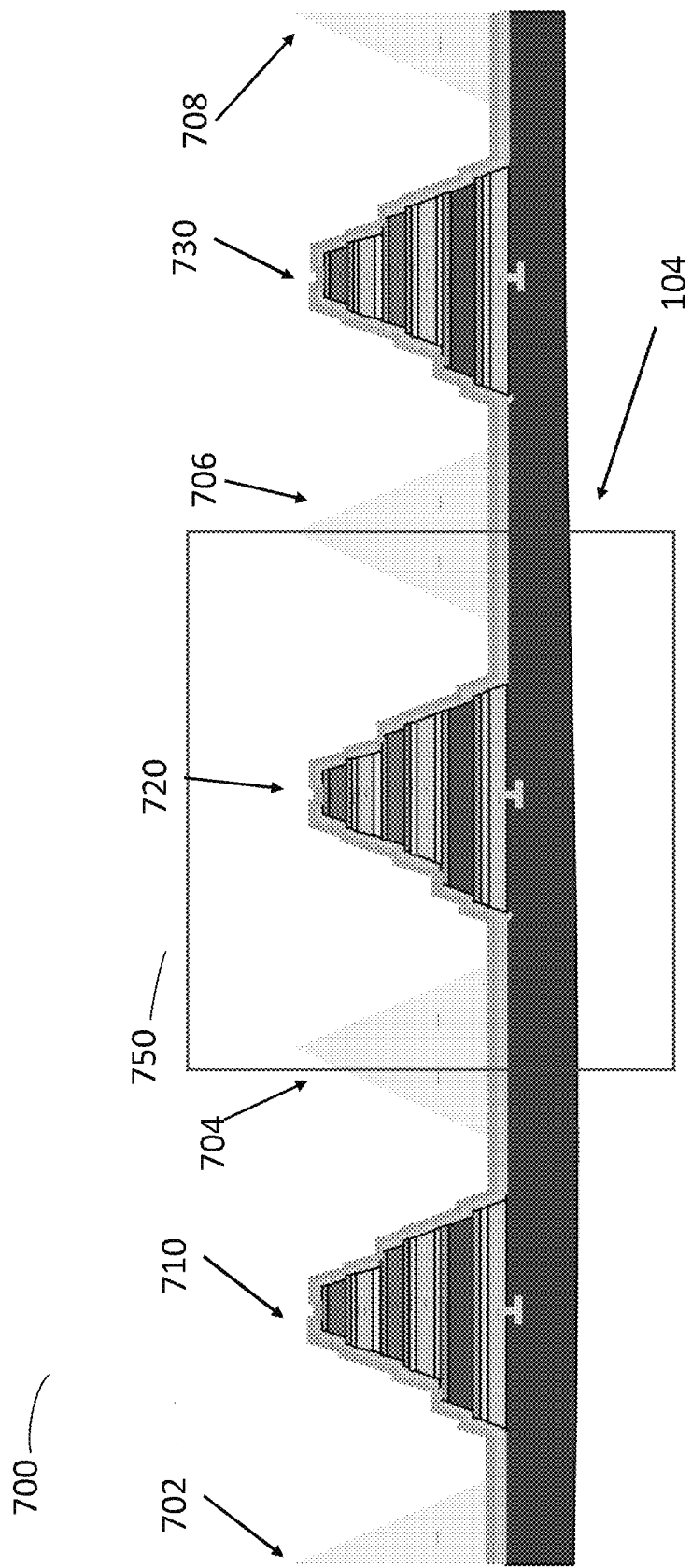
FIG. 7 is a cross-sectional view 700 of three single pixel tri-color LED devices 710, 720 and 730 along the diagonal line such as 102 in FIG. 1A on a substrate 104, in accordance with some embodiments.

FIG. 7 is a cross-sectional view 700 of three single pixel tri-color LED devices 710, 720 and 730 along the diagonal line such as 102 in FIG. 1A on a substrate 104, in accordance with some embodiments. In some embodiments, although not all shown in FIG. 7, each of the single pixel tri-color LED devices 710, 720 and 730 has similar structures as any one of the single pixel tri-color LED devices shown in FIGS. 1-6. The cross-sectional view for a single pixel tri-color LED device 710 within the rectangle 750 is equivalent to the cross sectional views as shown in any of the FIGS. 1-6 as described above.

In some embodiments, as shown in any of the embodiments in FIGS. 1-7, the single pixel tri-color LED device further comprises one or more reflective cup structures, such as 702, 704 and 706. The reflective structures, such as 702, 704 and 706 surrounds each of the single pixel tri-color LED devices 710, 720 and 730. The reflective cup may be formed on the semiconductor substrate 104 and positioned around the light emitting region where light from the single pixel tri-color LED device is emitted. For example, as shown in FIGS. 4A-4C, from the cross-sectional view along the 402 direction in FIG. 4B, and from the cross-sectional view along the 450 direction in FIG. 4C, the reflective cup may include four reflective cup parts 446, 448, 470 and 472. In some embodiments, the reflective cup parts 446, 448, 470 and 472 may be formed on the semiconductor substrate 404 and positioned around the light emitting region. In some embodiments, the reflective cup can isolate at least some of the light or substantially all the light emitted from the light emitting region. For example, as shown in FIGS. 4B-4C, when a height of the reflective cup is higher than a height of the light emitting region, the reflective cup parts 446, 448, 470 and 472 can isolate the at least some of the light or substantially all the light emitted from the light emitting region. Therefore, the reflective cup can suppress the inter-pixel light crosstalk and improve the overall contrast of LED displays. The reflection from the reflective cup also increases the light emitting efficiency and brightness by focusing the light emission into a certain direction.

In some embodiments, the height of the reflective cup may be larger than a height of the bottom LED structure, such as the red LED structure, larger than a height of the middle LED structure, such as the green LED structure, or larger than a height of the top LED structure, such as the blue LED structure. In some embodiments, the total height of the reflective cup may be larger than a height of the combined height of the bottom LED structure, such as the red LED structure, the middle LED structure, such as the green LED structure, and the top LED structure, such as the blue LED structure. In some embodiments, the total height of the reflective cup may be larger than the height of the single pixel tri-color LED device without the planarized layer. In some embodiments, the height of the reflective cup is between 0.5 micron to 50 microns. In some embodiments, the height of the reflective cup is between 1 micron to 20 microns. In some embodiments, the height of the reflective cup is between 2 microns to 10 microns. In a preferred embodiment, the height of the reflective cup is about 2.5 microns while the height of the single pixel tri-color LED device without the planarized layer is about 1.9 microns. Yet in some embodiments, the reflective cup parts 446, 448, 470 and 472 may have different heights. In some embodiments, the cross-section of a reflective cup part such as 446 or 448 is a triangle. In some embodiments, the cross-section of a reflective cup part such as 446 or 448 is a trapezoid with bottom edge longer than top edge. In some embodiments, the bottom width of the reflective cup part such as 446 or 448 is between 0.3 micron to 50 microns. In some embodiments, the bottom width of the reflective cup part such as 446 or 448 is between 0.5 micron to 25 microns. In a preferred embodiment, the bottom width of the reflective cup part such as 446 or 448 is about 1 micron. In some embodiments, the distance of the nearest edge of the bottom of the reflective cup part such as 446 or 448 to the nearest edge of bottom of the single pixel tri-color LED device, is between 0.2 micron to 30 microns. In some embodiments, the distance of the nearest edge of the bottom of the reflective cup part such as 446 or 448 to the nearest edge of bottom of the single pixel tri-color LED device, is between 0.4 micron to 10 microns. In a preferred embodiment, the distance of the nearest edge of the bottom of the reflective cup part such as 146/346/446 or 148/348/448 to the nearest edge of bottom of the single pixel tri-color LED device, such as the p-electrode connection structure 122 as shown in FIG. 3B, is about 0.6 micron.

In some embodiments, the distance between the centers of the adjacent reflective cup part such as 146/446 and 148/448 of the single pixel tri-color LED device, is between 1 micron to 50 microns. In a preferred embodiment, the distance between the centers of the adjacent reflective cup part such as 146/446 and 148/448 of the single pixel tri-color LED device, is about 5 microns.

In some embodiments, a divergence angle of 0° may correspond to light propagating perpendicular to a top surface of the light emitting region, and a divergence angle of 90° may correspond to light propagating parallel to the top surface of the light emitting region. Changing the geometry of the reflective cup can control the divergence angle of the light emitting from the light emitting region. Therefore, the reflective cup may reduce the divergence of the light emitted from the light emitting region, and enhance the brightness of the single pixel multi-color LED device. In some embodiments, sidewalls of the reflective cups 446-1, 448-1, 470-1 and 472-1 as shown in FIGS. 4B-4C may be straight, curved, wavy, multiline or the combination thereof. In some embodiments, steepness of the sidewalls of the reflective cup parts 446, 448, 470 and 472 may be designed to decrease the divergence of the light emitted from the light emitting region. For example, the angle of the sidewalls of the reflective cup parts 446, 448, 470 and 472 relative to a vertical axis perpendicular to the substrate 404 may be from at least 15 degrees to at most 75 degrees. The angle of the sidewalls of the reflective cup parts 446, 448, 470 and 472 relative to a vertical axis perpendicular to the substrate 404 may be from at least 5 degrees to at most 60 degrees. In some preferred embodiments, the angle of the sidewalls of the reflective cup parts 446, 448, 470 and 472 relative to a vertical axis perpendicular to the substrate 404 may be from at least 10 degrees to at most 50 degrees. The reflective cup can also reflect some of the light emitted from the light emitting region upwardly. For example, some of the light emitted from the light emitting region may arrive at and be reflected upward by the reflective cup parts 446, 448, 470 and 472.

In some embodiments, the reflective cup may comprise metal. In some embodiments, the reflective cup may comprise dielectric material such as silicon oxide. In some embodiments, the reflective cup may comprise photosensitive dielectric material. In some embodiments, the photosensitive dielectric material may comprise SU-8, photosensitive polyimide (PSPI), or BCB. In other embodiments, the reflective cup may comprise photoresist.

In some embodiments, the reflective cup can be fabricated by a combination of deposition, photo-lithography and etching processes. In some embodiments, the reflective cup may be fabricated by other suitable methods. In one approach, PSPI is formed into the reflective cup shape by a photolithography process. Then, a metal layer with a high reflectivity that includes one or more metals such as Pt, Rh, Al, Au, and Ag, a stacked DBR layer including TiO2/SiO2 layers, or any other layer with a total reflection property including a multi-layered Omni-Directional Reflector (ODR), or a combination thereof, is deposited on the whole surface of the multi-color LED device including the reflective cup as a reflective layer by vapor deposition. Next, the reflective layer is shaded by a photoresist in the reflective cup area while the reflective layer on the other region is etched, whereby the light emitting region is exposed.

In a another approach, an isolation layer including one or more of SiO2, Silicon Nitride, or SU8, which is thicker than the stacked LED structures, is deposited or spinned on the stacked LED structures. Then, using a photoresist as a mask, the isolation layer is etched and formed into a reflective cup shape. Next, a metal layer with a high reflectivity that includes one or more metals such as Pt, Rh, Al, Au, and Ag, a stacked DBR layer including TiO2/SiO2 layers, or any other layer with a total reflection property including a multi-layered Omni-Directional Reflector (ODR), or a combination thereof, is deposited on the whole surface of the multi-color LED device including the reflective cup as a reflective layer by vapor deposition. Finally, the reflective layer is shaded by a photoresist in the reflective cup area while the reflective layer on the other region is etched, whereby the light emitting region is exposed.

In some embodiments, as shown in FIGS. 1-6 (except FIGS. 4B-4C), the single pixel tri-color LED device further comprises one or more top electrodes (e.g., top electrodes 140/440, 142 and 144) integrated with the reflective cup. The one or more top electrodes may electrically connect with the top electrode (layer) 140/440. For example, as shown in FIG. 1B, the electrodes 142 and 144 can be integrated with the reflective cup, e.g., the reflective cup parts 146/446 and 148/448, respectively. Both of the top electrodes 142 and 144 may extend towards the light emitting region and electrically connect with the top electrode (layer) 140/440. The reflective cup may perform as a common P-electrode or N-electrode for the single pixel tri-color LED device with the adoption of the one or more top electrodes. For example, when the top electrode (layer) 140/440 electrically connect with each of the LED structures (e.g. the LED structures including the light emitting layers 112/412, 130/430 and 136/436) and optionally the top electrodes 142 and 144, the reflective cup may perform as a common P-electrode or N-electrode of the single pixel tri-color LED device.

In some embodiments, the reflective cup further includes one or more reflective coatings. The one or more reflective coatings may be disposed on one or more sidewalls of the reflective cup, e.g., the sidewalls of the reflective cup 446-1, 448-1, 470-1 and 472-1. A bottom of each of the one or more reflective coatings does not contact the each of the LED structures, e.g. the red, green and blue LED structures. The one or more reflective coatings can reflect light emitted from the light emitting region and therefore enhance the brightness and luminous efficacy of micro-LED panels or displays. For example, the light emitted from the light emitting region may arrive at the one or more reflective coatings and may be reflected upward by the one or more reflective coatings.

The one or more reflective coatings, together with the reflective cup, can utilize reflection direction and/or reflection intensity of the light emitted from the light emitting region. For instance, the sidewalls of the reflective cup 446-1, 448-1, 470-1 and 472-1 be inclined at a certain angle, and therefore the one or more reflective coatings disposed on the sidewalls of the reflective cup 446-1, 448-1, 470-1 and 472-1 are inclined at the same angle as the sidewalls of the reflective cup 446-1, 448-1, 470-1 and 472-1. When the light emitted from the light emitting region arrives at the one or more reflective coatings, the light emitted from the light emitting region would be reflected by the one or more reflective coatings in accordance with the angle of the sidewalls of the reflective cup 446-1, 448-1, 470-1 and 472-1.

Materials of the one or more reflective coatings may be highly reflective with a reflectivity greater than 60%, 70% or 80%, and therefore most of the light emitted from the light emitting region can be reflected. In some embodiments, the one or more reflective coatings may comprise one or more metallic conductive materials with high reflectivity. In these embodiments, the one or more metallic conductive materials may comprise one or more of aluminum, gold or silver. In other some embodiments, the one or more reflective coatings can be multi-layered. To be more specific, the one or more reflective coatings may comprise a stack of one or more reflective material layers and one or more dielectric material layers. For example, the one or more reflective coatings may comprise one reflective material layer and one dielectric material layer. In other embodiments, the one or more reflective coatings may comprise two reflective material layers and one dielectric material layer positioned between the two reflective material layers. Yet in some other embodiments, the one or more reflective coatings may comprise two dielectric material layers and one reflective material layer positioned between the two dielectric material layers. In some embodiments, the multi-layered structure may comprise two or more metal layers, which may comprise one or more of TiAu, CrAl or TiWAg.

In some embodiments, the one or more reflective coatings may be multi-layered Omni-Directional Reflector (ODR), which comprises a metal layer and a Transparent and Conductive Oxides (TCO) layer. For example, the multilayered structure may comprise a dielectric material layer, a metal layer and a TCO layer. In some embodiments, the one or more reflective coatings may comprise two or more dielectric material layers, which are disposed alternately to form a Distributed Bragg Reflector (DBR). For example, the one or more reflective coatings may comprise a dielectric material layer, a metal layer and a transparent dielectric layer. The transparent dielectric layer may comprise one or more of Sift, Si3N4, Al2O3, or TiO2. The one or more reflective coatings may further comprise a dielectric material layer, a TCO and a DBR. In other embodiments, the one or more reflective coatings may comprise one or more metallic conductive materials with high reflection. In these embodiments, the one or more metallic conductive materials may comprise one or more of aluminum, gold or silver. In some embodiments, the reflective coatings may have the same the composition, structure and fabrication process as the reflective layers, such as 109, 127, and 135 below the light emitting layers as described above.

In some embodiments, the one or more reflective coatings can be conductive, and then the one or more reflective coatings may also perform function as electrical contacts to the single pixel multi-color LED device. For example, the top electrode (layer) 140 may be electrically connected with the one or more reflective coatings. For another example, one or more reflective coatings may be electrically connect with the one or more transparent electrode contact layers 114, 132 and 138. The one or more reflective coatings may be patterned to not block light emitted from the light emitting region. The one or more reflective coatings may then also function as the common electrode for the LED structures within a single pixel multi-color LED device and/or the LEDs on a display panel.

In some embodiments, a top conductive layer for connecting to the electrodes is formed on the top of multi-color LED device, and the top conductive layer is electrically connected with the reflective cup. In some embodiments, the top conductive layer directly contacts with a top of the reflective cup or a bottom of the reflective cup.

In some embodiments, a bottom dielectric layer is formed between a bottom of the reflective cup and the semiconductor substrate.

In some embodiments, the one or more of reflective coatings can be produced by one or more of electron beam deposition or sputtering process.

Figure 8:
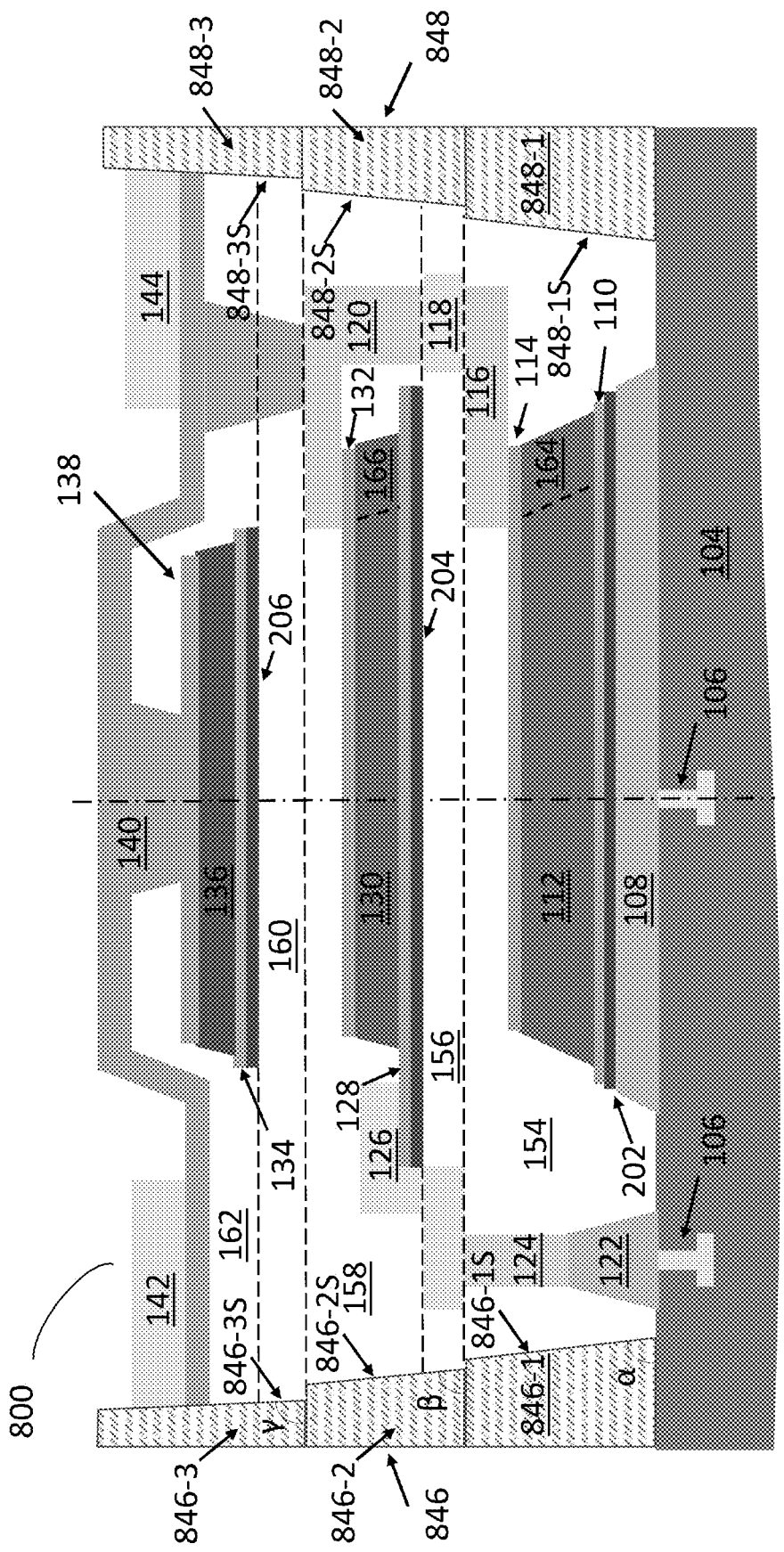
FIG. 8 is a cross-sectional view of a single pixel tri-color LED device 800 with a stair-shaped reflective cup, along the diagonal line such as 102 in FIG. 1A, in accordance with some embodiments.

In some embodiments, the reflective cup can have the shape of a stair like structure. FIG. 8 is a cross-sectional view of a single pixel tri-color LED device 800 with a stair-shaped reflective cup, along the diagonal line such as 102 in FIG. 1A, in accordance with some embodiments. In some embodiments, although not all shown in FIG. 8, the single pixel tri-color LED device 800 has similar structures as any one of the single pixel tri-color LED devices shown in FIGS. 1-7 with the reflective cup parts, such as 146/446, and 148/448, having a stair-shaped reflective cup. The stair-shaped reflective cup may be formed on the semiconductor substrate 104/404 and positioned around the light emitting region. For example, as shown in FIG. 8, from the cross-sectional view along the diagonal line such as 402 in FIG. 4A, the stair-shaped reflective cup may include two stair-shaped reflective cup parts 846 and 848. The stair-shaped reflective cup parts 846 and 848 may be formed on the semiconductor substrate 104/404, and positioned around the light emitting region. In some embodiments, the stair-shaped reflective cup can isolate at least some or substantially all of the light emitted from the light emitting region. For example, as shown in FIG. 8, when a height of the stair-shaped reflective cup is higher than a height of the light emitting region, the stair-shaped reflective cup parts 846 and 848 can isolate the at least some or substantially all of the light emitted from the light emitting region. Therefore, the stair-shaped reflective cup can suppress the inter-pixel light crosstalk and improve the overall contrast of LED displays.

In some embodiments, the stair-shaped reflective cup includes one or more stair structures such as 846-1, 846-2, 846-3, 848-1, 848-2, and 848-3. In some embodiments, the height each of the stair of the reflective cup may be the same as a height of the LED structure in the same vertical level. For example, the stair structures 846-1 and 848-1 each have the same height as the bottom LED structure. The stair structures 846-2 and 848-2 each have the same height as the middle LED structure. The stair structures 846-3 and 848-3 each have the same height as the top LED structure. Yet in some embodiments, the stair-shaped reflective cup parts 846 and 848 may have the same or different heights. The stair-shaped reflective cup can also reflect some of the light emitted from the light emitting region upwardly. For example, some of the light emitted from the light emitting region may arrive at and be reflected by the stair-shaped reflective cup parts 846 and 848 upwardly for each LED structures within the single pixel multi-color LED device in a different pattern according to the design. For example, each of the stair can adjust the focus for the light emitted (especially horizontally) in a different pattern. For example, focusing the red light more at the center and the blue light more at the edge of the light beam from the LED device. Therefore, it may reduce the divergence of the light emitted from the light emitting region, and enhance the brightness of the single pixel multi-color LED device.

In some embodiments, the stair-shaped reflective cup structure may include or form a cavity surrounding the light emitting region. The cavity may include the area surrounded by the stair-shaped reflective cup and above the semiconductor substrate 104. The cavity may include an inner sidewall, and the inner sidewall may include a plurality of inclined surfaces. For example, as shown in FIG. 8, the stair-shaped reflective cup may include or surround the cavity, which may include the area between the stair-shaped reflective parts 846 and 848 and above the semiconductor substrate 104. The light emitting region may be positioned in the cavity, and surrounded by the stair-shaped reflective cup parts 846 and 848.

In some embodiments, a top of the cavity is higher than a top of the light emitting region. For example, the top of the cavity included in the stair-shaped reflective cup (e.g., the stair-shaped reflective cup parts 846 and 848) is higher than the top of the light emitting region. In some embodiments, the cavity may include an inner sidewall, and the inner sidewall may include a plurality of inclined surfaces (e.g., inclined surfaces 846-1S, 846-2S, 846-3S, 848-1S, 848-2S, and 848-3S). In some embodiments, inclined angles (relative to the surface of the substrate 104) of the plurality of inclined surfaces from bottom to top of the cavity become greater. For example, as shown in FIG. 8, the angles of the inclined surfaces 846-1S, 846-2S, 846-3S are indicated as inclined angles $\alpha$, $\beta$ and $\gamma$, respectively. Inclined angles of the inclined surfaces 846-1S, 846-2S, and 846-3S may be the same as the inclined angles of inclined surfaces 848-1S, 848-2S, and 848-3S, respectively. In some embodiments, the inclined angles $\alpha$, $\beta$ and $\gamma$ stay the same or become greater from bottom to top of the cavity. In some preferred embodiments, the inclined angles $\alpha$, $\beta$ and $\gamma$ may become smaller from bottom to top of the cavity, therefore the light emitted from the LED device may be more divergent toward the upper portion of the LED device. Yet in some embodiments, the inclined angles $\alpha$, $\beta$ and $\gamma$ may be any angle according to the design. In some embodiments, the cavity may be filled with materials containing silicon, e.g., silicon oxide, and the filling can improve optical refraction, increase transparency, and/or enhance ultraviolet aging resistance and thermal aging resistance. In some embodiments, the cavity may be empty or vacuumed. In some embodiments, the inclined surfaces (e.g., inclined surfaces 846-1S, 846-2S, 846-3S, 848-1S, 848-2S, and 848-3S) may be straight, curved, wavy, multiline or the combination thereof.

In some embodiments, the cavity may include a plurality of sub-cavities. The sub-cavities may be formed or surrounded by respective inclined surfaces and may have different dimensions in the horizontal direction. For example, there can be three sub-cavities as shown in FIG. 8. The sub-cavity at the bottom of the cavity may include the area surrounded or restrained by the semiconductor substrate 104/404, the inclined surfaces 846-1S and 848-1S, and bottom of the bonding layer 156/456. The sub-cavity in middle of the cavity may include the area surrounded or restrained by the bottom of the bonding layer 156/456, the inclined surfaces 846-2S and 848-2S, and bottom of the bonding layer 160/460. The sub-cavity on top of the cavity may include the area surrounded or restrained by the bottom of the bonding layer 160/460, the inclined surfaces 846-3S and 848-3S, and the top electrode layer 140/440 (or the opening top of the top of the stair structures 846-3 and 848-3). In some embodiments, inclined surfaces of the sub-cavities are not arranged in a same plane. For example, as shown in FIG. 8, the sub-cavities may be formed or surrounded by the plurality of inclined surfaces 846-1S, 846-2S, 846-3S, 848-1S, 848-2S, and 848-3S and may have different dimensions in the horizontal direction. In some embodiments, the inclined surfaces 846-1S, 846-2S, and 846-3S may not be arranged in the same plane, and the inclined surfaces 848-1S, 848-2S, and 848-3S may not be arranged in a same plane. For example, the inclined surfaces 846-1S, 846-2S, and 846-3S are stagger arranged in different planes in vertical direction.

In some embodiments, heights of the sub-cavities may be different. For example, a height of the sub-cavity in the middle of the cavity may be less than heights of other sub-cavities. A height of the sub-cavity at the top of the cavity may be larger than a height of the sub-cavity at the bottom of the cavity. Yet in some embodiments, each of the color LED structures is in a respectively different one of the sub-cavities. For example, the bottom red LED structure is in the sub-cavity at the bottom of the cavity and the top blue LED structure is in the sub-cavity at the top of the cavity. The middle green LED structure is in the sub-cavity in the middle of the cavity. In some embodiments, the sub-cavities may be filled with materials containing silicon, e.g., silicon oxide, and the filling can improve optical refraction, increase transparency, and/or enhance ultraviolet aging resistance and thermal aging resistance. In some embodiments, materials of the sub-cavities may be different. For example, the material of the sub-cavity at the top of the cavity may be filled with silicon oxide and the material of the sub-cavity at the bottom of the cavity may be filled with epoxy methyl silicon. In some embodiments, the sub-cavities may be empty or vacuumed.

In some embodiments, the stair-shaped reflective cup may comprise metal. In some embodiments, the stair-shaped reflective cup may comprise dielectric material such as silicon dioxide. In some embodiments, the stair-shaped reflective cup may comprise photosensitive dielectric material. In some embodiments, the photosensitive dielectric material may comprise SU-8 or photosensitive polyimide (PSPI). In other embodiments, the stair-shaped reflective cup may comprise photoresist. In some embodiments, the fabrication processes of the stair-shaped reflective cup are similarly described above with reference to the reflective cup.

In some embodiments, the single pixel multi-color LED device 800 further comprise one or more reflective coatings. The one or more reflective coatings may be disposed on one or more inclined surfaces of the stair-shaped reflective cup, e.g., the inclined surfaces 846-1S, 846-2S, 846-3S, 848-1S, 848-2S, and 848-3S. A bottom of each of the one or more reflective coatings does not contact the each of the LED structures, e.g. the red, green and blue LED structures. The one or more reflective coatings can reflect light emitted from the light emitting region and therefore enhance the brightness and luminous efficacy of micro-LED panels or displays. For example, the light emitted from the light emitting region may arrive at the one or more reflective coatings and may be reflected upwardly by the one or more reflective coatings.

The one or more reflective coatings, together with the stair-shaped reflective cup, can utilize reflection direction and/or reflection intensity of the light emitted from the light emitting region. For instance, the inclined angles $\alpha$, $\beta$ and $\gamma$ of their respectively inclined surfaces 846-1S, 846-2S, and 846-3S may become smaller from bottom to top of the cavity, and therefore the one or more reflective coatings disposed on the inclined surfaces 846-1S, 846-2S, and 846-3S are inclined at the same angles as the inclined surfaces 846-1S, 846-2S, and 846-3S. When the light emitted from the light emitting region arrives at the one or more reflective coatings, the light emitted from the light emitting region would be reflected by the one or more reflective coatings in accordance with the inclined angles α, β and γ. The inclined angles α, β and γ may become greater, same or smaller, or the inclined angles α, β and γ otherwise are chosen according to a specific design.

Materials of the one or more reflective coatings may be highly reflective with a reflectivity greater than 60%, 70% or 80%, and therefore most of the light emitted from the light emitting region can be reflected. In some embodiments, the materials of the one or more reflective coatings are similarly described above with the reference to the reflective cup. In some embodiments, the materials of one or more reflective coatings disposed on each of inclined surfaces may be different. For example, the material of the reflective coating disposed on the inclined surface 846-1S may be different than the materials of the reflective coatings disposed on the inclined surfaces 846-2S, and 846-3S respectively.

In some embodiments, the one or more of reflective coatings can be produced by one or more of electron beam deposition or sputtering process. In some embodiments, each of the one or more stair structures such as 846-1, 846-2, 846-3, 848-1, 848-2, and 848-3 are formed layer by layer in a multi-step process. For example, the stair structures such as 846-1 and 848-1 are formed in the same step either before or after the planarized layer 154 is formed. The stair structures such as 846-2 and 848-2 are formed in the same step either before or after the planarized layer 158 is formed. The stair structures such as 846-3 and 848-3 are formed in the same step either before or after the planarized layer 162 is formed. In some embodiments, especially when layer by layer planarization is involved in the process for forming the single pixel tri-color LED device, the stair structures are formed as a result of the layer by layer process and the dislocation of the bonding of the different planarized layers including the LED structures. In some embodiments, there may be gaps (not shown in FIG. 8) between the different stair structures such as 846-1, 846-2, and 846-3 as a result of the layer by layer process and the dislocation of the bonding of the different planarized layers including the LED structures.

Figure 9:
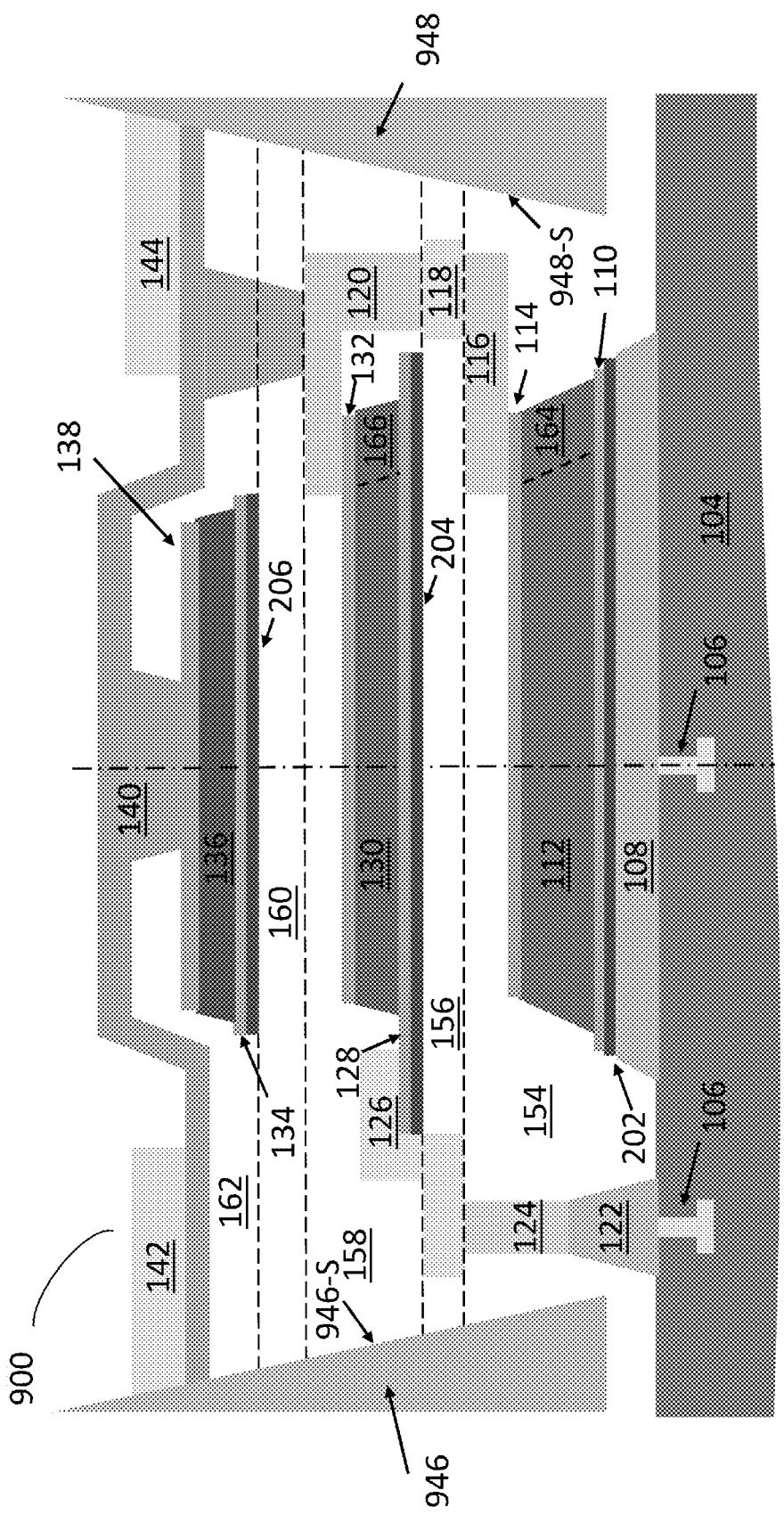
FIG. 9 is a cross-sectional view of a single pixel tri-color LED device 900 with a floating reflective cup, along the diagonal line such as 102 in FIG. 1A, in accordance with some embodiments.

In some embodiments, the reflective cup can have a floating structure. FIG. 9 is a cross-sectional view of a single pixel tri-color LED device 900 with a floating reflective cup, along the diagonal line such as 102 in FIG. 1A, in accordance with some embodiments. In some embodiments, although not all shown in FIG. 9, the single pixel tri-color LED device 900 has similar structures as any one of the single pixel tri-color LED devices shown in FIGS. 1-8 with the floating reflective cup parts, such as 946 and 948.

In some embodiments, the floating reflective cup may surround the light emitting region and the bottom of the reflective cup does not directly contact the semiconductor substrate 104/404. For example, as shown in FIG. 9, the reflective cup parts 946 and 948 surround the light emitting region, and bottoms of the reflective cup parts 946 and 948 do not directly contact the semiconductor substrate 104, e.g., there is a gap between the bottom of the reflective cup and the substrate 104/404. In some embodiments, the gap is filled by the planarized insulation layer 154. In some embodiments, the light emitted from the light emitting region may arrive at and be reflected upward by the reflective cup. For example, as shown in FIG. 9, the light emitted from the light emitting region, including light emitting from sidewalls and/or tops of the LED structures, may arrive at the reflective cup parts 946 and 948, and be reflected upward by the reflective cup parts 946 and 948. Therefore, it may reduce the divergence of the light emitted from the light emitting region, and enhance the brightness of the single pixel multi-color LED device.

In some embodiments, the distance between the bottom of the reflective cup and the top surface of the semiconductor substrate 104/404 can be adjusted according to the design needs. In some embodiments, the distance between the bottom of the reflective cup and the top surface of the semiconductor substrate 104/404 may be adjusted during manufacturing process of the single pixel multi-color LED device and the display panel.

When manufacture of the single pixel multi-color LED device 900 is completed, the distance is fixed and not adjustable. In other embodiments, the distance between the bottom of the reflective cup and the top surface of the semiconductor substrate 104/404 may be specifically selected during the design process, and will be fixed after manufacturing the single pixel multi-color LED device 900 and the display panel. In some embodiments, the distance between the bottom of the reflective cup, such as the parts 946 and 948, to the top surface of the substrate 104 the may be the same or smaller than the distance between the top surface of the bonding layer 108 at the bottom of the light emitting layer 112 to the top surface of the substrate 104. In some embodiments, the distance between the bottom of the reflective cup, such as the parts 946 and 948, to the top surface of the substrate 104 the may be larger than the distance between the top surface of the bonding layer 108 at the bottom of the light emitting layer 112 to the top surface of the substrate 104. By adjusting the gap of the floating reflective cup, certain light from a particular portion of the single pixel multi-color LED device 900 may not be reflected or isolated, that could make the light more focused at selected portions of the device 900.

In some embodiments, the distance between the bottom of the reflective cup and the top surface of the semiconductor substrate 104 can be less than 0.5 micrometer. In some embodiments, the distance between the bottom of the reflective cup and the top surface of the semiconductor substrate 104 can be less than 1 micrometer. In some embodiments, the distance between the bottom of the reflective cup and the top surface of the semiconductor substrate 140 can be less than 2 micrometers. In some embodiments, the distance between the bottom of the reflective cup and the top surface of the semiconductor substrate 104 can be less than 5 micrometers. In some embodiments, the distance between the bottom of the reflective cup and the top surface of the semiconductor substrate 104 can be less than 10 micrometers. In some embodiments, the distance between the bottom of the reflective cup and the top surface of the semiconductor substrate 104 can be less than 20 micrometers. In some embodiments, the distance between the bottom of the reflective cup and the top surface of the semiconductor substrate 104 can be less than 50 micrometers. In some embodiments, the distance between the bottom of the reflective cup and the top surface of the semiconductor substrate 104 can be less than 75 micrometers. In some embodiments, the distance between the bottom of the reflective cup and the top surface of the semiconductor substrate 104 can be less than 100 micrometers. Generally, the distance between bottom of the reflective cup and top surface of the semiconductor substrate 104 is decided by the height of the bottom of the light emitting layer, such as the thickness of metal bonding layer. In a preferred embodiment, the distance between bottom of the reflective cup and top surface of the semiconductor substrate 104 is not more than 20 micrometers.

In some embodiments, the reflective cup can isolate at least some of the light emitted from the light emitting region. For example, as shown in FIG. 9, when a height of the reflective cup is higher than a height of the light emitting region, the reflective cup parts 946 and 948 can isolate the at least some of the light emitted from the light emitting region. Therefore, the reflective cup can suppress the inter-pixel light crosstalk and improve the overall contrast of LED displays. The floating reflective cup has the same or similar composition, shape and fabrication process (except the position and location) as the reflective cups as described above.

FIGS. 1-9 only illustrate the single pixel multi-color LED devices according to some embodiments. In other embodiments, the reflective cup can be different shapes when seen from a top view or side view. That is, the sidewalls of the reflective cup surrounding the light emitting region may be circle, triangle, square, rectangular, pentagonal, hexagonal and octagonal. The sidewalls of the reflective cup may surround one light emitting region or one single pixel multi-color LED device, or a group of light emitting regions or a group of single pixel multi-color LED devices. For example, the sidewalls of the reflective cup may surround two or more light emitting regions or single pixel multi-color LED devices which are arranged in the same plane.

An array of the single pixel multi-color LED devices, each of which may comprise a reflective cup, can be utilized. Each of the reflective cup can have different shapes, when seen from a top view or plan view. For example, a reflective cup of a first single pixel multi-color LED device may be circle, and a reflective cup of an adjacent single pixel multi-color LED device may be square. In addition, the reflective cups can be electrically isolated from each other. The reflective cups can also be isolated if buffer space is provided between adjacent reflective cups or if the material of the reflective cups may not extend all the way to the boundary with the adjacent reflective cup. Alternately, a reflective coating form on the sidewall of the reflective cup can simply be extended to cover the interstitial areas between adjacent reflective cups. In another embodiment, the reflective cups can be electrically connected with each other by a common electrode such as a top electrode.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

Further embodiments also include various subsets of the above embodiments including embodiments shown in FIGS. 1-9 combined or otherwise re-arranged in various other embodiments.

Various design aspects of the single pixel multi-color LED device, such as the dimensions of the layers (e.g., width, length, height, and cross-sectional area of each layer), the dimension of the electrodes, size, shape, spacing, and arrangement of the two or more LED structure layers, bonding layers, reflective layers and the conductive layers, and the configuration between the integrated circuits, pixel driver and electrical connections are selected (e.g., optimized using a cost or performance function) for obtaining the desired LED characteristics. LED characteristics that vary based on the above design aspects include, e.g., size, materials, cost, fabrication efficiency, light emission efficiency, power consumption, directivity, luminous intensity, luminous flux, color, spectrum and spatial radiation pattern.

Figure 10A:
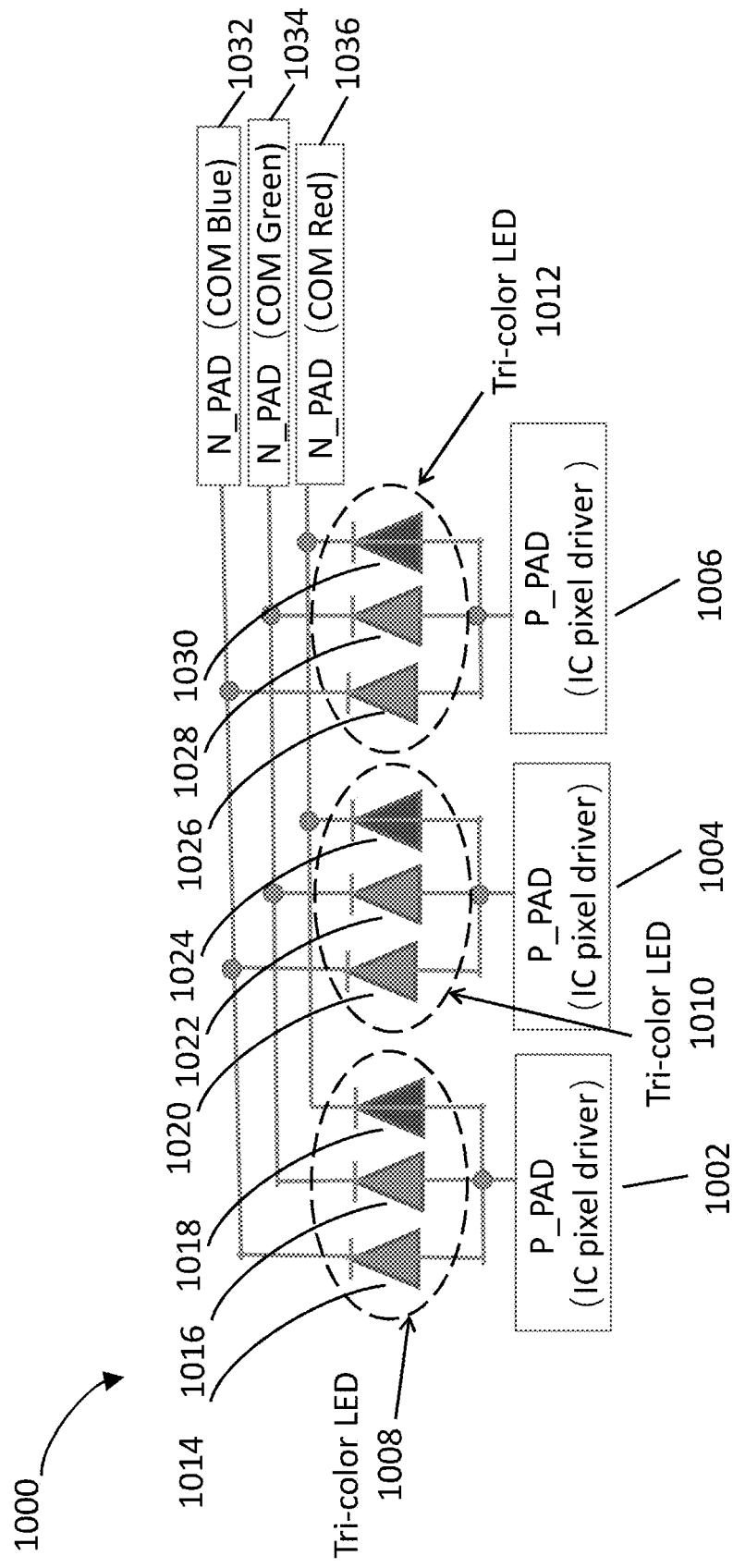
FIG. 10A is a circuit diagram illustrating a matrix of single pixel tri-color LED devices 1000, in accordance with some embodiments.

FIG. 10A is a circuit diagram illustrating a matrix of single pixel tri-color LED devices 1000, in accordance with some embodiments. The circuit in FIG. 10A includes three pixel drivers 1002, 1004, and 1006 and three tri-color LED devices 1008, 1010, and 1012.

In some embodiments, a display panel includes a plurality of pixels, such as millions of pixels, and each pixel includes a tri-color LED device structure. In some embodiments, the LED device structures can be micro LEDs. Micro LEDs typically have a lateral dimension of 50 microns (um) or less, and can have lateral dimensions less than 10 um and even just a few um.

In some embodiments, the pixel driver, for example 1002, includes a number of transistors and capacitors (not shown in FIG. 10A). The transistors include a driving transistor connected to a voltage supply, and a control transistor configured with its gate connected to a scan signal bus line. The capacitors include a storage capacitor are used to maintain the gate voltage of the driving transistor during the time that the scan signal is setting other pixels.

In this example, each of the three tri-color LED devices, for example 1008, have its own integrated circuit (IC) pixel driver 1002. The tri-color LED device 1008 for a single pixel can be viewed as three individual LEDs with different colors connected in parallel. For example, the red LED 1018, green LED 1016, and blue LED 1014, within the same tri-color LED device 1008, are connected to the same IC pixel driver 1002 via a shared P-electrode pad or anode.

In some embodiments, each of the red, green, and blue LEDs within the same tri-color LED device 1008 is connected to separate N-electrode pad or cathode.

In some embodiments, all the red LEDs, for example, 1018, 1024 and 1030, from different tri-color LED devices, are connected to the same common N-electrode 1036. All the green LEDs for example, 1016, 1022 and 1028, from different tri-color LED devices, are connected to the same common N-electrode 1034. All the blue LEDs, for example, 1014, 1020 and 1026, from different tri-color LED devices, are connected to the same common N-electrode 1032. The use of the common electrodes simplifies the fabrication process and reduces the area of the LED devices especially the footprint of the electrodes.

In some embodiments, the connections for the P-electrode and N-electrode can be switched and interchanged (not shown in FIG. 10A). For example, the red LED 1018, green LED 1016, and blue LED 1014, within the same tri-color LED device 1008, are connected to a shared N-electrode pad or cathode. Each of the red, green, and blue LEDs within the same tri-color LED device 1008 is connected to separate P-electrode pad or anode. All the red LEDs, for example, 1018, 1024 and 1030, from different tri-color LED devices, are connected to the same common N-electrode 1036.

Figure 10B:
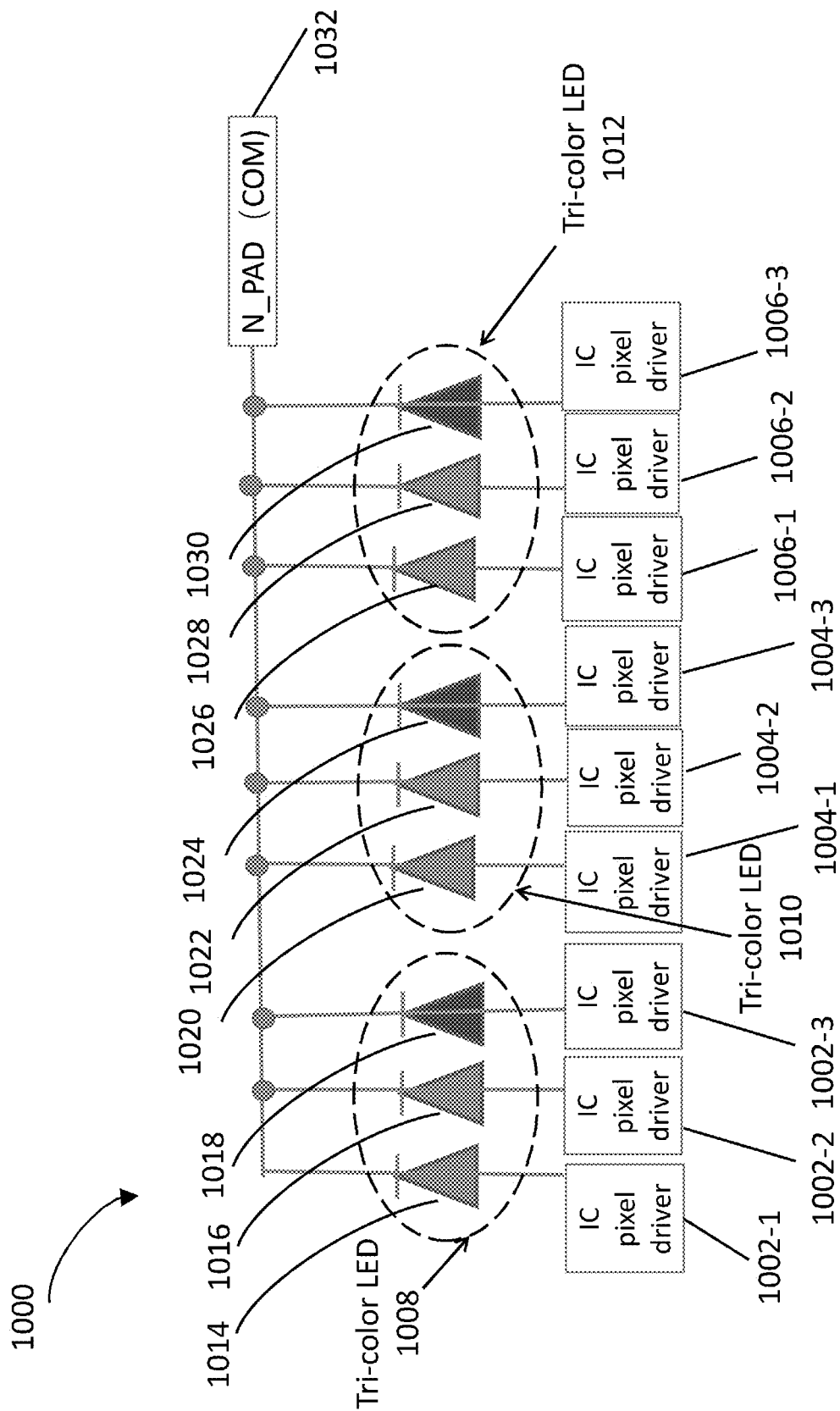
FIG. 10B is a circuit diagram illustrating a matrix of single pixel tri-color LED devices 1000, in accordance with some embodiments.

FIG. 10B is a circuit diagram illustrating a matrix of single pixel tri-color LED devices 1000, in accordance with some embodiments. FIG. 10B is similar as FIG. 10A except that in this example, each of the LED structures, in each of the three tri-color LED devices, for example 1008, have its own integrated circuit (IC) pixel driver 1002. For example, the red LED 1018, green LED 1016, and blue LED 1014, within the same tri-color LED device 1008, are connected to the different IC pixel drivers 1002-1, 1002-2, and 1002-3 respectively via a separate P-electrode pad or anode. As can be seen from FIGS. 1-9, this type of P-electrode connections are illustrated in some embodiments.

In addition, in some embodiments as shown in FIG. 10B, all the LEDs of different colors, from different tri-color LED devices, are connected to the same common N-electrode 1032.

In some embodiments, the connections for the P-electrode and N-electrode can be switched and interchanged (not shown in FIG. 10B). For example, the red LED 1018, green LED 1016, and blue LED 1014, within the same tri-color LED device 1008, are connected to the different N-electrode pad or cathode respectively. All the LEDs of different colors, from different tri-color LED devices, are connected to the same common P-electrode 1032.

Figure 11:
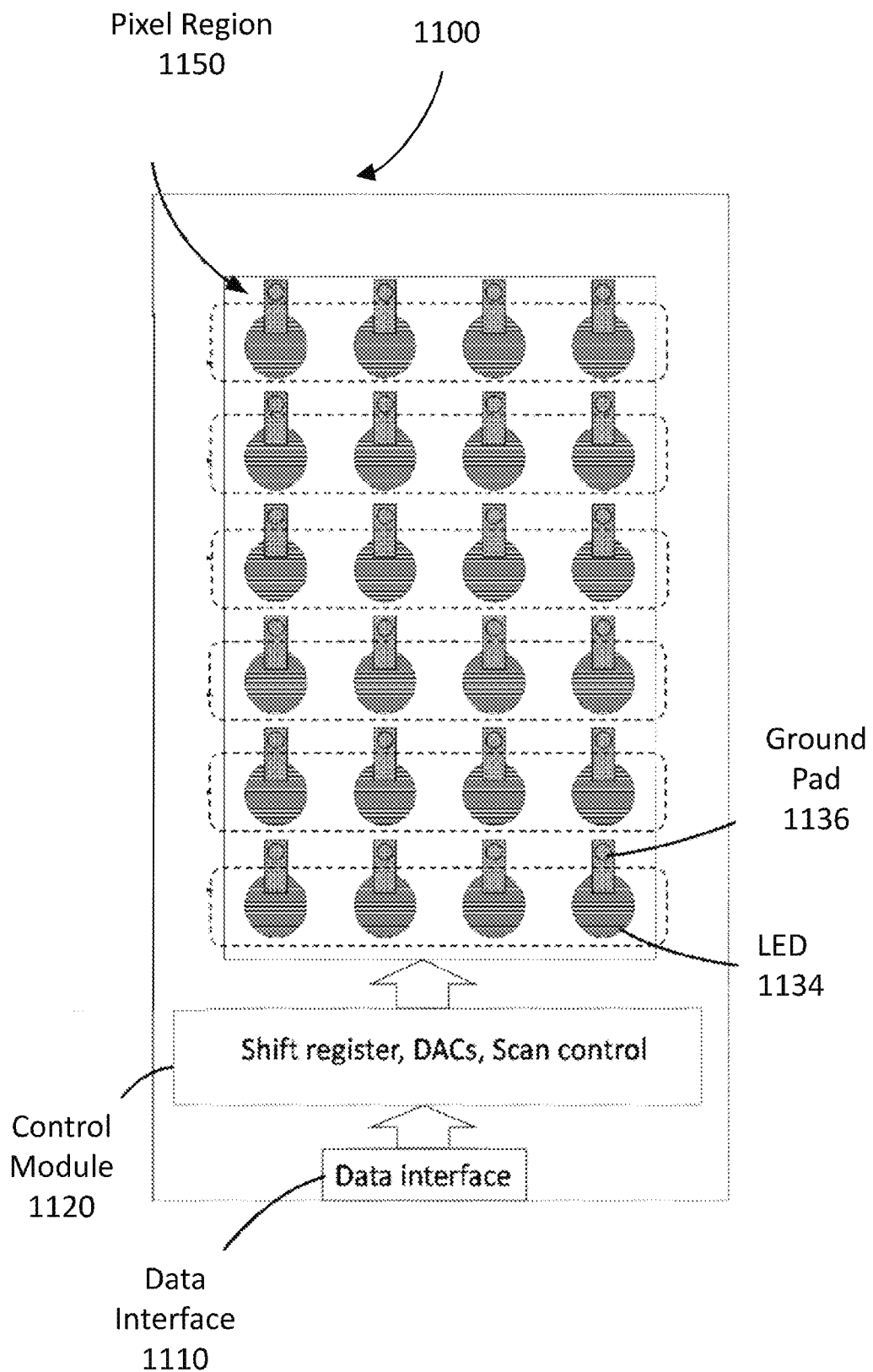
FIG. 11 is a top view of a micro LED display panel 1100, in accordance with some embodiments.

FIG. 11 is a top view of a micro LED display panel 1100, in accordance with some embodiments. The display panel 1100 includes a data interface 1110, a control module 1120 and a pixel region 1150. The data interface 1110 receives data defining the image to be displayed. The source(s) and format of this data will vary depending on the application. The control module 1120 receives the incoming data and converts it to a form suitable to drive the pixels in the display panel. The control module 1120 may include digital logic and/or state machines to convert from the received format to one appropriate for the pixel region 1150, shift registers or other types of buffers and memory to store and transfer the data, digital-to-analog converters and level shifters, and scan controllers including clocking circuitry.

The pixel region 1150 includes an array of pixels. The pixels include micro LEDs, such as a multi-color LED 1134, integrated with pixel drivers, for example as described above. In some embodiments, an array of micro-lens (not separately shown from the LED 1134 in FIG. 11) covers the top of the array of the multi-color LEDs. In some embodiments, an array of optical isolation structures, such as reflective structures or reflective cups (not separately shown from the LED 1134 in FIG. 11) are formed around the array of the multi-color LEDs. In this example, the display panel 1100 is a color RGB display panel. It includes red, green and blue pixels. Within each pixel, the tri-color LED 1134 is controlled by a pixel driver. The pixel makes contact to a supply voltage (not shown) and ground via a ground pad 1136, and also to a control signal, according to the embodiments shown previously. Although not shown in FIG. 11, the p-electrode of the tri-color LED 1134 and the output of the driving transistor are positioned within the LED 1134. The LED current driving signal connection (between p-electrode of LED and output of the pixel driver), ground connection (between n-electrode and system ground), the supply voltage Vdd connection (between source of the pixel driver and system Vdd), and the control signal connection to the gate of the pixel driver are made in accordance with various embodiments.

FIG. 11 is merely a representative figure. Other designs will be apparent. For example, the colors do not have to be red, green and blue. They also do not have to be arranged in columns or stripes. As one example, apart from the arrangement of a square matrix of pixels shown in FIG. 11, an arrangement of hexagonal matrix of pixels can also be used to form the display panel 1100.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1-9, the LEDs and pixel drivers are arranged vertically, i.e., each LED is located on top of the corresponding pixel driver circuit. Other arrangements are possible. For example, the pixel drivers could also be located "behind", "in front of", or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness and viewing angle. Example applications include direct viewing display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Further embodiments also include various subsets of the above embodiments including the embodiments in FIGS. 1-11 combined or otherwise re-arranged in various embodiments, for example, a multi-color LED pixel device/unit with and without reflective layers, with and without planarized layers, with and without reflective cup structures including various shapes and types of positioning, with and without refractive layers, with and without micro-lenses, with and without spacers, and with different electrode connection structures.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs and OLEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, trans-impedance amplifiers, and logic circuits.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art to best utilize the invention and the various embodiments.

What is claimed is:

1. A micro-LED pixel unit for a display panel, comprising:
   a first LED structure that emits a first color, formed on an IC substrate;
   a first transparent dielectric bonding layer having a first flat top surface, covering the first LED structure;
   a second LED structure that emits a second color, formed on the first flat top surface of the first transparent dielectric bonding layer;
   a second transparent dielectric bonding layer having a second flat top surface, covering the second LED structure; and
   a top electrode layer, covering the micro-LED pixel unit and electrically contacting with the first LED structure and the second LED structure;
   wherein:
   the IC substrate is electrically connected with the first LED structure and the second LED structure;
   the first LED structure is embedded within a first planarized transparent dielectric layer; and
   the second LED structure is embedded within a second planarized transparent dielectric layer.

2. The micro-LED pixel unit according to claim 1, wherein the first planarized transparent dielectric layer is composed of solid inorganic materials or plastic materials.

3. The micro-LED pixel unit according to claim 1, wherein the second planarized transparent dielectric layer is composed of solid inorganic materials or plastic materials.

4. The micro-LED pixel unit according to claim 1, wherein the first transparent dielectric bonding layer is composed of solid inorganic materials or plastic materials.

5. The micro-LED pixel unit according to claim 1, wherein:
   the first LED structure includes a first light emitting layer;
   a first side portion is extended from a side of the first light emitting layer;
   the second LED structure includes a second light emitting layer;
   a second side portion is extended from a side of the second light emitting layer; and
   a third contact in a third via connects the first side portion and the second side portion to the top electrode layer through the second transparent dielectric bonding layer.

6. The micro-LED pixel unit according to claim 1, wherein lateral dimension of the first LED structure is the same as that of the second LED structure.

7. The micro-LED pixel unit according to claim 1, wherein the first LED structure and the second LED structure have a same central axis.

8. The micro-LED pixel unit according to claim 1, wherein:
   a thickness of the first LED structure is not more than about 300 nm; and
   a thickness of the second LED structure is not more than about 300 nm.

9. The micro-LED pixel unit according to claim 1, wherein a bonding metal layer is formed at a bottom of the first LED structure.

10. The micro-LED pixel unit according to claim 1, wherein:

the first LED structure includes a first bottom electrode conductive contact layer formed on a bottom of the first LED structure;

the second LED structure includes a second bottom electrode conductive contact layer formed on a bottom of the second LED structure;

the first bottom electrode conductive contact layer is electrically connected with the IC substrate by a first contact in a first via at a bottom of the first bottom electrode conductive contact layer; and the second bottom electrode conductive contact layer is electrically connected with the IC substrate by a second contact in a second via through the first transparent dielectric bonding layer.

11. The micro-LED pixel unit according to claim 10, wherein the first bottom electrode conductive contact layer is transparent, and the second bottom electrode conductive contact layer is transparent.

12. The micro-LED pixel unit according to claim 1, wherein an optical isolation structure is formed around the micro-LED pixel unit.

13. The micro-LED pixel unit according to claim 12, wherein the optical isolation structure is a reflective cup.

14. The micro-LED pixel unit according to claim 1, wherein a first reflective structure is formed at a bottom of the first LED structure; and a second reflective structure is formed at a bottom of the second LED structure.

15. The micro-LED pixel unit according to claim 14, wherein:
 a thickness of the first reflective structure is about 5 to about 10 nm; and
 a thickness of the second reflective structure is about 5 to about 10 nm.

16. The micro-LED pixel unit according to claim 14, wherein the first reflective structure includes two first reflective layers and refractive indices of the two first reflective layers are different, and wherein the second reflective structure includes two second reflective layers and refractive indices of the two second reflective layers are different.

17. The micro-LED pixel unit according to claim 16, wherein the two first reflective layers comprise $SiO_2$ and $Ti_3O_5$ respectively, and the two second reflectivity layers comprise $SiO_2$ and $Ti_3O_5$ respectively.

18. The micro-LED pixel unit according to claim 14, wherein the first reflective structure further includes a first transparent layer on the first reflective layer, and the second reflective structure further includes a second transparent layer on the second reflective layer.

19. The micro-LED pixel unit according to claim 18, wherein the first transparent layer comprises one or more of indium tin oxide (ITO) or $SiO_2$, and the second transparent layer comprises one or more of ITO or $SiO_2$.

20. A micro-LED pixel unit for a display panel, comprising:
 a first LED structure that emits a first color, formed on an IC substrate;
 a first transparent dielectric bonding layer having a first flat top surface, covering the first LED structure;
 a second LED structure that emits a second color, formed on the first flat top surface of the first transparent dielectric bonding layer;
 a second transparent dielectric bonding layer having a second flat top surface, covering the second LED structure; and
 a top electrode layer, covering the micro-LED pixel unit and electrically contacting with the first LED structure and the second LED structure;
wherein:
 the IC substrate is electrically connected with the first LED structure and the second LED structure;
 the first LED structure is embedded within a first planarized transparent dielectric layer; and
 an optical isolation structure is formed around the micro-LED pixel unit.

* * * * *